US007055082B2

(12) United States Patent
Mori et al.

(10) Patent No.: US 7,055,082 B2
(45) Date of Patent: May 30, 2006

(54) INFORMATION RECORDING AND REPRODUCING APPARATUS

(75) Inventors: Takaro Mori, Chigasaki (JP); Kazumi Iwata, Yokosuka (JP)

(73) Assignee: Victor Company of Japan, Ltd., Yokohama (JP)

( * ) Notice: Subject to any disclaimer, the term of this patent is extended or adjusted under 35 U.S.C. 154(b) by 415 days.

(21) Appl. No.: 10/683,362

(22) Filed: Oct. 14, 2003

(65) Prior Publication Data

US 2004/0103360 A1    May 27, 2004

(30) Foreign Application Priority Data

Oct. 29, 2002  (JP)  ............................. 2002-313775
Oct. 30, 2002  (JP)  ............................. 2002-316564

(51) Int. Cl.
*G11C 29/00* (2006.01)

(52) U.S. Cl. ...................... 714/768; 714/756; 714/762; 714/784; 714/788; 714/752

(58) Field of Classification Search ................ 714/752, 714/756, 761–762, 784, 787, 788, 768
See application file for complete search history.

(56) References Cited

U.S. PATENT DOCUMENTS 4,532,629 A * 7/1985 Furuya et al. .............. 714/755
5,299,208 A * 3/1994 Blaum et al. ............... 714/761
6,604,220 B1 * 8/2003 Lee ............................ 714/769

FOREIGN PATENT DOCUMENTS

JP         09-238085        9/1997
JP         10-312651        11/1998
JP         2002-074664      3/2002

OTHER PUBLICATIONS

"Error Modeling and Performance Analysis of Error-Correcting Codes For the Digital Video Recording System", Yamamoto et al., SPIE vol. 3864 ISOM 1999.
"Optical Disc System for Digital Video Recording", Narahara et al., Jpn. J. Appl. Phys. vol. 39 (2000) pp. 912-919.

* cited by examiner

Primary Examiner—Guy J. Lamarre
(74) Attorney, Agent, or Firm—Louis Woo

(57) ABSTRACT

Errors in a first data signal of a first error correction code system in a reproduced signal are corrected to get first correction-resultant data. Errors in a second data signal of a second error correction code system in the reproduced signal are corrected to get second correction-resultant data. All address information pieces in the second correction-resultant data for every error correction block are subjected to error checks. When at least one of all the address information pieces is correct, a descramble initial value is set in response to the correct address information piece. When all the address information pieces are erroneous, a correct address information piece is estimated from an address information piece associated with a previous error correction block and the descramble initial value is set in response to the estimated correct address information piece. The first correction-resultant data are descrambled in response to the descramble initial value.

18 Claims, 32 Drawing Sheets

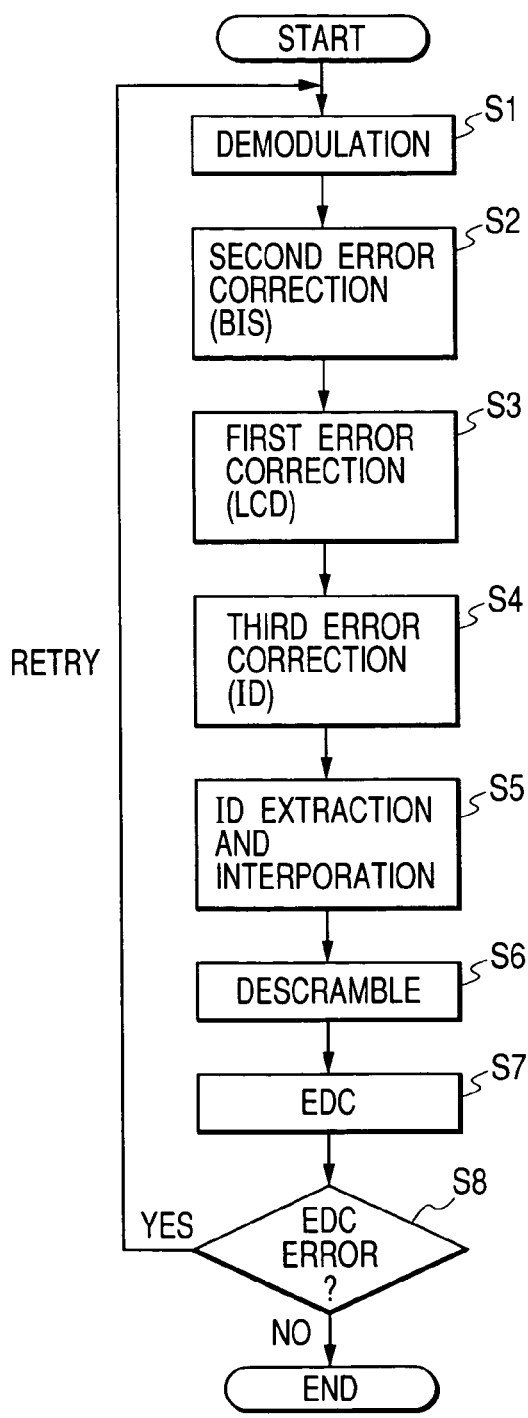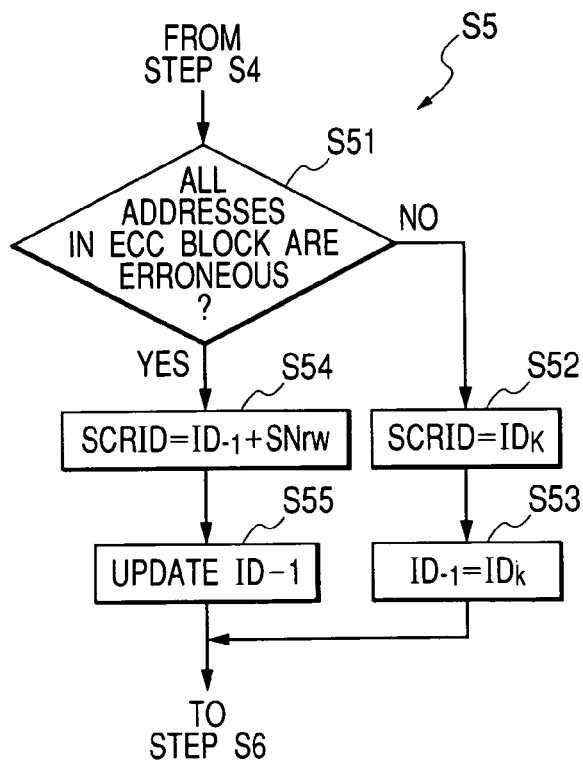

INFORMATION RECORDING AND REPRODUCING APPARATUS

BACKGROUND OF THE INVENTION

1. Field of the Invention

This invention relates to an information recording and reproducing apparatus. In addition, this invention relates to a computer program designed for an information recording and reproducing apparatus. Furthermore, this invention relates to a computer-program transmitting and receiving system. Also, this invention relates to an information decoding apparatus. Furthermore, this invention relates to a computer program designed for an information decoding apparatus.

2. Description of the Related Art

Regarding an optical disc such as a CD (compact disc) or a DVD (digital versatile disc), error correction coding (ECC) information is added to main data to be recorded, and the ECC-added data are recorded on the disc. In addition, the main data are scrambled before being recorded on the disc.

Japanese patent application publication number P2002-74664A discloses an information recording and reproducing apparatus in which an ECC block cluster is generated. The ECC block cluster has a structure such that data symbols are placed among sync signals and BIS (burst indicator subcode) signals. The BIS signals are designed for estimating where a burst error occurs. Data symbols found to be a burst error are accompanied with pointers. Data symbols with pointers are subjected to erasure correction using long-distance error correction coding information based on a long-distance code (an LDC).

Narahara et al., Jpn. J. Appl. Phys. Vol. 39 (2000) pp. 912–919, report an optical disc system for digital video recording which uses an error correction code including an LDC and a BIS.

Yamamoto et al., Part of the Joint International Symposium on Optical Memory and Optical Data Storage 1999●Koloa, Hi.●July 1999 SPIE Vol. 3864, report error modeling and performance analysis of error-correcting codes for the digital video recording system which include an LDC and a BIS.

SUMMARY OF THE INVENTION

It is a first object of this invention to provide an information recording and reproducing apparatus which is improved in error correction capability and descrambling performance.

It is a second object of this invention to provide an improved computer program designed for an information recording and reproducing apparatus.

It is a third object of this invention to provide an improved computer-program transmitting and receiving system.

It is a fourth object of this invention to provide an information decoding apparatus which is improved in error correction capability and descrambling performance.

It is a fifth object of this invention to provide an improved computer program designed for an information decoding apparatus.

A first aspect of this invention provides an information recording and reproducing apparatus comprising first means for scrambling user data in response to address information to get scramble-resultant data; second means for adding first error correction code data and second error correction code data to the scramble-resultant data and the address information to get addition-resultant data placed in error correction blocks; third means for recording the addition-resultant data on a recording medium for every error correction block; fourth means for reproducing recorded data from a recording medium to get reproduced data for every error correction block; fifth means for correcting errors in the reproduced data in response to first error correction code data and second error correction code data contained in the reproduced data to get correction-resultant data for every error correction block; sixth means for extracting all pieces of address information from the correction-resultant data for every error correction block; seventh means for subjecting all the address information pieces extracted by the sixth means to error checks to decide whether at least one of all the address information pieces is correct and whether all the address information pieces are erroneous; eighth means for, when the seventh means decides that at least one of all the address information pieces is correct, setting a descramble initial value in response to the correct address information piece; ninth means for, when the seventh means decides that all the address information pieces are erroneous, estimating a correct address information piece from an address information piece associated with a previous error correction block and setting the descramble initial value in response to the estimated correct address information piece; and tenth means for descrambling the correction-resultant data in response to the descramble initial value set by one of the eighth means and the ninth means for every error correction block.

A second aspect of this invention provides an information recording and reproducing apparatus comprising first means for scrambling main data in response to address information to get scramble-resultant data defined as first basic data; second means for adding first error correction code data to the first basic data to get a first data signal of a first error correction code system; third means for adding second error correction code data to second basic data inclusive of the address information to get a second data signal of a second error correction code system independent of the first error correction code system; fourth means for combining the first data signal and the second data signal into a composite signal divided into error correction blocks; fifth means for recording the composite signal on a recording medium for every error correction block; sixth means for reproducing a recorded signal from a recording medium to get a reproduced signal for every error correction block; seventh means for correcting errors in a first data signal of the first error correction code system in the reproduced signal to get first correction-resultant data; eighth means for correcting errors in a second data signal of the second error correction code system in the reproduced signal independently of the error correction by the seventh means to get second correction-resultant data; ninth means for extracting all pieces of address information from the second correction-resultant data for every error correction block; tenth means for subjecting all the address information pieces extracted by the ninth means to error checks to decide whether at least one of all the address information pieces is correct and whether all the address information pieces are erroneous; eleventh means for, when the tenth means decides that at least one of all the address information pieces is correct, setting a descramble initial value in response to the correct address information piece; twelfth means for, when the tenth means decides that all the address information pieces are erroneous, estimating a correct address information piece from an address information piece associated with a previous error correction block and setting the descramble initial value in response to the estimated correct address information piece; and thirteenth means for descrambling the first correction-resultant data in response to the descramble initial value set by one of the eleventh means and the twelfth means for every error correction block.

A third aspect of this invention is based on the second aspect thereof, and provides an information recording and reproducing apparatus further comprising fourteenth means for setting the descramble initial value to a predetermined value with respect to a first error correction block at a start of playback; and fifteenth means for setting the descramble initial value to a given value with respect to a first error correction block after a discontinuous address change occurs.

A fourth aspect of this invention is based on the second aspect thereof, and provides an information recording and reproducing apparatus wherein the twelfth means comprises means for adding an address increment to the address information piece associated with the previous error correction block to get the estimated correct address information piece, and means for changing the address increment depending on whether the present error correction block comes from a rewritable area or a read-only area of the recording medium, the rewritable area and the read-only area differing in number of sectors per error correction block.

A fifth aspect of this invention provides a computer program for enabling a computer to operate as a plurality of means which include first means for scrambling user data in response to address information to get scramble-resultant data; second means for adding first error correction code data and second error correction code data to the scramble-resultant data and the address information to get addition-resultant data placed in error correction blocks as a signal to be recorded on a recording medium; third means for correcting errors in a signal reproduced from a recording medium in response to first error correction code data and second error correction code data contained in the signal reproduced from the recording medium to get correction-resultant data for every error correction block; fourth means for extracting all pieces of address information from the correction-resultant data for every error correction block; fifth means for subjecting all the address information pieces extracted by the fourth means to error checks to decide whether at least one of all the address information pieces is correct and whether all the address information pieces are erroneous; sixth means for, when the fifth means decides that at least one of all the address information pieces is correct, setting a descramble initial value in response to the correct address information piece; seventh means for, when the fifth means decides that all the address information pieces are erroneous, estimating a correct address information piece from an address information piece associated with a previous error correction block and setting the descramble initial value in response to the estimated correct address information piece; and eighth means for descrambling the correction-resultant data in response to the descramble initial value set by one of the sixth means and the seventh means for every error correction block.

A sixth aspect of this invention provides a computer program for enabling a computer to operate as a plurality of means which include first means for scrambling main data in response to address information to get scramble-resultant data defined as first basic data; second means for adding first error correction code data to the first basic data to get a first data signal of a first error correction code system; third means for adding second error correction code data to second basic data inclusive of the address information to get a second data signal of a second error correction code system independent of the first error correction code system; fourth means for combining the first data signal and the second data signal into a composite signal divided into error correction blocks as a signal to be recorded on a recording medium; fifth means for correcting errors in a first data signal of the first error correction code system in a signal reproduced from a recording medium to get first correction-resultant data; sixth means for correcting errors in a second data signal of the second error correction code system in the signal reproduced from the recording medium independently of the error correction by the fifth means to get second correction-resultant data; seventh means for extracting all pieces of address information from the second correction-resultant data for every error correction block; eighth means for subjecting all the address information pieces extracted by the seventh means to error checks to decide whether at least one of all the address information pieces is correct and whether all the address information pieces are erroneous; ninth means for, when the eighth means decides that at least one of all the address information pieces is correct, setting a descramble initial value in response to the correct address information piece; tenth means for, when the eighth means decides that all the address information pieces are erroneous, estimating a correct address information piece from an address information piece associated with a previous error correction block and setting the descramble initial value in response to the estimated correct address information piece; and eleventh means for descrambling the first correction-resultant data in response to the descramble initial value set by one of the ninth means and the tenth means for every error correction block.

A seventh aspect of this invention is based on the sixth aspect thereof, and provides a computer program wherein the plurality of means further include twelfth means for setting the descramble initial value to a predetermined value with respect to a first error correction block at a start of playback; and thirteenth means for setting the descramble initial value to a given value with respect to a first error correction block after a discontinuous address change occurs.

An eighth aspect of this invention is based on the sixth aspect thereof, and provides a computer program wherein the tenth means comprises means for adding an address increment to the address information piece associated with the previous error correction block to get the estimated correct address information piece, and means for changing the address increment depending on whether the present error correction block comes from a rewritable area or a read-only area of the recording medium, the rewritable area and the read-only area differing in number of sectors per error correction block.

A ninth aspect of this invention provides a transmission and reception system for the computer program of the sixth aspect of this invention. The transmission and reception system comprises first means for converting the computer program into a packet stream; second means for transmitting the packet stream to a transmission line; third means for receiving a packet stream from the transmission line; and fourth means for converting the received packet stream into an original computer program.

A tenth aspect of this invention provides an information decoding apparatus for use with a recording medium on which a modulation-resultant signal is recorded by an information recording apparatus operating to (1) scramble user data in response to address information to get scramble-resultant data; (2) add error correction code data of plural different types to the scramble-resultant data and the address information to get addition-resultant data placed in error correction blocks; and (3) subject the addition-resultant data to modulation to get the modulation-resultant signal. The information decoding apparatus comprises first means for reproducing a modulation-resultant signal from the recording medium to get a reproduced signal; second means for subjecting the reproduced signal to demodulation to get demodulation-resultant data; third means for extracting address information from the demodulation-resultant data; fourth means for subjecting the address information extracted by the third means to error correction to get correction-resultant address information; fifth means for implementing interpolation on the basis of an address continuity to get interpolation-resultant address information corresponding to the address information extracted by the third means; sixth means for correcting errors in the demodulation-resultant data in response to error correction code data of the plural different types contained in the demodulation-resultant data to get correction-resultant data for every error correction block; seventh means for extracting all pieces of address information from the correction-resultant data for every error correction block; eighth means for subjecting all the address information pieces extracted by the seventh means to error checks to decide whether at least one of all the address information pieces is correct and whether all the address information pieces are erroneous; ninth means for, when the eighth means decides that at least one of all the address information pieces is correct, setting a descramble initial value in response to the correct address information piece; tenth means for, when the eighth means decides that all the address information pieces are erroneous, setting the descramble initial value in response to one of (1) the correction-resultant address information and (2) the interpolation-resultant address information; and eleventh means for descrambling the correction-resultant data in response to the descramble initial value set by one of the ninth means and the tenth means for every error correction block.

An eleventh aspect of this invention provides an information decoding apparatus for use with a recording medium on which a modulation-resultant signal is recorded by an information recording apparatus operating to (1) scramble main data in response to address information to get scramble-resultant data defined as first basic data; (2) add first error correction code data to the first basic data to get a first data signal of a first error correction code system; (3) add second error correction code data to second basic data inclusive of the address information to get a second data signal of a second error correction code system independent of the first error correction code system; (4) combining the first data signal and the second data signal into a composite signal divided into error correction blocks; and (5) subject the composite signal to modulation to get the modulation-resultant signal. The information decoding apparatus comprises first means for reproducing a modulation-resultant signal from the recording medium to get a reproduced signal; second means for subjecting the reproduced signal to demodulation to get a demodulation-resultant signal including a demodulation-resultant first data signal and a demodulation-resultant second data signal; third means for extracting address information from second basic data in the demodulation-resultant second data signal; fourth means for subjecting the address information extracted by the third means to error correction to get correction-resultant address information; fifth means for implementing interpolation on the basis of an address continuity to get interpolation-resultant address information corresponding to the address information extracted by the third means; sixth means for subjecting the demodulation-resultant first data signal and the demodulation-resultant second data signal to independent error corrections respectively to get correction-resultant data for every error correction block; seventh means for extracting all pieces of address information from second basic data in the correction-resultant data for every error correction block; eighth means for subjecting all the address information pieces extracted by the seventh means to error checks to decide whether at least one of all the address information pieces is correct and whether all the address information pieces are erroneous; ninth means for, when the eighth means decides that at least one of all the address information pieces is correct, setting a descramble initial value in response to the correct address information piece; tenth means for, when the eighth means decides that all the address information pieces are erroneous, setting the descramble initial value in response to one of (1) the correction-resultant address information and (2) the interpolation-resultant address information; and eleventh means for descrambling the correction-resultant data in response to the descramble initial value set by one of the ninth means and the tenth means for every error correction block.

A twelfth aspect of this invention is based on the eleventh aspect thereof, and provides an information decoding apparatus further comprising a buffer memory; twelfth means for successively writing the demodulation-resultant signal and one of (1) the correction-resultant address information and (2) the interpolation-resultant address information into the buffer memory for every error correction block; and thirteenth means provided in the tenth means for reading out one of (1) the correction-resultant address information and (2) the interpolation-resultant address information from the buffer memory.

A thirteenth aspect of this invention provides a computer program for use in an information decoding apparatus, the information decoding apparatus being for use with a recording medium on which a modulation-resultant signal is recorded by an information recording apparatus operating to (1) scramble user data in response to address information to get scramble-resultant data; (2) add error correction code data of plural different types to the scramble-resultant data and the address information to get addition-resultant data placed in error correction blocks; and (3) subject the addition-resultant data to modulation to get the modulation-resultant signal. The computer program enables a computer to operate as a plurality of means which include first means for subjecting a signal reproduced from the recording medium to demodulation to get demodulation-resultant data; second means for extracting address information from the demodulation-resultant data; third means for subjecting the address information extracted by the second means to error correction to get correction-resultant address information; fourth means for implementing interpolation on the basis of an address continuity to get interpolation-resultant address information corresponding to the address information extracted by the second means; fifth means for correcting errors in the demodulation-resultant data in response to error correction code data of the plural different types contained in the demodulation-resultant data to get correction-resultant data for every error correction block; sixth means for extracting all pieces of address information from the correction-resultant data for every error correction block; seventh means for subjecting all the address information pieces extracted by the sixth means to error checks to decide whether at least one of all the address information pieces is correct and whether all the address information pieces are erroneous; eighth means for, when the seventh means decides that at least one of all the address information pieces is correct, setting a descramble initial value in response to the correct address information piece; ninth means for, when the seventh means decides that all the address information pieces are erroneous, setting the descramble initial value in response to one of (1) the correction-resultant address information and (2) the interpolation-resultant address information; and tenth means for descrambling the correction-resultant data in response to the descramble initial value set by one of the eighth means and the ninth means for every error correction block.

A fourteenth aspect of this invention provides a computer program for use in an information decoding apparatus, the information decoding apparatus being for use with a recording medium on which a modulation-resultant signal is recorded by an information recording apparatus operating to (1) scramble main data in response to address information to get scramble-resultant data defined as first basic data; (2) add first error correction code data to the first basic data to get a first data signal of a first error correction code system; (3) add second error correction code data to second basic data inclusive of the address information to get a second data signal of a second error correction code system independent of the first error correction code system; (4) combining the first data signal and the second data signal into a composite signal divided into error correction blocks; and (5) subject the composite signal to modulation to get the modulation-resultant signal. The computer program enables a computer to operate as a plurality of means which include first means for subjecting a signal reproduced from the recording medium to demodulation to get a demodulation-resultant signal including a demodulation-resultant first data signal and a demodulation-resultant second data signal; second means for extracting address information from second basic data in the demodulation-resultant second data signal; third means for subjecting the address information extracted by the second means to error correction to get correction-resultant address information; fourth means for implementing interpolation on the basis of an address continuity to get interpolation-resultant address information corresponding to the address information extracted by the second means; fifth means for subjecting the demodulation-resultant first data signal and the demodulation-resultant second data signal to independent error corrections respectively to get correction-resultant data for every error correction block; sixth means for extracting all pieces of address information from second basic data in the correction-resultant data for every error correction block; seventh means for subjecting all the address information pieces extracted by the sixth means to error checks to decide whether at least one of all the address information pieces is correct and whether all the address information pieces are erroneous; eighth means for, when the seventh means decides that at least one of all the address information pieces is correct, setting a descramble initial value in response to the correct address information piece; ninth means for, when the seventh means decides that all the address information pieces are erroneous, setting the descramble initial value in response to one of (1) the correction-resultant address information and (2) the interpolation-resultant address information; and tenth means for descrambling the correction-resultant data in response to the descramble initial value set by one of the eighth means and the ninth means for every error correction block.

A fifteenth aspect of this invention is based on the fourteenth aspect thereof, and provides a computer program wherein the plurality of means further include eleventh means for successively writing the demodulation-resultant signal and one of (1) the correction-resultant address information and (2) the interpolation-resultant address information into a buffer memory for every error correction block; and twelfth means provided in the ninth means for reading out one of (1) the correction-resultant address information and (2) the interpolation-resultant address information from the buffer memory.

A sixteenth aspect of this invention provides a transmission and reception system for the computer program of the fourteenth aspect of this invention. The transmission and reception system comprises first means for converting the computer program into a packet stream; second means for transmitting the packet stream to a transmission line; third means for receiving a packet stream from the transmission line; and fourth means for converting the received packet stream into an original computer program.

A seventeenth aspect of this invention provides a data processing apparatus comprising first means for correcting errors in a first data signal of a first error correction code system in a composite signal to get first correction-resultant data; second means for correcting errors in a second data signal of a second error correction code system in the composite signal to get second correction-resultant data, the second error correction code system being independent of the first error correction code system; third means for deciding whether at least one of all address information pieces in the second correction-resultant data for every error correction block is correct and whether all the address information pieces are erroneous; fourth means for, when the third means decides that at least one of all the address information pieces is correct, setting a descramble initial value in response to the correct address information piece; fifth means for, when the third means decides that all the address information pieces are erroneous, estimating a correct address information piece from an address information piece associated with a previous error correction block and setting the descramble initial value in response to the estimated correct address information piece; and sixth means for descrambling the first correction-resultant data in response to the descramble initial value set by one of the fourth means and the fifth means for every error correction block.

An eighteenth aspect of this invention provides a data processing apparatus comprising first means for correcting errors in data in each of segments of a composite signal to get correction-resultant data; second means for deciding whether at least one of all address information pieces in each of segments of the composite signal is correct and whether all the address information pieces in each of segments of the composite signal are erroneous; third means for, when the second means decides that at least one of all the address information pieces is correct, setting a descramble initial value in response to the correct address information piece; fourth means for, when the second means decides that all the address information pieces are erroneous, implementing interpolation on the basis of an address continuity to get an interpolation-resultant address information piece corresponding to the address information pieces in each of segments of the composite signal and setting the descramble initial value in response to the interpolation-resultant address information piece; and fifth means for descrambling the correction-resultant data in response to the descramble initial value set by one of the third means and the fourth means.

BRIEF DESCRIPTION OF THE DRAWINGS

FIG. 17 is a flowchart of a playback-related segment of the control program for the computer in FIG. 15.

FIG. 18 is a flowchart showing the internal structure of a step in FIG. 17.

DETAILED DESCRIPTION OF THE INVENTION

Prior-art systems will be explained below for a better understanding of this invention.

A prior-art DVD error correction system uses logical sectors each having 2048 bytes of user data, 12 bytes of identification (ID) data, and 4 bytes of error detection code (EDC) data. The ID data contain information about a physical address.

Figure 1:
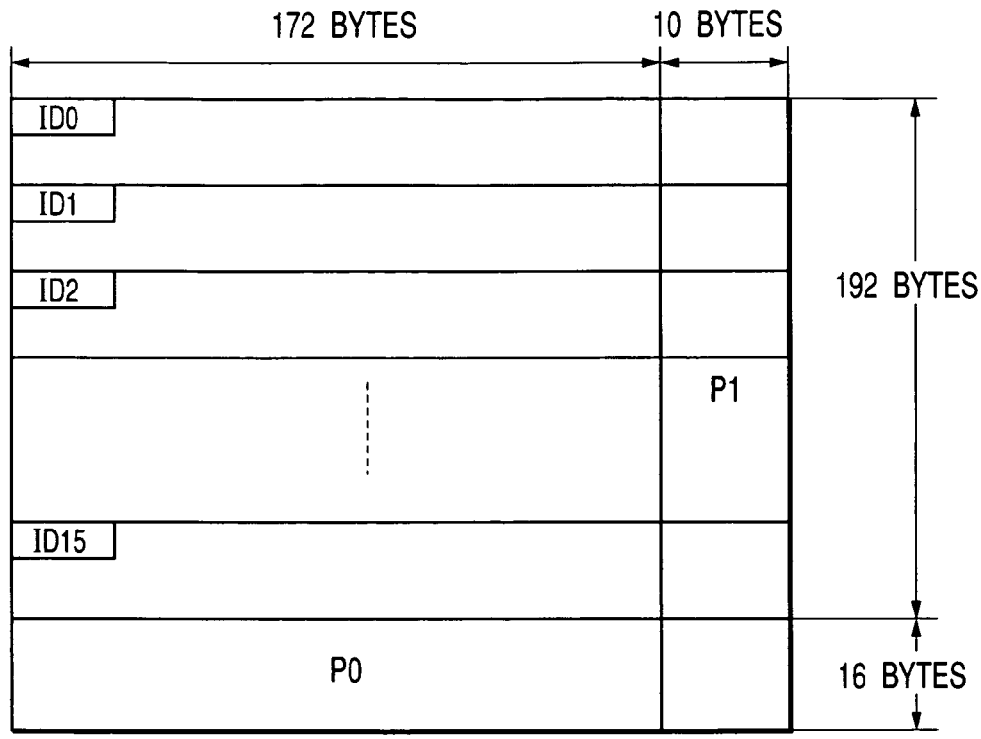
FIG. 1 is a diagram of the structure of a first prior-art error correction code system.

As shown in FIG. 1, 16 logical sectors (33024 bytes in total) are arranged in a stack of a 192-by-172 byte size, that is, a matrix such that 192 bytes extend along a column direction while 172 bytes extend along a row direction. In FIG. 1, ID0, ID1, ID2, . . . , and ID15 denote physical address information pieces within respective logical sectors. User data and EDC data in each logical sector are scrambled in response to a part of a related physical address information piece. Error correction code (ECC) data are generated in response to the scrambling-resultant data and the physical address information pieces (ID0, ID1, ID2, . . . , and ID15). The ECC data are added to each group of 16 logical sectors to form an ECC block. The ECC data consist of PI (inner code parity) data and PO (outer code parity) data.

As shown in FIG. 1, 16 bytes of PO data are added to each column in the 192-by-172 matrix and 10 bytes of PI data are added to each of the resultant 208 rows to form a Reed-Solomon product code with 208 rows and 182 columns constituting one ECC block. The added PI data and the related row-direction data form an error correction code arrangement "RS(182, 172, 11)" while the added PO data and the related column-direction data form an error correction code arrangement "RS(208, 192, 17)", where "code arrangement" means "code word". Each physical address information piece (ID0, ID1, ID2, . . . , or ID15) constitutes a part of the PI error correction code arrangement and also a part of the PO error correction code arrangement. The PO-rows are interleaved with the other rows (the data rows), and the interleave-resultant ECC block is divided into 16 recording sectors.

Figure 2:
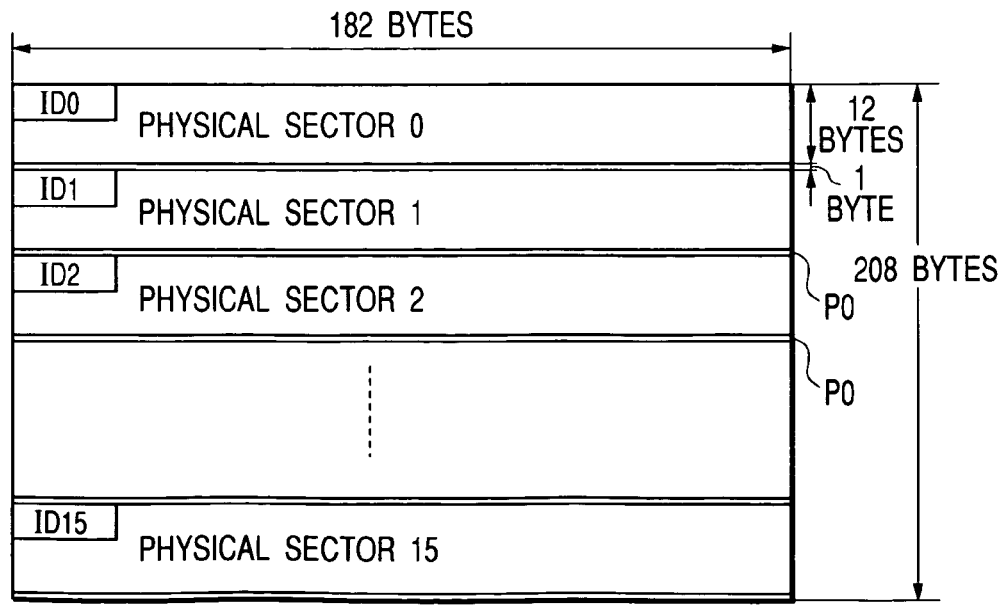
FIG. 2 is a diagram of a first prior-art ECC block.

As shown in FIG. 2, one interleave-resultant ECC block consists of 16 recording sectors, that is, 16 sets each of a physical sector and a PO row located below the physical sector. The physical sector is filled with a corresponding physical address information piece and portions of the scrambling-resultant data and the PI data, and has a size of 182 row-direction bytes by 12 column-direction bytes. The PO row has a size of 182 row-direction bytes by 1 column-direction byte. Bytes composing the interleave-resultant ECC block are recorded on an optical disc (a DVD) in a sequence corresponding to a horizontal direction with respect to FIG. 2.

During playback, data are reproduced from the optical disc. Every ECC block of the reproduced data is subjected to error correction responsive to PI data and erasure correction responsive to PO data, and is then exposed again to error correction responsive to the PI data. The error correction capability has a certain limit. Thus, when the ECC block of the reproduced data has an excessively large number of errors, some of them fail to be corrected.

The 12-byte ID data contain an error detection code IED in addition to the physical address information piece (ID0, ID1, ID2, . . . , or ID15 in FIG. 1). An error in the 12-byte ID data can be detected in response to the error detection code IED therein. Consideration will be given to the case where an ECC block of reproduced data has a lot of errors inclusive of a burst error so that an error remains in 12-byte ID data after the execution of the error/erasure correction. In this case, since the 12-byte ID data form a part of a PI error correction code arrangement and also a part of a PO error correction code arrangement (see FIG. 1), the presence of a remaining error in the 12-byte ID data means that some errors fail to be corrected by PI data and PO data. It is thought that the number of errors in the ECC block exceeds a level corresponding to an error correction capability, and hence the failure of the error correction occurs. Accordingly, there is a high chance that a PI error correction code arrangement portion containing the erroneous 12-byte ID data will also have errors at places outside the erroneous 12-byte ID data. Similarly, there is a high chance that a PO error correction code arrangement portion containing the erroneous 12-byte ID data will also have errors at places outside the erroneous 12-byte ID data. In this case, even when the remaining error in the 12-byte ID data is corrected, some errors still remain in the reproduced data.

Compressed data, for example, MPEG (Moving Picture Experts Group) data, can be used as user data to be recorded on an optical disc. In the case of compressed data, an error therein tend to be fatal to the recovery of true information from the data. Generally, EDC data are used in detecting errors of reproduced data at sector level. It is known that when a 1-sector-corresponding portion of reproduced data is found to be inclusive of an error by an error detection process using related EDC data, a corresponding part of a track on an optical disc is accessed again to retry to read out data therefrom.

A prior-art information recording and reproducing system handles first data and second data to be recorded and reproduced. The first data mainly include user data. The second data include address information and other additional information. The prior-art information recording and reproducing system has a first means for correcting errors in reproduced first data and a second means for correcting errors in reproduced second data. A signal format used in the prior-art information recording and reproducing system is designed so that the first error correcting means and the second error correcting means will be independent of each other. It is conceivable that a recording side scrambles the first data (the user data) with using the address information as a scramble initial value, and records the scramble-resultant first data. In this case, the second data contain a piece indicative of the scramble initial value. In the event that some errors in reproduced second data fail to be corrected by the second error correcting means while all errors are removed from reproduced first data by the first error correcting means, a correct initial value for descramble is not obtained from the reproduced second data. Thus, a wrong initial value for descramble is generated. The wrong initial value causes inaccurate descramble of reproduced user data so that the descramble-resultant user data are erroneous although the reproduced user data are correct.

Figure 3:
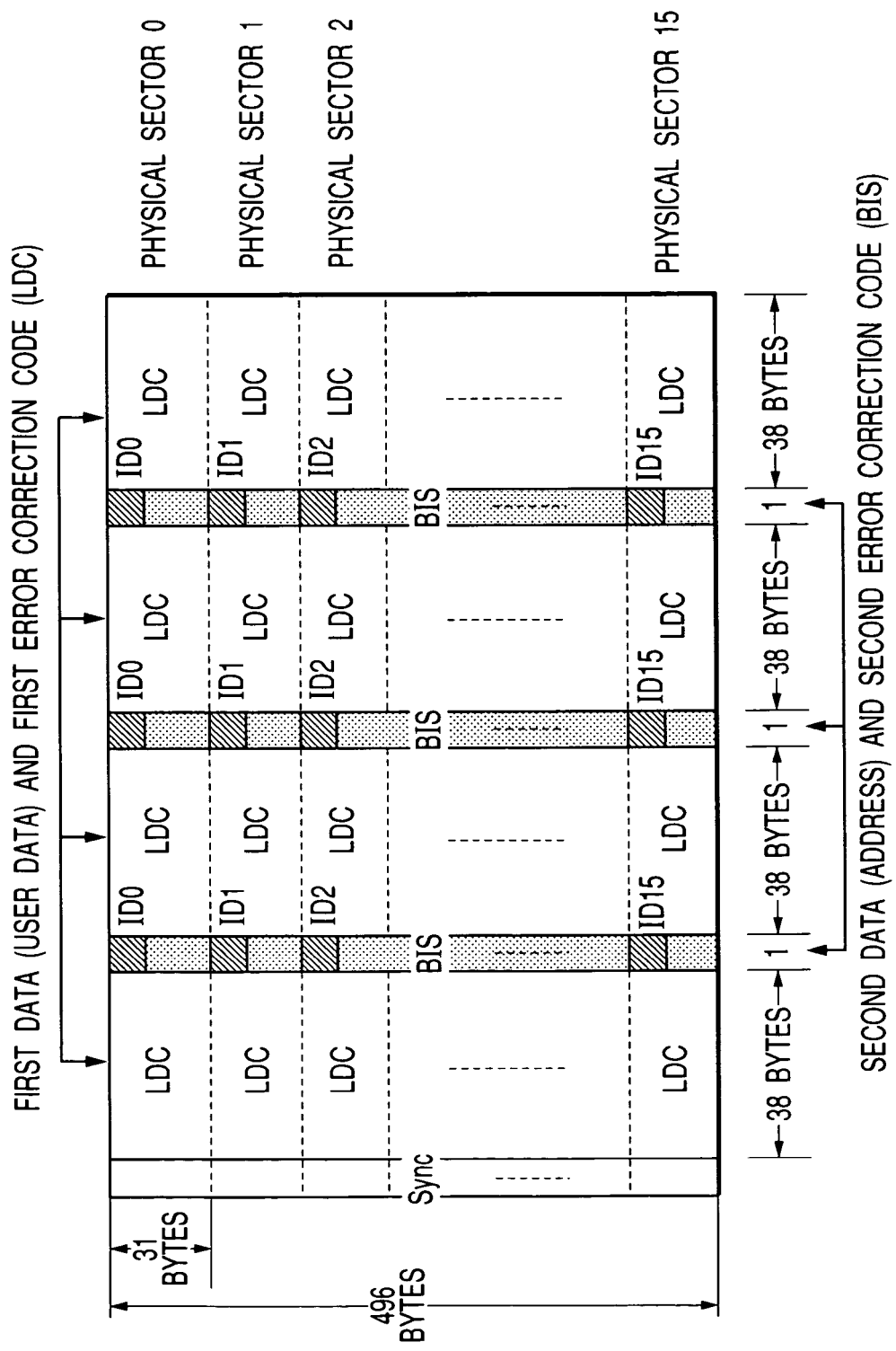
FIG. 3 is a diagram of a second prior-art ECC block.

The details of the prior-art information recording and reproducing system are as follows. The prior-art information recording and reproducing system uses ECC blocks of a structure in FIG. 3. Every ECC block contains user data, EDC data, first error correction code data (first parity data), ID data and additional information, and second error correction code data (second parity data). The user data and the EDC data form first basic data. The first error correction code data are assigned to the first basic data. The ID data and the additional information form second basic data. The ID data contain physical address information. The second error correction code data are assigned to the second basic data. As shown in FIG. 3, one ECC block consists of 16 physical sectors.

First basic data in one ECC block contain user data corresponding to 32 logical sectors, and EDC data for the respective logical sectors. Each logical sector is loaded with 2048 bytes of user data and 4 bytes of EDC data. First error correction code data (first parity data) are added with respect to the first basic data.

Figure 4:
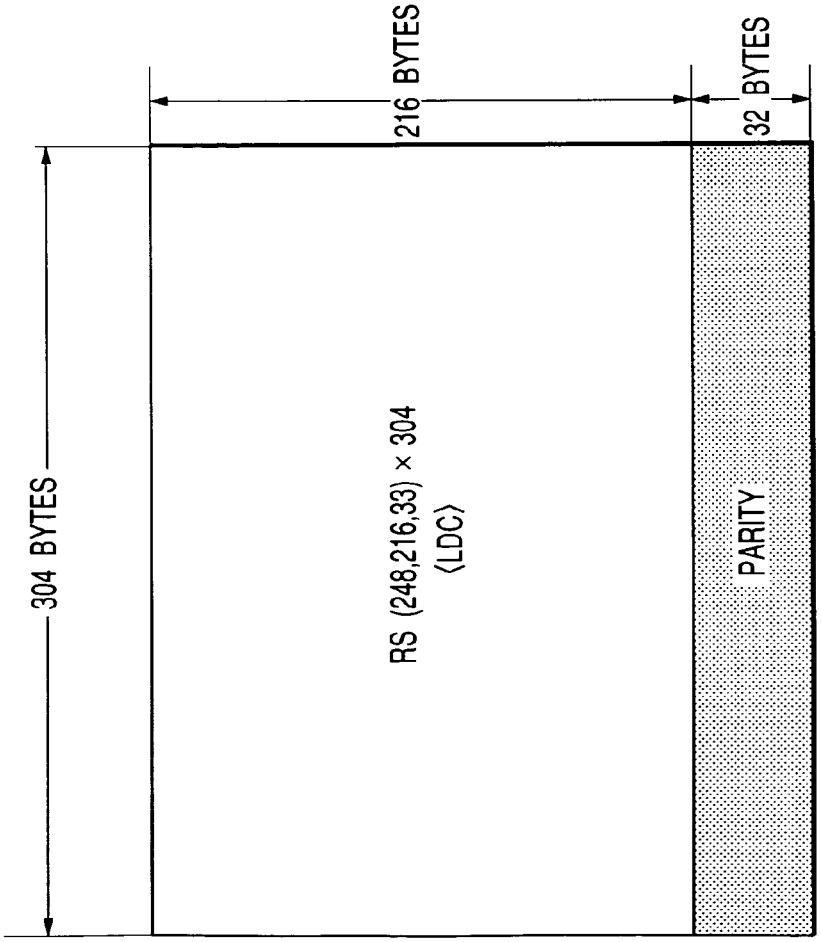
FIG. 4 is a diagram of the structure of a second prior-art error correction code system.

FIG. 4 shows the structure of a first error correction code system based on the first parity data. With reference to FIG. 4, first basic data in 32 logical sectors are interleaved, and the resultant first basic data are arranged in a matrix of 216 column-direction bytes by 304 row-direction bytes. Parity data having 32 bytes are generated in response to each 216-byte data column, and are added thereto. Consequently, 304 columns of a Reed-Solomon code "RS(248, 216, 33)" are formed as a first error correction code system. In other words, about 64 kilobytes of user data and EDC data (first basic data) are divided into 216-byte segments, and 32-byte parity data forming a corresponding portion of the first error correction code data are added to each of the 216-byte segments. Thus, one ECC block contains 304 first error correction code words LDC ("RS(248, 216, 33)"), where LDC means a long-distance code (a long-distance error correction code).

Figure 5:
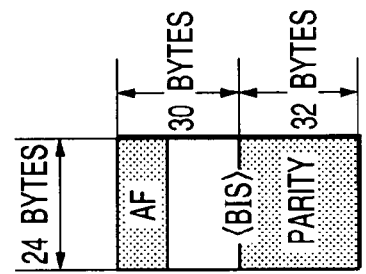
FIG. 5 is a diagram of the structure of a third prior-art error correction code system.

ID data corresponding to 16 physical sectors and additional information annexed to 32 logical sectors are handled as second basic data for every ECC block. The ID data contain physical address information, and error correction code data for the physical address information. Second error correction code data (second parity data) are added to the second basic data to form a Reed-Solomon code "RS(62, 30, 33)". With reference to FIG. 5, physical address information corresponding to 16 physical sectors, error correction code data for the physical address information, and additional information annexed to 32 logical sectors are interleaved. The interleave-resultant data are rearranged in a matrix of 30 column-direction bytes by 24 row-direction bytes. Parity data (second error correction code data) having 32 bytes are generated in response to each 30-byte data column, and are added thereto. Consequently, 24 columns of a Reed-Solomon code "RS(62, 30, 33)" are formed as a second error correction code system. In this way, 24 second error correction code words BIS ("RS(62, 30, 33)") are generated which contain 720 (30 by 24) bytes of second basic data and 768 (32 by 24) bytes of second error correction code data per ECC block. Here, BIS means a bust indicator subcode.

Figure 6:
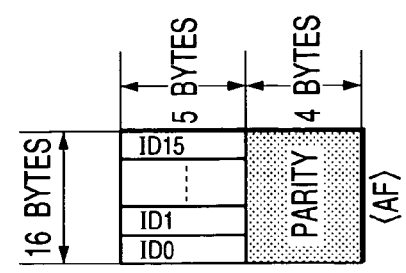
FIG. 6 is a diagram of the structure of a fourth prior-art error correction code system.

With reference to FIG. 5, the 30-by-24-byte matrix area has an upper portion AF assigned to the physical address information and third error correction code data (third parity data) for the physical address information. The third error correction code data are also referred to as the AF data. The physical address information consists of 16 pieces ID0, ID1, ID2, ..., and ID15 assigned to 16 physical sectors respectively. Each of the physical address information pieces ID0, ID1, ID2, ..., and ID15 has 5 bytes. With reference to FIG. 6, parity data (third error correction code data or AF data) having 4 bytes are generated in response to each physical address information piece (ID0, ID1, ID2, ..., or ID15), and are added thereto. As a result, 16 third error correction code words "RS(9, 5, 5)" are formed. The parity data in FIG. 6 are designed for error correction or error detection with respect to the physical address information pieces ID0, ID1, ID2, ..., and ID15. As understood from the above description, second basic data for every ECC block contain 16 third error correction code words "RS(9, 5, 5)" and additional data or additional information annexed to 32 logical sectors.

Second basic data inclusive of physical address information are contained in 24 second error correction code words "BIS(62, 30, 33)". First basic data inclusive of user data are contained in 304 first error correction code words "LDC (248, 216, 33)". The ECC block of FIG. 3 is in the form of a matrix in which rows correspond to sync frames respectively. With reference to FIG. 3, 24 second error correction code words "BIS(62, 30, 33)" are interleaved and multiplexed with 304 first error correction code words "LDC(248, 216, 33)", and are thereby placed in 3 spaced BIS columns. Each 5-byte physical address information piece (ID0, ID1, ID2, ..., or ID15) and corresponding 4-byte parity data are located at BIS-column portions of the first, second, and third rows (the first, second, and third sync frames) in a related physical sector. During playback, a demodulation circuit in a reproducing side recovers physical address information pieces ID0, ID1, ID2, ..., and ID15, and an access to an optical disc is implemented in response to the recovered physical address information pieces ID0, ID1, ID2, ..., and ID15. Frame sync signals SYNC are added to the heads of data rows to complete an ECC block to be recorded. Bytes composing the completed ECC block are recorded on an optical disc in a sequence corresponding to a rightward direction with respect to FIG. 3.

In the ECC block of FIG. 3, the 304 first error correction code words "LDC(248, 216, 33)" contain the first basic data inclusive of the user data while the 24 second error correction code words "BIS(62, 30, 33)" contain the second basic data inclusive of the physical address information pieces ID0, ID1, ID2, ..., and ID15. From the viewpoint of error correction, the 304 first error correction code words "LDC (248, 216, 33)" are independent of the 24 second error correction code words "BIS(62, 30, 33)".

Figure 7:
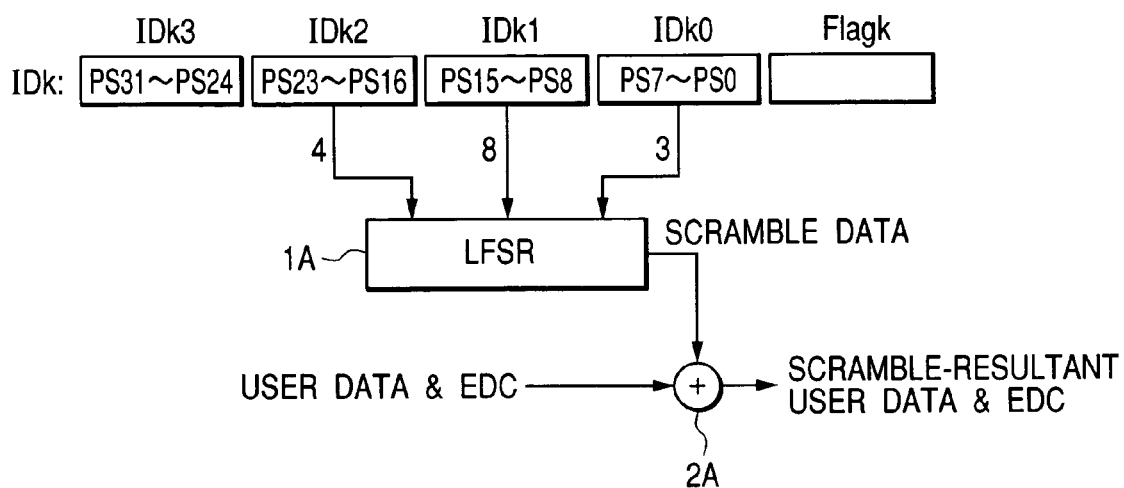
FIG. 7 is a block diagram of a prior-art scramble circuit.

User data and EDC data composing first basic data are scrambled in response to physical address information. The prior-art information recording and reproducing system includes a scramble circuit. As shown in FIG. 7, the scramble circuit has a linear feedback shift register (an LFSR) 1A and an adder 2A. The LFSR 1A generates scramble data in response to a physical address information piece having 5 bytes Flagk, IDk0, IDk1, IDk2, and IDk3. The byte IDk0 has bits PS0, PS1, ..., and PS7. The byte IDk1 has bits PS8, PS9, ..., and PS15. The byte IDk2 has bits PS16, PS17, ..., and PS23. The byte IDk3 has bits PS24, PS25, ..., and PS31. The LFSR 1A outputs the scramble data to the adder 2A. The adder 2A receives user data and EDC data. The adder 2A executes modulo-2 addition between the scramble data and the user data/EDC data, and thereby scrambles the user data and the EDC data. The adder 2A outputs the scramble-resultant user data and EDC data.

For every logical sector, the scramble is started under the condition that 15 successive bits PS5, PS6, ..., and PS19 of a physical address information piece are used as an initial value (a scramble initial value) of the LFSR 1A. Thus, the setting of a scramble initial value is independent of bits PS0, PS1, PS2, PS3, and PS4 of the physical address information piece which indicate a sector order number. Accordingly, sets of user data and EDC data in logical sectors of a common ECC block are subjected to the same scramble. A descramble initial value for an ECC block which is used in a reproducing side should be equal to a scramble initial value for the ECC block.

As previously mentioned, in the ECC block of FIG. 3, the 304 first error correction code words "LDC(248, 216, 33)" contain the first basic data inclusive of the user data and the EDC data while the 24 second error correction code words "BIS(62, 30, 33)" contain the second basic data inclusive of the physical address information pieces ID0, ID1, ID2, ..., and ID15. At least one of the physical address information pieces is used in generating a scramble initial value. From the viewpoint of error correction, the 304 first error correction code words "LDC(248, 216, 33)" are independent of the 24 second error correction code words "BIS(62, 30, 33)". The reproducing side of the prior-art information recording and reproducing system has a first means for correcting errors according to the 304 first error correction code words "LDC(248, 216, 33)", and a second means for correcting errors according to the 24 second error correction code words "BIS(62, 30, 33)". In the event that some errors in reproduced second data fail to be corrected by the second error correcting means while all errors are removed from reproduced first data by the first error correcting means, a correct initial value for descramble is hardly obtained from the reproduced second data. Thus, a wrong initial value for descramble tends to be generated. The wrong initial value causes inaccurate descramble of reproduced user data so that the descramble-resultant user data are erroneous although the reproduced user data are correct.

First Embodiment

Figure 8:
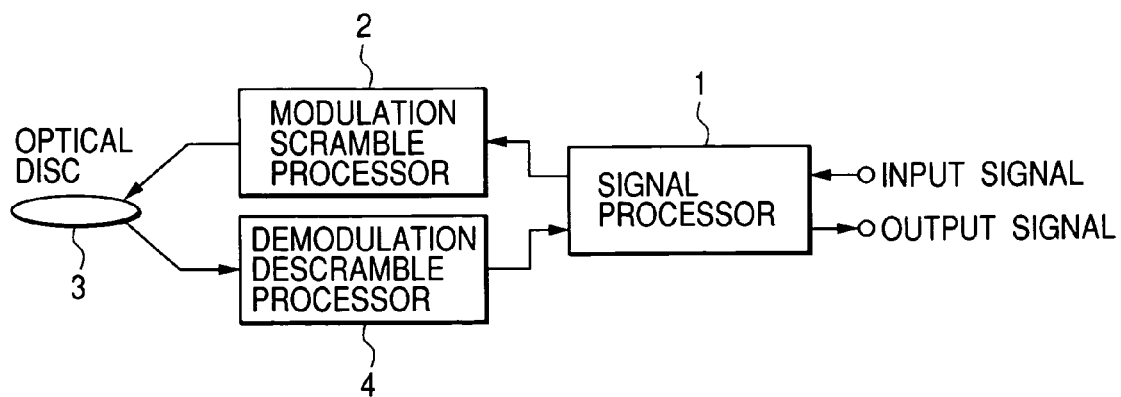
FIG. 8 is a block diagram of an information recording and reproducing apparatus according to a first embodiment of this invention.

FIG. 8 shows an information recording and reproducing apparatus according to a first embodiment of this invention. The apparatus of FIG. 8 includes a signal processor 1, a modulation/scramble processor 2, and a demodulation/descramble processor 4. The signal processor 1 includes an MPEG (Moving Picture Experts Group) encoder and an MPEG decoder.

During a recording mode of operation of the apparatus, the signal processor 1 receives an input signal representative of, for example, audio visual information. The signal processor 1 encodes the input signal into an MPEG signal (MPEG data) forming user data. The signal processor 1 feeds the user data to the modulation/scramble processor 2. The modulation/scramble processor 2 adds error detection code (EDC) data to the user data for every logical sector. The modulation/scramble processor 2 scrambles the user data and the EDC data for every logical sector. The modulation/scramble processor 2 adds error correction code data (parity data) to the scramble-resultant data. The modulation/scramble processor 2 subjects the parity-added data to modulation for record to get a modulation-resultant signal. The modulation/scramble processor 2 feeds the modulation-resultant signal to a head device (not shown). The head device records the modulation-resultant signal on a recording medium 3 such as an optical disc.

Specifically, the modulation/scramble processor 2 generates physical address information in response to, for example, address-related information fed from the signal processor 1. The modulation/scramble processor 2 scrambles the user data and the EDC data while using a predetermined part of a 1-sector-corresponding piece of the physical address information as a scramble initial value. The predetermined part is higher in position than another part of the 1-sector-corresponding piece of the physical address information which indicates a sector order number. Therefore, the sector-order-number part of the 1-sector-corresponding piece of the physical address information is excluded from the generation of the scramble initial value. For example, the modulation/scramble processor 2 scrambles the user data and the EDC data while using the 3 higher bytes and also the 3 higher bits in the subsequent byte of a 1-sector-corresponding piece of physical address information as a scramble initial value. The remaining bits in the subsequent byte which indicate a sector order number are excluded from the generation of the scramble initial value. The modulation/scramble processor 2 generates error correction code data in response to the scramble-resultant data and the physical address information. The generated error correction code data include first error correction code data (LDC data), second error correction code data (BIS data), and third error correction code data (AF data). The modulation/scramble processor 2 combines or multiplexes the scramble-resultant data, the physical address information, and the error correction code data into the parity-added data.

During a playback mode of operation of the apparatus, the head device reproduces a modulation-resultant signal from the recording medium 3. The head device feeds the reproduced signal to the demodulation/descramble processor 4. The demodulation/descramble processor 4 subjects the reproduced signal to demodulation to get demodulation-resultant data. The demodulation/descramble processor 4 corrects errors in the demodulation-resultant data in response to parity data contained therein. The demodulation/descramble processor 4 descrambles the error-corrected data to recover user data and EDC data. The demodulation/descramble processor 4 decides whether the recovered user data are correct or wrong in response to the EDC data. When it is decided that the recovered user data are correct, the demodulation/descramble processor 4 outputs the user data (the MPEG signal) to the signal processor 1. The signal processor 1 decodes the MPEG signal into an original signal (a recovered signal). The signal processor 1 outputs the recovered signal.

Figure 9:
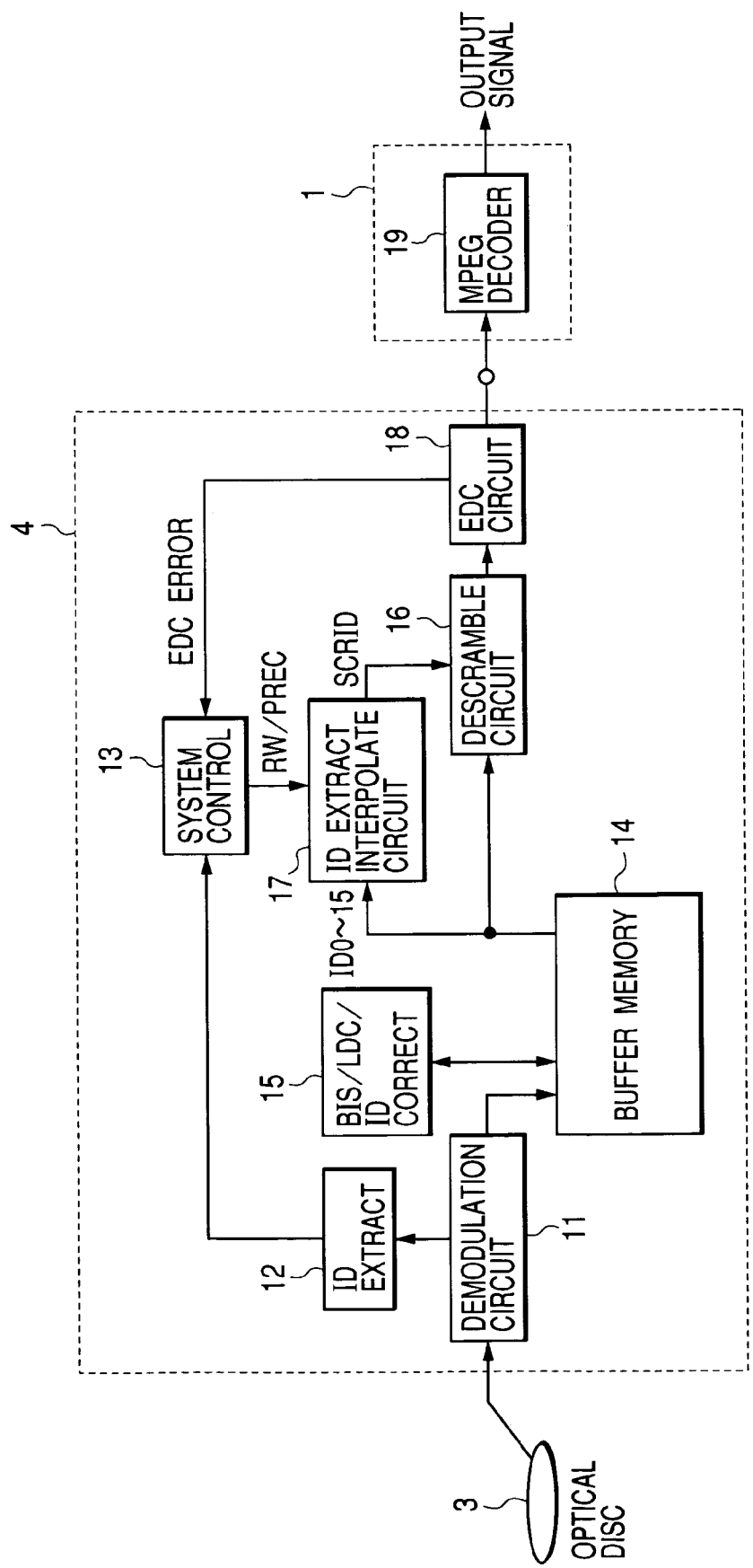
FIG. 9 is a block diagram of a demodulation/descramble processor in FIG. 8.

As shown in FIG. 9, the demodulation/descramble processor 4 includes a demodulation circuit 11, an ID extractor 12, a system controller 13, a buffer memory 14, a BIS/LDC/ID corrector 15, a descramble circuit 16, an ID extraction/interpolation circuit 17, and an EDC circuit 18.

The demodulation circuit 11 receives the modulation-resultant signal reproduced from the recording medium 3. The demodulation circuit 11 subjects the modulation-resultant signal to demodulation to get demodulation-resultant data. The demodulation circuit 11 feeds the demodulation-resultant data to the ID extractor 12 and the buffer memory 14. The device 12 extracts ID data from the demodulation-resultant data. The ID data contain physical address information. The ID extractor 12 outputs the ID data to the system controller 13.

The ID data further contain error detection/correction code data relating to the physical address information. The ID extractor 12 implements the detection of the ID data which involves the detection and correction of errors in the ID data. The ID extractor 12 outputs a signal indicative of the result of the error detection/correction to the system controller 13. When the physical address information is erroneous, the ID extractor 12 implements address interpolation based on an address continuity to estimate correct physical address information. The address continuity occurs during the scanning of the recording medium 3 along a recording track. The ID extractor 12 outputs the estimated correct physical address information to the system controller 13 as a part of the ID data.

The system controller 13 includes a computer having a combination of an input/output port, a CPU, a ROM, and a RAM. The system controller 13 operates in accordance with a control program stored in the ROM or the RAM. The control program is designed to enable the system controller 13 to implement operation steps mentioned hereafter.

Figure 10:
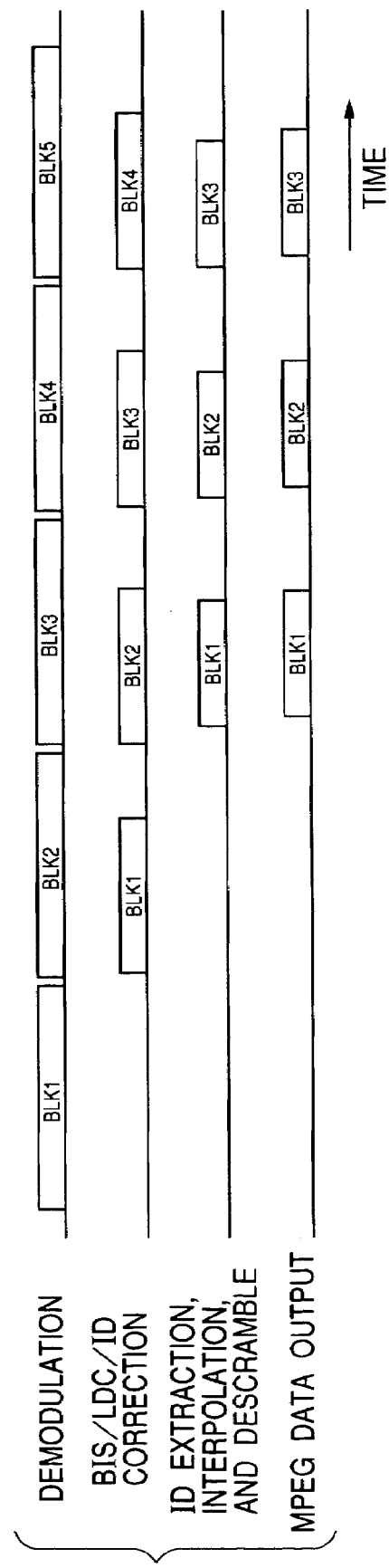
FIG. 10 is a time-domain diagram of signals in the demodulation/descramble processor of FIG. 9.

The system controller 13 commands the head device in response to the physical address information to access a desired position in a track on the recording medium 3 and to read out a desired ECC block therefrom. In general, ECC blocks are successively read out from the recording medium 3. The system controller 13 commands the demodulation circuit 11 to execute demodulation on a block-by-block basis, where "block" means "ECC block". The system controller 13 controls the demodulation circuit 11 and the buffer memory 14 so that the demodulation-resultant data will be written into the buffer memory 14 from the demodulation circuit 11 on a block-by-block basis as shown in FIG. 10 where BLK1, BLK2, BLK3, BLK4, and BLK5 denote successive ECC blocks.

The BIS/LDC/ID corrector 15 reads out the demodulation-resultant data from the buffer memory 14 on a block-by-block basis while being controlled by the system controller 13. For every ECC block, the BIS/LDC/ID corrector 15 subjects the read-out data to BIS correction, LDC correction, and ID correction while being controlled by the system controller 13. The BIS correction means the correction of errors in BIS-column portions of the read-out data in response to related parity data. The LDC correction means the correction of errors in the read-out data in response to the related parity data forming long-distance error correction coding information based on a long-distance code (an LDC). The ID correction means the correction of errors in ID data within the read-out data in response to related parity data. The BIS/LDC/ID corrector 15 writes the correction-resultant data back into the buffer memory 14 on a block-by-block basis (see FIG. 10) while being controlled by the system controller 13.

The modulation/scramble processor 2 (see FIG. 8) generates a succession of ECC blocks designed as follows. Every ECC block has a structure similar to that in FIG. 3. User data forming a part of first basic data have a size of about 4 kilobytes per physical sector. One ECC block consists of 16 physical sectors (see FIG. 3). About 64 kilobytes of user data in one ECC block are divided into 2-kilobyte segments assigned to logical sectors respectively. Error detection code (EDC) data are added to each of the 2-kilobyte segments of user data. The EDC data have a size of, for example, 4 bytes per logical sector. The user data and the EDC data compose the first basic data. First error correction code data (first parity data) are added to the first basic data.

A first error correction code system based on the first parity data has a structure similar to that in FIG. 4. First basic data composed of user data and EDC data are scrambled. The scramble-resultant first basic data in 32 logical sectors (one ECC block) are interleaved, and the interleave-resultant first basic data are arranged in a matrix of 216 column-direction bytes by 304 row-direction bytes. Parity data having 32 bytes are generated in response to each 216-byte data column, and are added thereto. Consequently, 304 columns of a Reed-Solomon code "RS(248, 216, 33)" are formed as a first error correction code system (see FIG. 4). In other words, about 64 kilobytes of user data and EDC data (first basic data) are divided into 216-byte segments, and 32-byte parity data forming a corresponding portion of the first error correction code data are added to each of the 216-byte segments. Thus, one ECC block contains 304 first error correction code words LDC ("RS(248, 216, 33)"), where LDC means a long-distance code (a long-distance error correction code).

Figure 11:
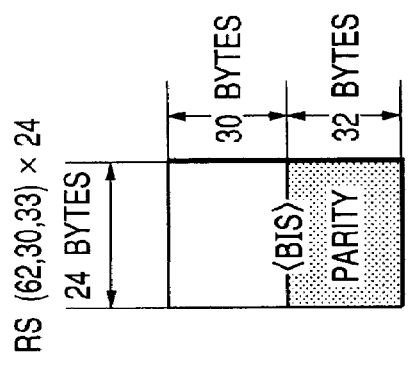
FIG. 11 is a diagram of the structure of an error correction code system relating to physical address information.

ID data corresponding to 16 physical sectors and additional information annexed to 32 logical sectors are handled as second basic data for every ECC block. The ID data contain physical address information, and error correction code data for the physical address information. Second error correction code data (second parity data) are added to the second basic data to form a Reed-Solomon code "RS(62, 30, 33)". With reference to FIG. 11, physical address information corresponding to 16 physical sectors, error correction code data for the physical address information, and additional information annexed to 32 logical sectors are interleaved. The interleave-resultant data are rearranged in a matrix of 30 column-direction bytes by 24 row-direction bytes. Parity data (second error correction code data) having 32 bytes are generated in response to each 30-byte data column, and are added thereto. Consequently, 24 columns of a Reed-Solomon code "RS(62, 30, 33)" are formed as a second error correction code system. In this way, 24 second error correction code words BIS ("RS(62, 30, 33)") are generated which contain 720 (30 by 24) bytes of second basic data and 768 (32 by 24) bytes of second error correction code data per ECC block. Here, BIS is short for bust indicator subcode.

For every ECC block, the physical address information consists of 16 pieces ID0, ID1, ID2, . . . , and ID15 assigned to 16 physical sectors respectively. Parity data forming third error correction code data are generated in response to each physical address information piece (ID0, ID1, ID2, . . . , or ID15), and are added thereto. Consequently, 16 third error correction code arrangements, that is, 16 third error correction code words, are formed as a third error correction code system. The parity data are designed for error correction or error detection about each physical address information piece (ID0, ID1, ID2, . . . , or ID15). As understood from the above description, second basic data for every ECC block contain physical address information about 16 physical sectors, error correction code data or error detection code data (parity data) exclusively for the physical address information, and additional information annexed to 32 logical sectors.

Second basic data inclusive of physical address information are contained in 24 second error correction code words "BIS(62, 30, 33)". First basic data inclusive of user data are contained in 304 first error correction code words "LDC (248, 216, 33)". Every ECC block is in the form of a matrix in which rows correspond to sync frames respectively. With reference to FIG. 3, 24 second error correction code words "BIS(62, 30, 33)" are interleaved and multiplexed with 304 first error correction code words "LDC(248, 216, 33)", and are thereby placed in 3 spaced BIS columns. As a result, the 16 physical address information pieces ID0, ID1, ID2, . . . , and ID15 are periodically located in the ECC block matrix. Specifically, each physical address information piece (ID0, ID1, ID2, . . . , or ID15) is located at BIS-column portions of a related physical sector. During playback, the demodulation circuit 11 recovers the physical address information pieces ID0, ID1, ID2, . . . , and ID15, and an access to the recording medium 3 is implemented in response to the recovered physical address information pieces. Frame sync signals SYNC are added to the heads of data rows to complete an ECC block to be recorded. Bytes composing the completed ECC block are recorded on the recording medium 3 in a sequence corresponding to a rightward direction with respect to FIG. 3.

The user data and the EDC data composing the first basic data are scrambled in response to the physical address information contained in the second basic data. A same scramble initial value is set with respect to user data and EDC data in 16 physical sectors of a common ECC block. Accordingly, sets of user data and EDC data in physical sectors for a common ECC block are subjected to the same scramble. Specifically, each physical address information piece (ID0, ID1, ID2, . . . , or ID15) has bits including successive ones representing a related physical sector order number. The sector-order-number representing bits are excluded from the decision of a scramble initial value. The scramble initial value is decided by bits of the physical address information piece which are higher in position than the sector-order-number representing bits. Therefore, the scramble is the same for all the physical sectors in a common ECC block. A descramble initial value for an ECC block which is used in the demodulation/descramble processor 4 is equal to a scramble initial value for the ECC block.

In every ECC block, the first error correction code system formed by the 304 first error correction code words "LDC (248, 216, 33)" contains the first basic data inclusive of the user data while the second error correction code system formed by the 24 second error correction code words "BIS(62, 30, 33)" contains the second basic data inclusive of the physical address information pieces ID0, ID1, ID2, . . . , and ID15 which represent the scramble initial value. From the viewpoint of error correction, the first error correction code system is independent of the second error correction code system. The first error correction code system and the second error correction code system are of the RS type, that is, the Reed-Solomon type.

With reference back to FIG. 9, the demodulation-resultant data are written into the buffer memory 14 from the demodulation circuit 11 on a block-by-block basis. Every ECC block is composed of frames having heads occupied by sync patterns or sync signals. The demodulation circuit 11 evaluates the sync pattern at the head of each frame. Specifically, the demodulation circuit 11 decides whether the sync pattern is equal to or different from the original pattern. When the sync pattern is different from the original pattern, the demodulation circuit 11 generates a sync error flag and writes it into the buffer memory 14 together with a portion of the demodulation-resultant data which corresponds to the present frame.

The BIS/LDC/ID corrector 15 reads out the demodulation-resultant data from the buffer memory 14 on a block-by-block basis. For every ECC block, the BIS/LDC/ID corrector 15 subjects the read-out data to BIS correction, LDC correction, and ID correction (see FIG. 10). Firstly, the BIS correction is executed. During the BIS correction, errors in the second basic data in the BIS columns of the read-out ECC block matrix (see FIG. 3) are corrected according to the second error correction code data (the second parity data). At the same time, the positions of errors in the second basic data in the BIS columns of the read-out ECC block matrix are detected according to the second error correction code data. The BIS/LDC/ID corrector 15 generates BIS error flags in response to the detected error positions respectively. The BIS/LDC/ID corrector 15 memorizes the BIS error flags. The BIS error flags are used for generating erasure pointers during the LDC correction.

The LDC correction follows the BIS correction. During the LDC correction, errors in the first basic data in the read-out ECC block are corrected according to the first error correction code data (the first parity data). A data portion in the ECC block which extends between a sync error and a BIS error represented by related flags (a sync error flag and a BIS error flag) is regarded as a burst error, and an erasure pointer is generated in response to the burst error. The burst error is accompanied with the erasure pointer. The burst error with the erasure pointer is subjected to erasure correction according to the related Reed-Solomon code "RS(248, 216, 33)" shown in FIG. 4.

Preferably, the ID correction follows the LDC correction. During the ID correction, errors in the physical address information (or the ID data) in the read-out data are corrected in response to the related parity data (the third error correction code data). It should be noted that the ID correction may be omitted.

The BIS/LDC/ID corrector 15 writes the correction-resultant data back into the buffer memory 14 on a block-by-block basis (see FIG. 10). The descramble circuit 16 reads out the correction-resultant data from the buffer memory 14 for every logical sector while being controlled by the system controller 13. The descramble circuit 16 descrambles the read-out data into MPEG data (an MPEG signal) in response to a descramble initial value while being controlled by the system controller 13. The descramble circuit 16 outputs the descramble-resultant data (the MPEG data) to the EDC circuit 18 on a block-by-block basis (see FIG. 10) under the control by the system controller 13. For every logical sector, the EDC circuit 18 decides whether the descramble-resultant data are correct or wrong on the basis of the EDC data therein while being controlled by the system controller 13. When the descramble-resultant data are wrong, the EDC circuit 18 is controlled by the system controller 13 to send a signal indicative of the EDC error to the system controller 13. In the case where the descramble-resultant data are correct, the EDC circuit 18 is controlled by the system controller 13 to pass the descramble-resultant data (the MPEG data) to an MPEG decoder 19 on a block-by-block basis (see FIG. 10). The MPEG decoder 19 is contained in the signal processor 1.

The ID extraction/interpolation circuit 17 is controlled by the system controller 13 to read out the 16 physical address information pieces ID0, ID1, ID2, . . . , and ID15 and the related third error correction code data (the related third parity data) in the correction-resultant data from the buffer memory 14 for every ECC block before the descramble circuit 16 executes the descramble of the present ECC block. The ID extraction/interpolation circuit 17 detects errors in the physical address information pieces ID0, ID1, ID2, . . . , and ID15 in response to the related third error correction code data while being controlled by the system controller 13. Thereby, the ID extraction/interpolation circuit 17 decides whether each of the physical address information pieces ID0, ID1, ID2, and ID15 is correct or erroneous. The ID extraction/interpolation circuit 17 is controlled by the system controller 13 to generate a descramble initial value SCRID for the present ECC block in response to, for example, the 3 higher bytes as well as the 3 higher bits in the subsequent byte of a physical address information piece decided to be correct. The remaining bits in the subsequent byte of the physical address information piece which indicate a sector order number are excluded from the generation of the descramble initial value SCRID. The ID extraction/interpolation circuit 17 notifies the descramble circuit 16 of the descramble initial value SCRID while being controlled by the system controller 13. The ID extraction/interpolation circuit 17 has an internal register. The ID extraction/interpolation circuit 17 is controlled by the system controller 13 to load the internal register with the correct physical address information piece for later use.

In the event that all the 16 physical address information pieces ID0, ID1, ID2, . . . , and ID15 are decided to be erroneous, the ID extraction/interpolation circuit 17 estimates a correct physical address information piece in the present ECC block from a physical address information piece in the immediately-preceding ECC block by interpolation based on an address continuity while being controlled by the system controller 13. It is assumed that the lowest byte of a physical address information piece in the present ECC block is "011xxxx0", where "xxxx" denote four successive bits in the range from "0000" to "1111". In this case, the lowest byte of a physical address information piece in the immediately-preceding ECC block is "010xxxx0". The ID extraction/interpolation circuit 17 is controlled by the system controller 13 to retrieve a physical address information piece in the immediately-preceding ECC block from the internal register. Under the control by the system controller 13, the ID extraction/interpolation circuit 17 adds "100000" to the physical address information piece in the immediately-preceding ECC block (the lowest byte of which is "010xxxx0") to get an estimated correct physical address information piece in the present ECC block. The lowest byte of the estimated correct physical address information piece is "011xxxx0". The ID extraction/interpolation circuit 17 generates a descramble initial value SCRID for the present ECC block in response to, for example, the 3 higher bytes as well as the 3 higher bits in the subsequent byte of the estimated correct physical address information piece while being controlled by the system controller 13. The remaining bits in the subsequent byte of the estimated correct physical address information piece are excluded from the generation of the descramble initial value SCRID. The ID extraction/interpolation circuit 17 is controlled by the system controller 13 to notify the descramble circuit 16 of the descramble initial value SCRID. Under the control by the system controller 13, the ID extraction/interpolation circuit 17 loads the internal register with the estimated correct physical address information piece for later use.

Figure 12:
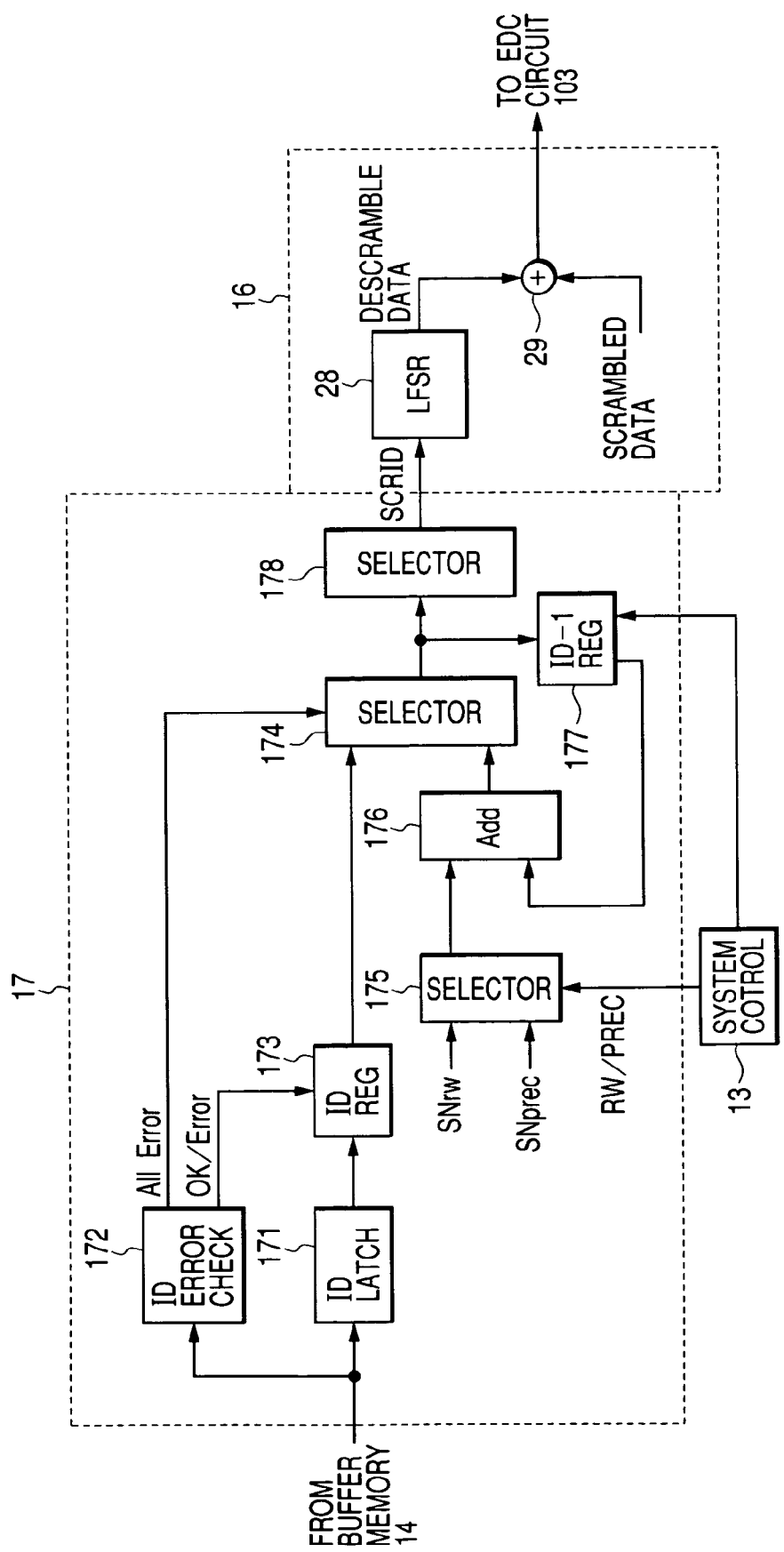
FIG. 12 is a block diagram of an ID extraction/interpolation circuit and a descramble circuit in FIG. 9.

As shown in FIG. 12, the ID extraction/interpolation circuit 17 includes a latch 171, an error check circuit 172, a register 173, selectors 174 and 175, an adder 176, a register 177, and a selector 178. The descramble circuit 16 includes a linear feedback shift register (an LFSR) 28 and an adder 29.

The 16 physical address information pieces ID0, ID1, ID2, . . . , and ID15 read out from the buffer memory 14 are successively latched by the device 171 before being successively outputted from the latch 171 to the register 173. Also, the 16 physical address information pieces ID0, ID1, ID2, . . . , and ID15 are successively fed to the error check circuit 172. At the same time, the third error correction code data (the third parity data) related to the 16 physical address information pieces ID0, ID1, ID2, . . . , and ID15 and read out from the buffer memory 14 are fed to the error check circuit 172. The error check circuit 172 decides whether each of the physical address information pieces ID0, ID1, ID2, . . . , and ID15 is correct or erroneous in response to a related part of the third error correction code data. For each of the physical address information pieces ID0, ID1, ID2, . . . , and ID15, the error check circuit 172 outputs a signal OK/Error indicative of the result of the decision to the register 173. When the decision result signal OK/Error indicates that the related physical address information piece is correct, the register 173 stores the present physical address information piece outputted from the latch 171. When the decision result signal OK/Error indicates that the related physical address information piece is erroneous, the register 173 refuses to store the present physical address information piece outputted from the latch 171. In the case where all the 16 physical address information pieces ID0, ID1, ID2, . . . , and ID15 are erroneous, the error check circuit 172 generates an all-error signal and outputs it to the selector 174.

In the case where at least one of the 16 physical address information pieces ID0, ID1, ID2, . . . , and ID15 is correct, that is, in the absence of the all-error signal outputted from the error check circuit 172, the correct physical address information piece is transmitted from the register 173 to the selector 178 and the register 177 through the selector 174. The selector 178 passes, for example, the 3 higher bytes and the 3 higher bits in the subsequent byte of the correct physical address information piece to the LFSR 28 while blocking the remaining bits in the subsequent byte which indicate a sector order number. The LFSR 28 uses the 3 higher bytes and the 3 higher bits in the subsequent byte of the correct physical address information piece as a descramble initial value SCRID for the present ECC block. The correct physical address information piece is stored into the register 177 for later use.

The adder 176 reads out the physical address information piece from the register 177 which relates to the ECC block immediately preceding the present ECC block. The adder 176 receives, from the selector 175, a signal indicating an address increment for one ECC block. The device 176 adds the preceding-ECC-block physical address information piece and the address increment to get an incremented physical address information piece for the present ECC block. The adder 176 outputs the incremented physical address information piece. In the case where all the 16 physical address information pieces ID0, ID1, ID2, . . . , and ID15 are erroneous, that is, in the presence of the all-error signal outputted from the error check circuit 172, the incremented physical address information piece outputted from the adder 176 is transmitted to the selector 178 and the register 177 through the selector 174. The selector 178 passes, for example, the 3 higher bytes and the 3 higher bits in the subsequent byte of the incremented physical address information piece to the LFSR 28 while blocking the remaining bits in the subsequent byte which indicate a sector order number. The LFSR 28 uses the 3 higher bytes and the 3 higher bits in the subsequent byte of the incremented physical address information piece as a descramble initial value SCRID for the present ECC block. The incremented physical address information piece is stored into the register 177 for later use.

The LFSR 28 generates descramble data in response to the descramble initial value SCRID. The LFSR 28 outputs the descramble data to the adder 29. The adder 29 receives the correction-resultant data (the scramble-resultant user data and EDC data) from the buffer memory 14. The adder 29 executes modulo-2 addition between the descramble data and the correction-resultant data, and thereby descrambles the correction-resultant data to recover the original user data and EDC data. The adder 29 outputs the descramble-resultant data, that is, the recovered user data and EDC data, to the EDC circuit 18.

The recording medium 3 may include an optical disc having a rewritable area and a read-only area. The rewritable area is formed by a groove or grooves along which a signal is recorded. The read-only area is formed by wobble of a groove or grooves which represents a recorded address signal or another recorded signal. Generally, signal recording based on wobble causes a low recording density. Accordingly, it is preferable that the number of sectors per ECC block in the read-only area is smaller than that in the rewritable area. In this case, an address increment per ECC block in the read-only area is smaller than that in the rewritable area. Thus, the address increment fed to the adder 176 is changed depending on whether a modulation-resultant signal is currently reproduced from the rewritable area or the read-only area of the recording medium 3.

As shown in FIG. 12, a signal indicating a first address increment SNrw is fed to the selector 175. The first address increment SNrw is assigned to a modulation-resultant signal reproduced from the rewritable area of the recording medium 3. Typically, the first address increment SNrw is equal to "100000" (32 in decimal notation). Also, a signal indicating a second address increment SNprec is fed to the selector 175. The second address increment SNprec is assigned to a modulation-resultant signal reproduced from the read-only area of the recording medium 3. The second address increment SNprec is smaller than the first address increment SNrw. Typically, the second address increment SNprec is equal to "10" (2 in decimal notation).

The system controller 13 generates a control signal RW/PREC depending on which of the rewritable area and the read-only area of the recording medium 3 is currently accessed by the head device. The system controller 13 feeds the control signal RW/PREC to the selector 175. The device 175 selects either the signal indicative of the first address increment SNrw or the signal indicative of the second address increment SNprec in response to the control signal RW/PREC, and passes the selected address-increment signal to the adder 176. Specifically, the signal indicative of the first address increment SNrw is selected when the rewritable area of the recording medium 3 is currently accessed by the head device. The signal indicative of the second address increment SNprec is selected when the read-only area of the recording medium 3 is currently accessed by the head device. Therefore, in the case where the rewritable area of the recording medium 3 is currently accessed by the head device, the device 176 adds the preceding-ECC-block physical address information piece and the first address increment SNrw to get an incremented physical address information piece for the present ECC block. In the case where the read-only area of the recording medium 3 is currently accessed by the head device, the device 176 adds the preceding-ECC-block physical address information piece and the second address increment SNprec to get an incremented physical address information piece for the present ECC block.

There is no ECC block which immediately precedes a first ECC block occurring in the playback mode of operation of the apparatus. Thus, with respect to the first ECC block, a preceding-ECC-block physical address information piece is absent from the register 177. For the first ECC block, the system controller 13 previously loads the register 177 with a predetermined signal corresponding to a preceding-ECC-block physical address information piece.

Successive segments of user data may be dispersedly recorded on the recording medium 3. In this case, during the playback of the recording medium 3, the head device is controlled to perform track jumps which cause discontinuous changes in the accessed address (the accessed position) on the recording medium 3. For a first ECC block after a track jump, the system controller 13 previously loads the register 177 with a given signal corresponding to a preceding-ECC-block physical address information piece.

Figure 13:
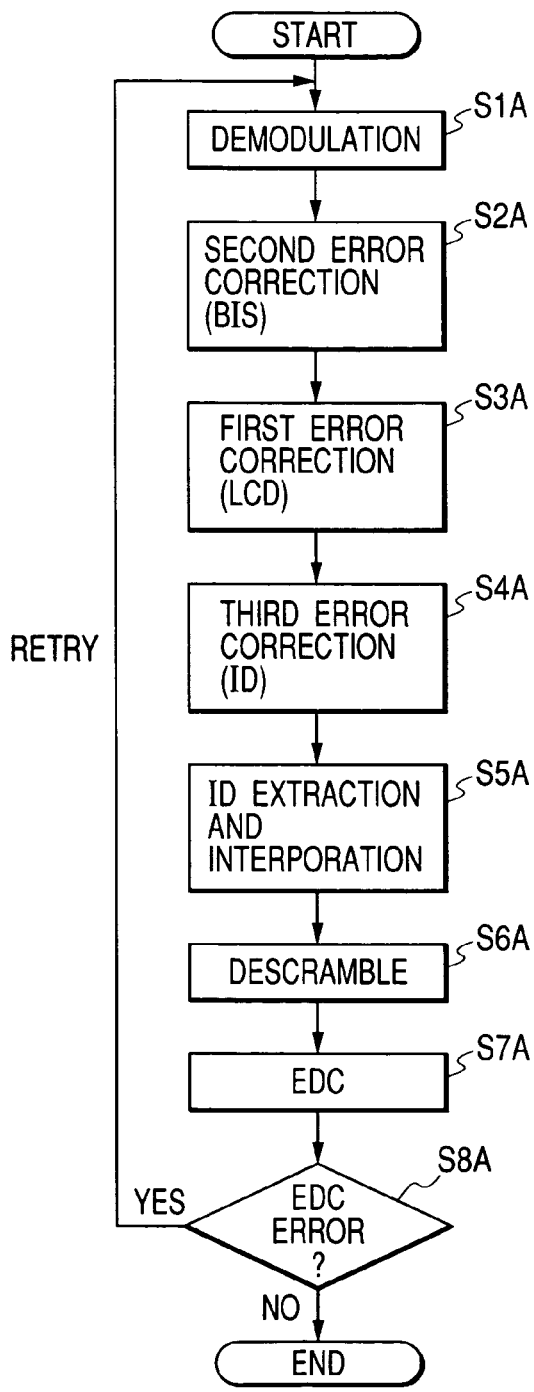
FIG. 13 is a flowchart of a playback-related segment of a control program for a system controller in FIG. 9.

As previously mentioned, the system controller 13 operates in accordance with a control program stored in its internal ROM or RAM. FIG. 13 is a flowchart of a segment of the control program which relates to the playback mode of operation of the apparatus. The program segment in FIG. 13 is executed for every desired ECC block.

With reference to FIG. 13, a first step S1A of the program segment controls the head device to read out a modulation-resultant signal, which corresponds to a desired ECC block, from the recording medium 3. The read-out signal is sent from the head device to the demodulation circuit 11. The step S1A controls the demodulation circuit 11 to subject the read-out signal to demodulation to get demodulation-resultant data. The step S1A controls the demodulation circuit 11 to write the demodulation-resultant data into the buffer memory 14.

A step S2A following the step S1A controls the BIS/LDC/ID corrector 15 to read out the demodulation-resultant data from the buffer memory 14. The step S2A controls the BIS/LDC/ID corrector 15 to execute BIS correction with respect to the demodulation-resultant data.

A step S3A subsequent to the step S2A controls the BIS/LDC/ID corrector 15 to execute LDC correction with respect to the demodulation-resultant data.

A step S4A following the step S3A controls the BIS/LDC/ID corrector 15 to execute ID correction with respect to the demodulation-resultant data. As a result, correction-resultant data are obtained. The step S4A controls the BIS/LDC/ID corrector 15 to write the correction-resultant data back into the buffer memory 14.

A step S5A subsequent to the step S4A controls the ID extraction/interpolation circuit 17 to read out portions of the correction-resultant data from the buffer memory 14. The step S5A controls the ID extraction/interpolation circuit 17 to implement ID extraction and address interpolation with respect to the correction-resultant data, and thereby to generate a descramble initial value SCRID.

A step S6A following the step S5A controls the descramble circuit 16 to read out the correction-resultant data from the buffer memory 14. The step S6A controls the descramble circuit 16 to descramble the correction-resultant data in response to the descramble initial value SCRID to get descramble-resultant data. The descramble-resultant data are fed to the EDC circuit 18.

A step S7A subsequent to the step S6A controls the EDC circuit 18 to decide whether the descramble-resultant data are correct or wrong on the basis of EDC data therein for every logical sector. The step S7A generates a signal indicative of an EDC error when the descramble-resultant data are wrong.

A step S8A following the step S7A decides whether or not an EDC error signal is generated by the step S7A. When an EDC error signal is generated, the program returns from the step S8A to the step S1A. In this case, the head device retries to read out the modulation-resultant signal, which corresponds to the desired ECC block, from the recording medium 3. On the other hand, when an EDC error signal is not generated, the program exits from the step S8A and then the current execution cycle of the program segment ends. In this case, the program may proceed to a segment for MPEG decoding.

Figure 14:
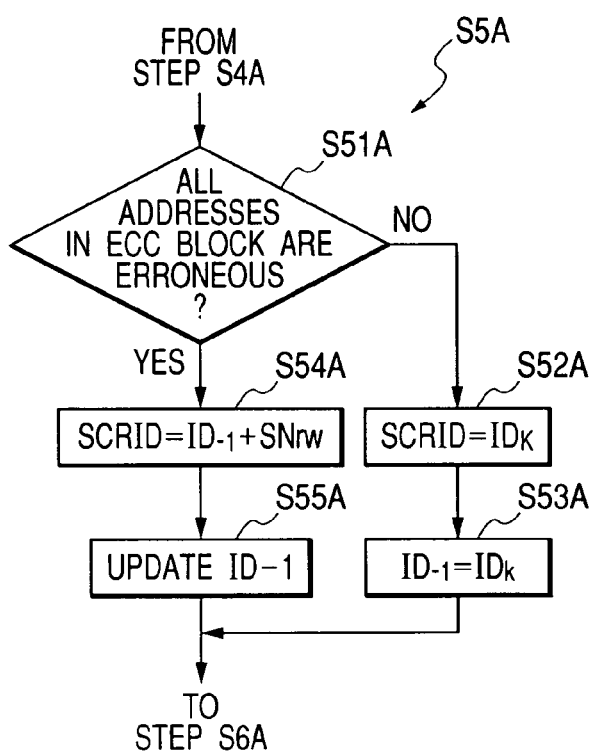
FIG. 14 is a flowchart showing the internal structure of a step in FIG. 13.

As shown in FIG. 14, the step S5A includes sub-steps S51A, S52A, S53A, S54A, and S55A. The sub-step S51A follows the step S4A in FIG. 13. The sub-step S51A controls the ID extraction/interpolation circuit 17 to access the 16 physical address information pieces ID0, ID1, ID2, . . . , and ID15 and the related third error correction code data (the related third parity data) in the correction-resultant data within the desired ECC block. The sub-step S51A controls the ID extraction/interpolation circuit 17 to detect errors in the 16 physical address information pieces ID0, ID1, ID2, . . . , and ID15 in response to the related third error correction code data. Thereby, a decision is made as to whether each of the 16 physical address information pieces ID0, ID1, ID2, . . . , and ID15 is correct or erroneous. In other words, a decision is made as to whether or not all the 16 physical address information pieces ID0, ID1, ID2, . . . , and ID15 are erroneous. When all the 16 physical address information pieces ID0, ID1, ID2, . . . , and ID15 are erroneous, the program advances from the sub-step S51A to the sub-step S54A. Otherwise, the program advances from the sub-step S51A to the sub-step S52A.

The sub-step S52A controls the ID extraction/interpolation circuit 17 to find a correct physical address information piece IDk among the 16 physical address information pieces ID0, ID1, ID2, . . . , and ID15 by referring to the results of the decision by the sub-step S51A. The sub-step S52A controls the ID extraction/interpolation circuit 17 to set a descramble initial value SCRID to the 3 higher bytes and the 3 higher bits in the subsequent byte of the correct physical address information piece IDk. For example, in the case where the correct physical address information piece IDk is "A_B_C_01100010", the descramble initial value SCRID is set to "A_B_C_011" where A, B, and C denote the 3 higher bytes of the correct physical address information piece. The later step S6A controls the descramble circuit 16 to implement descramble in response to the descramble initial value SCRID.

The sub-step S53A follows the sub-step S52A. The sub-step S53A controls the ID extraction/interpolation circuit 17 to update a preceding-ECC-block physical address information piece ID-1. Specifically, the sub-step S53A sets the preceding-ECC-block physical address information piece ID-1 to the correct physical address information piece IDk. For example, in the case where the correct physical address information piece IDk is "A_B_C_01100010", the preceding-ECC-block physical address information piece ID-1 is updated to "A_B_C_01100010". After the sub-step S53A, the program advances to the step S6A.

The sub-step S54A controls the ID extraction/interpolation circuit 17 to add the preceding-ECC-block physical address information piece ID-1 and an address increment SNrw (or SNprec) to get an incremented physical address information piece for the present ECC block. The sub-step S54A controls the ID extraction/interpolation circuit 17 to set the descramble initial value SCRID to the 3 higher bytes and the 3 higher bits in the subsequent byte of the incremented physical address information piece. For example, in the case where the preceding-ECC-block physical address information piece ID-1 is "A_B_C_010xxxx0" and the address increment SNrw is "100000", the incremented physical address information piece is "A_B_C_011xxxx0". In this case, the descramble initial value SCRID is set to "A_B_C_011".

The sub-step S55A follows the sub-step S54A. The sub-step S55A controls the ID extraction/interpolation circuit 17 to update the preceding-ECC-block physical address information piece ID-1. Specifically, the sub-step S55A controls the ID extraction/interpolation circuit 17 to set the preceding-ECC-block physical address information piece ID-1 to the incremented physical address information piece given by the step S54A. For example, in the case where the incremented physical address information piece is "A_B_C_011xxxx0", the preceding-ECC-block physical address information piece ID-1 is updated to "A_B_C_011xxxx0". After the sub-step S55A, the program advances to the step S6A.

It should be noted that the ID correction may be implemented by the ID extraction/interpolation circuit 17 rather than the BIS/LDC/ID corrector 15.

Second Embodiment

Figure 15:
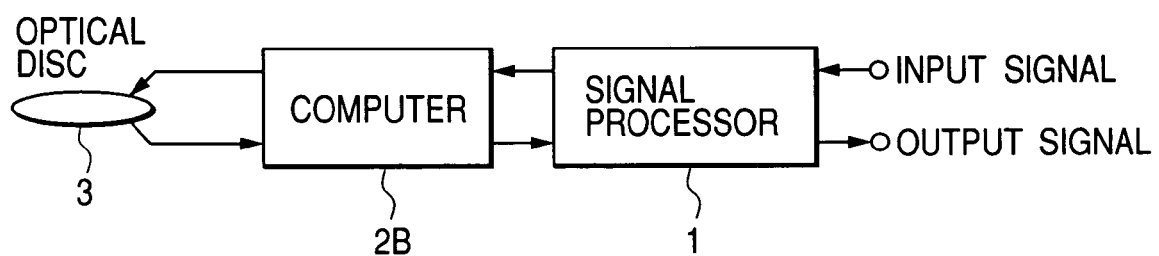
FIG. 15 is a block diagram of an information recording and reproducing apparatus according to a second embodiment of this invention.

FIG. 15 shows an information recording and reproducing apparatus according to a second embodiment of this invention. The apparatus of FIG. 15 is similar to the apparatus of FIG. 8 except for design changes mentioned hereafter.

The apparatus of FIG. 15 includes a computer 2B connected with a signal processor 1. The computer 2B can access a recording medium 3 via a head device (not shown). During a recording mode of operation of the apparatus, the computer 2B receives user data (an MPEG signal) from the signal processor 1. During a playback mode of operation of the apparatus, the computer 2B outputs user data (an MPEG signal) to the signal processor 1.

The computer 2B includes a combination of an input/output port, a CPU, a ROM, and a RAM. The computer 2B operates in accordance with a control program stored in the ROM or the RAM. The control program is designed to enable the computer 2B to operate as the modulation/scramble processor 2 and the demodulation/descramble processor 4 in FIG. 8.

Figure 16:
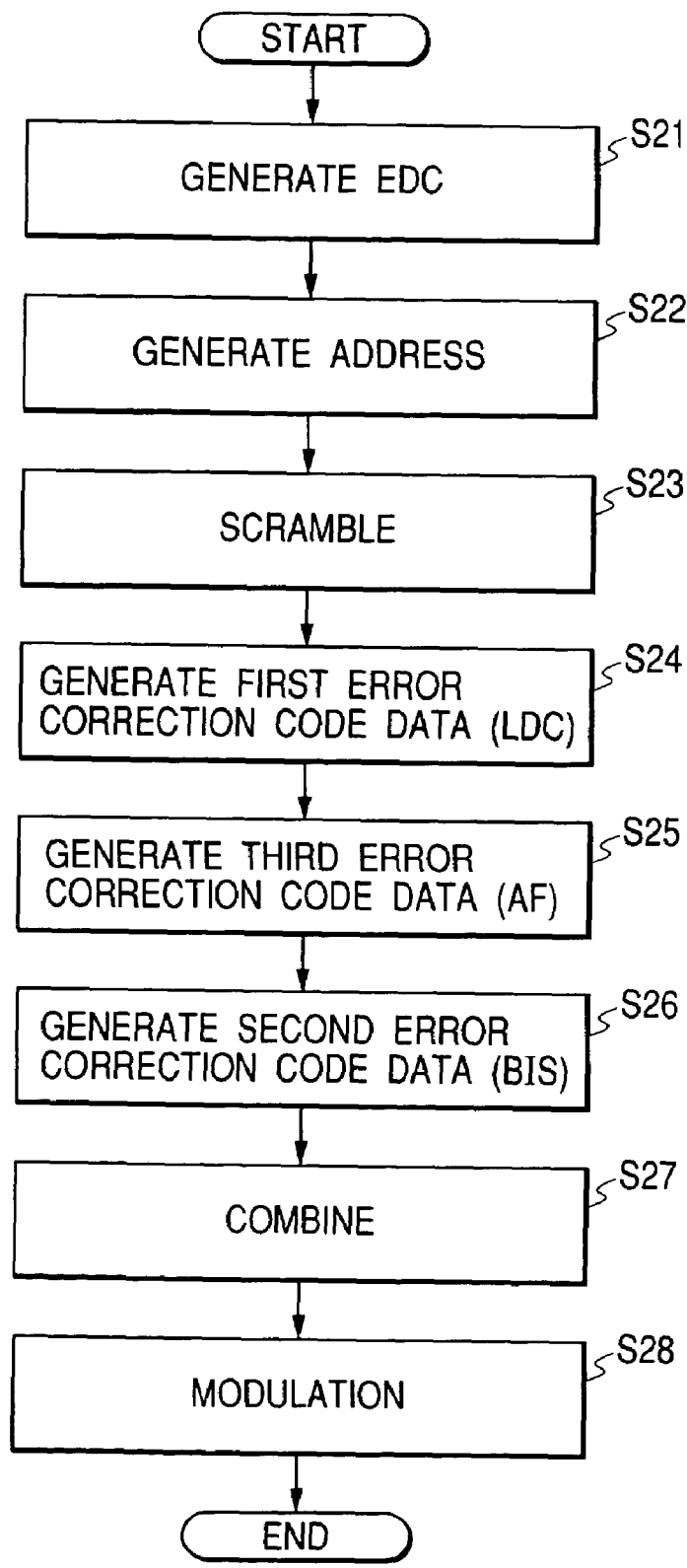
FIG. 16 is a flowchart of a recording-related segment of a control program for a computer in FIG. 15.

FIG. 16 is a flowchart of a segment of the control program for the computer 2B which relates to the recording mode of operation of the apparatus. The program segment in FIG. 16 is executed for every ECC block.

As shown in FIG. 16, a first step S21 of the program segment generates EDC data in response to user data.

A step S22 following the step S21 generates physical address information in response to, for example, address-related information fed from the signal processor 1.

A step S23 subsequent to the step S22 generates a scramble initial value in response to a part of the physical address information which is unrelated with a sector order number. The step S23 scrambles the user data and the EDC data in response to the scramble initial value to generate scramble-resultant data.

A step S24 following the step S23 generates first error correction code data (LDC data) in response to the scramble-resultant data.

A step S25 subsequent to the step S24 generates third error correction code data (AF data) in response to the physical address information.

A step S26 following the step S25 generates second error correction code data (BIS data) in response to the physical address information and the third error correction code data.

A step S27 subsequent to the step S26 combines or multiplexes the scramble-resultant data, the physical address information, the first error correction code data (the LDC data), the second error correction code data (the BIS data), and the third error correction code data (the AF data) into an ECC-block signal.

A step S28 following the step S27 subjects the ECC-block signal to modulation for record on the recording medium 3, and thereby gets a modulation-resultant signal. The step S28 outputs the modulation-resultant signal to the head device. After the step S28, the current execution cycle of the program segment ends.

FIG. 17 is a flowchart of a segment of the control program for the computer 2B which relates to the playback mode of operation of the apparatus. The program segment in FIG. 17 is executed for every desired ECC block.

With reference to FIG. 17, a first step S1 of the program segment controls the head device to read out a modulation-resultant signal, which corresponds to a desired ECC block, from the recording medium 3. The read-out signal is sent from the head device to the computer 2B. The step S1 subjects the read-out signal to demodulation to get demodulation-resultant data.

A step S2 following the step S1 executes BIS correction with respect to the demodulation-resultant data.

A step S3 subsequent to the step S2 executes LDC correction with respect to the demodulation-resultant data.

A step S4 following the step S3 executes ID correction with respect to the demodulation-resultant data. As a result, correction-resultant data are obtained.

A step S5 subsequent to the step S4 implements ID extraction and address interpolation with respect to the correction-resultant data, and thereby generates a descramble initial value SCRID.

A step S6 following the step S5 descrambles the correction-resultant data in response to the descramble initial value SCRID to get descramble-resultant data.

A step S7 subsequent to the step S6 decides whether the descramble-resultant data are correct or wrong on the basis of EDC data therein for every logical sector. The step S7 generates a signal indicative of an EDC error when the descramble-resultant data are wrong.

A step S8 following the step S7 decides whether or not an EDC error signal is generated by the step S7. When an EDC error signal is generated, the program returns from the step S8 to the step S1. In this case, the head device retries to read out the modulation-resultant signal, which corresponds to the desired ECC block, from the recording medium 3. On the other hand, when an EDC error signal is not generated, the program exits from the step S8 and then the current execution cycle of the program segment ends. In this case, the program may proceed to a segment for MPEG decoding.

As shown in FIG. 18, the step S5 includes sub-steps S51, S52, S53, S54, and S55. The sub-step S51 follows the step S4 in FIG. 17. The sub-step S51 accesses the 16 physical address information pieces ID0, ID1, ID2, . . . , and ID15 and the related third error correction code data (the related third parity data) in the correction-resultant data within the desired ECC block. The sub-step S51 detects errors in the 16 physical address information pieces ID0, ID1, ID2, . . . , and ID15 in response to the related third error correction code data. Thereby, the sub-step S51 decides whether each of the 16 physical address information pieces ID0, ID1, ID2, . . . , and ID15 is correct or erroneous. In other words, the sub-step S51 decides whether or not all the 16 physical address information pieces ID0, ID1, ID2, . . . , and ID15 are erroneous. When all the 16 physical address information pieces ID0, ID1, ID2, . . . , and ID15 are erroneous, the program advances from the sub-step S51 to the sub-step S54. Otherwise, the program advances from the sub-step S51 to the sub-step S52.

The sub-step S52 finds a correct physical address information piece IDk among the 16 physical address information pieces ID0, ID1, ID2, . . . , and ID15 by referring the results of the decision by the sub-step S51. The sub-step S52 sets a descramble initial value SCRID to the 3 higher bytes and the 3 higher bits in the subsequent byte of the correct physical address information piece IDk. For example, in the case where the correct physical address information piece IDk is "A_B_C_01100010", the descramble initial value SCRID is set to "A_B_C_011" where A, B, and C denote the 3 higher bytes of the correct address information piece. The later step S6 implements descramble in response to the descramble initial value SCRID.

The sub-step S53 follows the sub-step S52. The sub-step S53 updates a preceding-ECC-block physical address information piece ID-1. Specifically, the sub-step S53 sets the preceding-ECC-block physical address information piece ID-1 to the correct physical address information piece IDk. For example, in the case where the correct physical address information piece IDk is "A_B_C_01100010", the preceding-ECC-block physical address information piece ID-1 is updated to "A_B_C_01100010". After the sub-step S53, the program advances to the step S6.

The sub-step S54 adds the preceding-ECC-block physical address information piece ID-1 and an address increment SNrw (or SNprec) to get an incremented physical address information piece for the present ECC block. The sub-step S54 sets the descramble initial value SCRID to the 3 higher bytes and the 3 higher bits in the subsequent byte of the incremented physical address information piece. For example, in the case where the preceding-ECC-block physical address information piece ID-1 is "A_B_C_010xxxx0" and the address increment SNrw is "100000", the incremented physical address information piece is "A_B_C_011xxxx0". In this case, the descramble initial value SCRID is set to "A_B_C_011".

The sub-step S55 follows the sub-step S54. The sub-step S55 updates the preceding-ECC-block physical address information piece ID-1. Specifically, the sub-step S55 sets the preceding-ECC-block physical address information piece ID-1 to the incremented physical address information piece given by the step S54. For example, in the case where the incremented physical address information piece is "A_B_C_011xxxx0", the preceding-ECC-block physical address information piece ID-1 is updated to "A_B_C_011xxxx0". After the sub-step S55, the program advances to the step S6.

In the case where at least one of the 16 physical address information pieces ID0, ID1, ID2, . . . , and ID15 is correct, an address continuity is evaluated by verifying that the correct physical address information piece IDk is equal to the preceding-ECC-block physical address information piece ID-1 plus the address increment SNrw.

Third Embodiment

Figure 19:
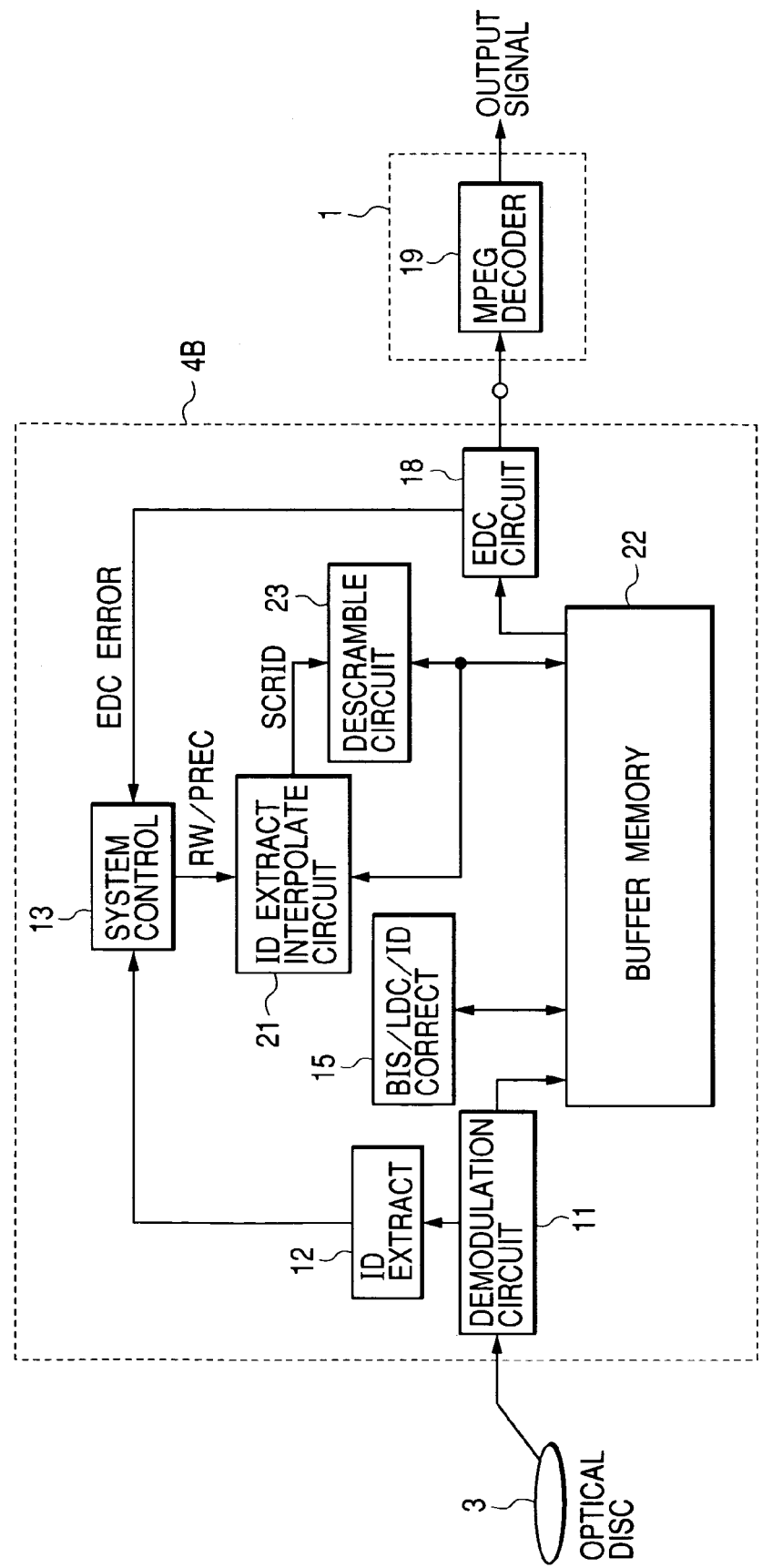
FIG. 19 is a block diagram of a portion of an information recording and reproducing apparatus according to a third embodiment of this invention.

FIG. 19 shows a portion of an information recording and reproducing apparatus according to a third embodiment of this invention. The apparatus in the third embodiment of this invention is similar to the apparatus of FIG. 8 except for design changes mentioned hereafter. The apparatus in the third embodiment of this invention includes a demodulation/descramble processor 4B instead of the demodulation/descramble processor 4 in FIG. 8.

As shown in FIG. 19, the demodulation/descramble processor 4B includes a buffer memory 22, an ID extraction/interpolation circuit 21, and a descramble circuit 23 instead of the buffer memory 14, the ID extraction/interpolation circuit 17, and the descramble circuit 16 in FIG. 9 respectively.

The buffer memory 22 is used by a demodulation circuit 11 and a BIS/LDC/ID corrector 15 as the buffer memory 14 is used by them in FIG. 9. The ID extraction/interpolation circuit 21 is controlled by a system controller 13 to read out 16 physical address information pieces ID0, ID1, ID2, . . . , and ID15 and related third error correction code data (related third parity data) in correction-resultant data from the buffer memory 22 for every ECC block before the descramble circuit 23 executes the descramble of the present ECC block. The ID extraction/interpolation circuit 21 generates a descramble initial value SCRID as the ID extraction/interpolation circuit 17 in FIG. 9 does. The ID extraction/interpolation circuit 21 outputs the descramble initial value SCRID to the descramble circuit 23.

Figure 20:
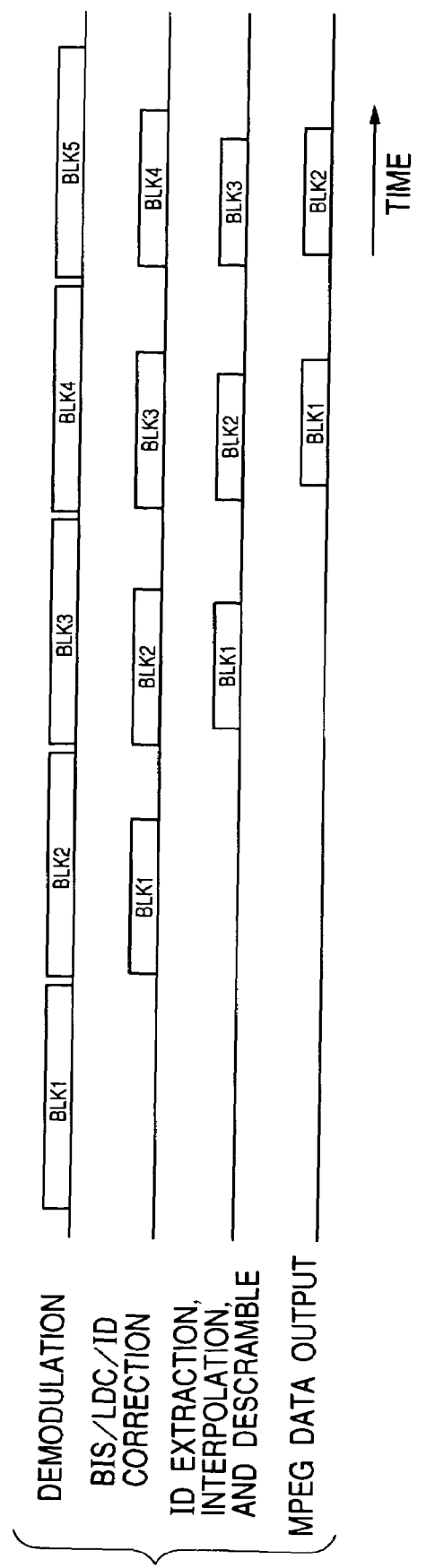
FIG. 20 is a time-domain diagram of signals in a demodulation/descramble processor in FIG. 19.

The modulation circuit 11 outputs modulation-resultant data to the buffer memory 22 on a block-by-block basis as shown in FIG. 20. The BIS/LDC/ID corrector 15 outputs the correction-resultant data to the buffer memory 22 on a block-by-block basis as shown in FIG. 20. The descramble circuit 23 reads out the correction-resultant data from the buffer memory 22 for every logical sector while being controlled by the system controller 13. The descramble circuit 23 descrambles the read-out data into MPEG data in response to the descramble initial value SCRID while being controlled by the system controller 13. The descramble circuit 23 writes the descramble-resultant data (the MPEG data) back into the buffer memory 22 on a block-by-block basis (see FIG. 20) under the control by the system controller 13. The EDC circuit 18 is controlled by the system controller 13 to read out the descramble-resultant data from the buffer memory 22. For every logical sector, the EDC circuit 18 decides whether the descramble-resultant data are correct or wrong on the basis of the EDC data therein while being controlled by the system controller 13. When the descramble-resultant data are wrong, the EDC circuit 18 is controlled by the system controller 13 to send a signal indicative of the EDC error to the system controller 13. In the case where the descramble-resultant data are correct, the EDC circuit 18 is controlled by the system controller 13 to pass the descramble-resultant data (the MPEG data) to an MPEG decoder 19 on a block-by-block basis (see FIG. 20). The MPEG decoder 19 is contained in a signal processor 1.

Fourth Embodiment

Figure 21:
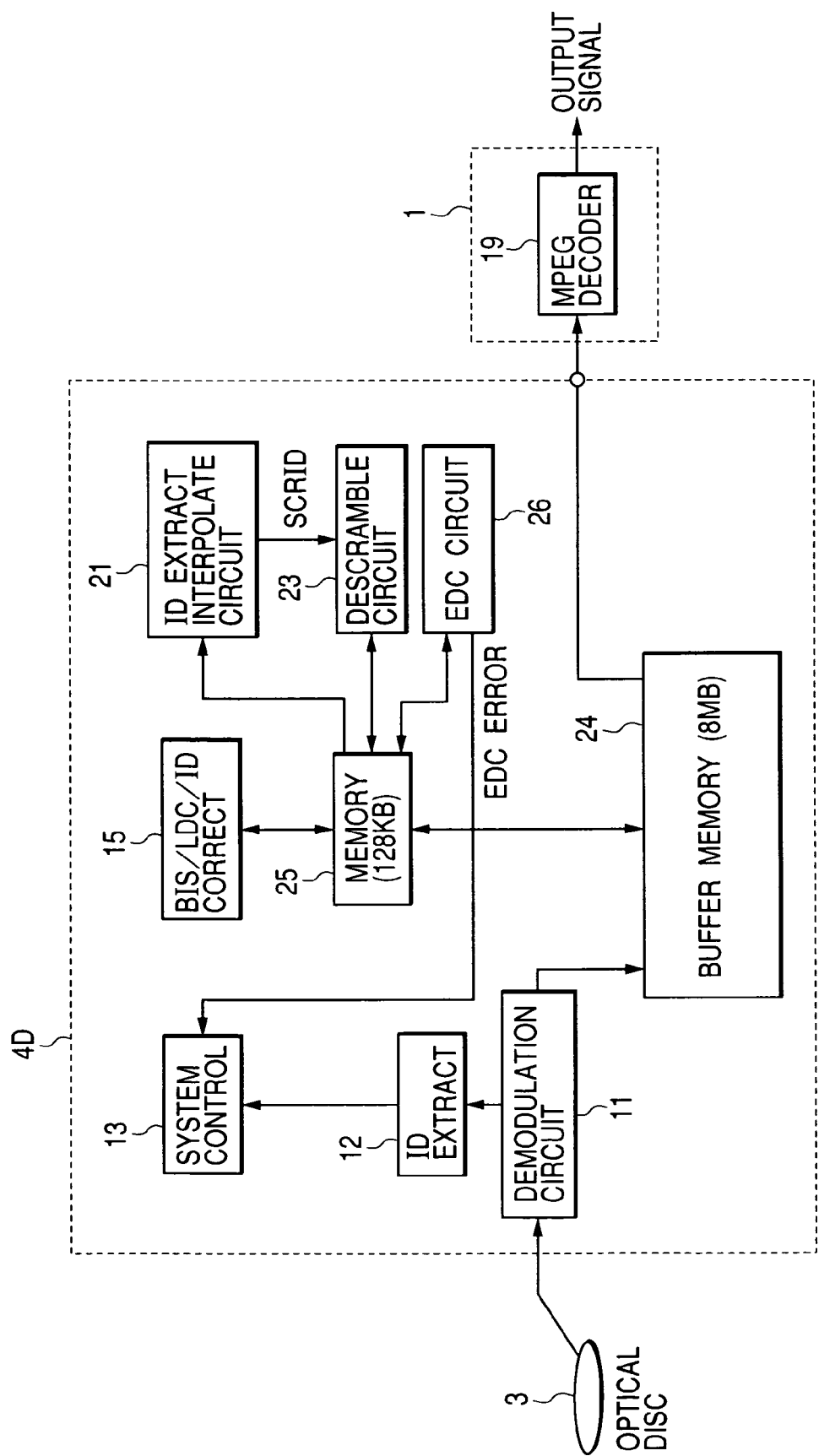
FIG. 21 is a block diagram of a portion of an information recording and reproducing apparatus according to a fourth embodiment of this invention.

FIG. 21 shows a portion of an information recording and reproducing apparatus according to a fourth embodiment of this invention. The apparatus in the fourth embodiment of this invention is similar to the apparatus in the third embodiment thereof (see FIG. 19) except for design changes mentioned hereafter. The apparatus in the fourth embodiment of this invention includes a demodulation/descramble processor 4D instead of the demodulation/descramble processor 4B in FIG. 19.

As shown in FIG. 21, the demodulation/descramble processor 4D includes a work-purpose memory 25 in addition to a buffer memory 24. The work-purpose memory 25 is connected with the buffer memory 24. The work-purpose memory 25 has a capacity corresponding to the amount of data composing one ECC block. The capacity of the work-purpose memory 25 is equal to, for example, 128 kilobytes. On the other hand, the buffer memory 24 has a capacity corresponding to the amount of data composing a plurality of ECC blocks, for example, 64 ECC blocks. The capacity of the buffer memory 24 is equal to, for example, 8 megabytes. The demodulation/descramble processor 4D includes an EDC circuit 26 instead of the EDC circuit 18 in FIG. 19. The work-purpose memory 25 is directly used by a BIS/LDC/ID corrector 15, an ID extraction/interpolation circuit 21, a descramble circuit 23, and the EDC circuit 26.

Modulation-resultant data are outputted from a modulation circuit 11 on a block-by-block basis as shown in FIG. 21, and are then written into the buffer memory 24. Normally, the amount of modulation-resultant data in the buffer memory 24 corresponds to a plurality of ECC blocks. Modulation-resultant data corresponding to one ECC block are transferred from the buffer memory 24 to the work-purpose memory 25 while the memories 24 and 25 are controlled by a system controller 13.

Under the control by the system controller 13, the BIS/LDC/ID corrector 15 reads out the modulation-resultant data from the work-purpose memory 25 and corrects them to get correction-resultant data. The BIS/LDC/ID corrector 15 outputs the correction-resultant data on a block-by-block basis as shown in FIG. 21, and writes them back into the work-purpose memory 25 while being controlled by the system controller 13.

The ID extraction/interpolation circuit 21 is controlled by the system controller 13 to read out 16 physical address information pieces ID0, ID1, ID2, . . . , and ID15 and related third error correction code data (related third parity data) in the correction-resultant data from the buffer memory 22 for every ECC block before the descramble circuit 23 executes the descramble of the present ECC block. The ID extraction/interpolation circuit 21 generates a descramble initial value SCRID in the previously-mentioned way. The ID extraction/interpolation circuit 21 outputs the descramble initial value SCRID to the descramble circuit 23.

The descramble circuit 23 is controlled by the system controller 13 to read out the correction-resultant data from the work-purpose memory 25 for every logical sector. The descramble circuit 23 descrambles the read-out data into MPEG data in response to the descramble initial value SCRID while being controlled by the system controller 13. The descramble circuit 23 writes the descramble-resultant data (the MPEG data) back into the work-purpose memory 25 on a block-by-block basis (see FIG. 22) under the control by the system controller 13.

The EDC circuit 26 is controlled by the system controller 13 to read out the descramble-resultant data from the work-purpose memory 25. For every logical sector, the EDC circuit 26 decides whether the descramble-resultant data are correct or wrong on the basis of the EDC data therein while being controlled by the system controller 13. When the descramble-resultant data are wrong, the EDC circuit 18 is controlled by the system controller 13 to send a signal indicative of the EDC error to the system controller 13.

Figure 22:
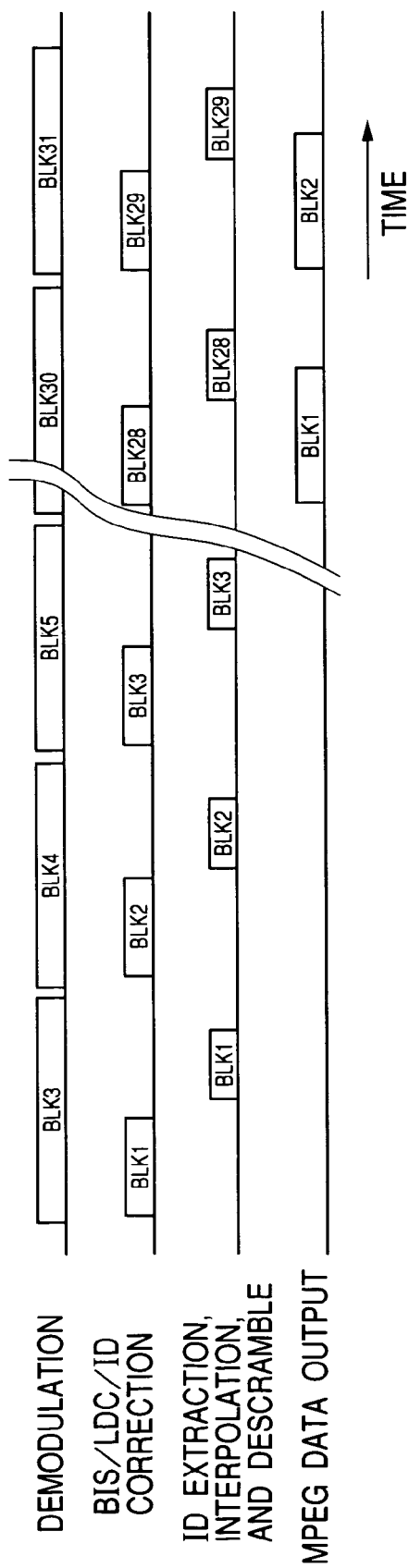
FIG. 22 is a time-domain diagram of signals in a demodulation/descramble processor in FIG. 21.

The descramble-resultant data (the MPEG data) are transferred from the work-purpose memory 25 to the buffer memory 24 while the memories 24 and 25 are controlled by the system controller 13. Normally, the amount of descramble-resultant data in the buffer memory 24 corresponds to a plurality of ECC blocks. The descramble-resultant data (the MPEG data) are transmitted from the buffer memory 24 to an MPEG decoder 19 on a block-by-block basis (see FIG. 22) while the buffer memory 24 is controlled by the system controller 13. The MPEG decoder 19 is contained in a signal processor 1. As shown in FIG. 22, the data transmitted from the buffer memory 24 to the MPEG decoder 19 delay from the data transmitted from the descramble circuit 23 to the work-purpose memory 25 by a predetermined time interval.

When an EDC error signal is sent from the EDC circuit 26, the system controller 13 controls a head device (not shown) to access again a track portion on a recording medium 3 in which the desired ECC block is recorded. Thus, the head device retries to read out a modulation-resultant signal, which corresponds to the desired ECC block, from the recording medium 3.

Fifth Embodiment

A fifth embodiment of this invention is similar to one of the first, second, third, and fourth embodiments thereof except for design changes mentioned hereafter. The fifth embodiment of this invention is designed to handle data of a format using an error correction product code, for example, a Reed-Solomon product code in FIGS. 1 and 2.

Provided that at least one of 16 physical address information pieces ID0, ID1, ID2, . . . , and ID15 in every reproduced ECC block is correct, descramble is accurately executed. Thus, correct user data and EDC data are prevented from undergoing wrong descramble.

Sixth Embodiment

Figure 23:
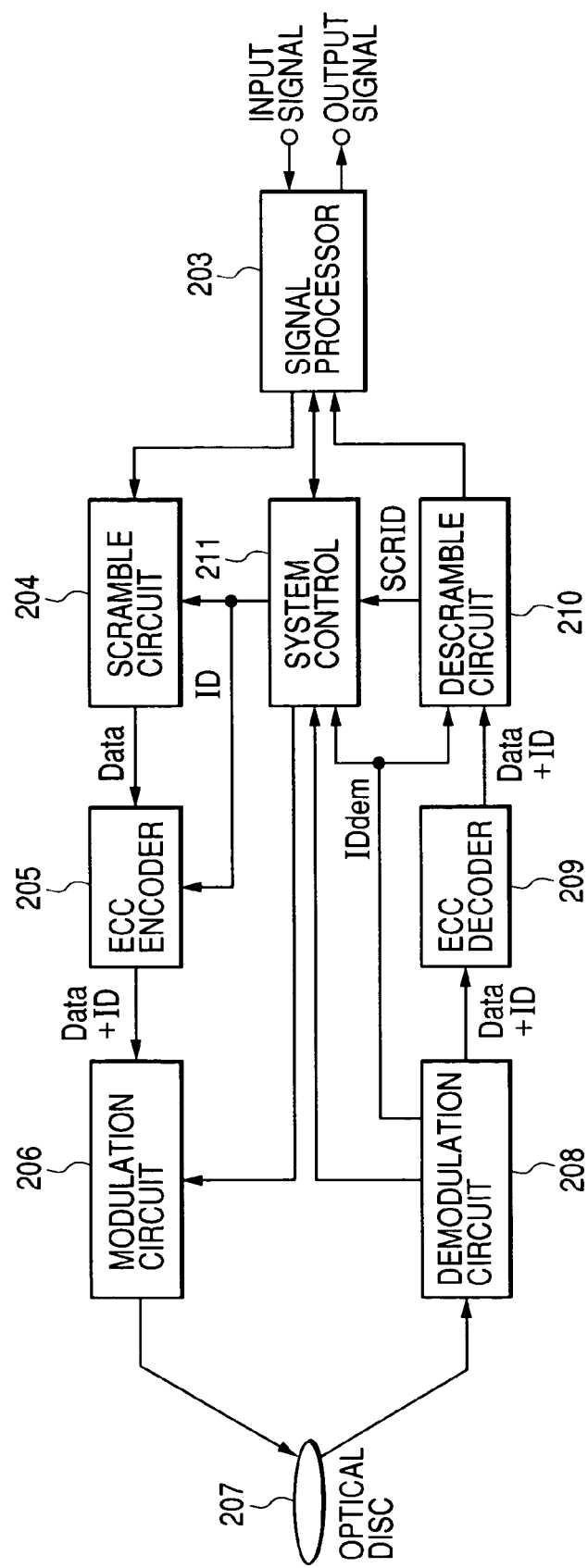
FIG. 23 is a block diagram of an information recording and reproducing apparatus according to a sixth embodiment of this invention.

FIG. 23 shows an information recording and reproducing apparatus according to a sixth embodiment of this invention. The apparatus of FIG. 23 includes a signal processor 203, a scramble circuit 204, an ECC encoder 205, a modulation circuit 206, a demodulation circuit 208, an ECC decoder 209, a descramble circuit 210, and a system controller 211.

The signal processor 203 includes an MPEG (Moving Picture Experts Group) encoder and an MPEG decoder. The system controller 211 includes a computer having a combination of an input/output port, a CPU, a ROM, and a RAM. The system controller 211 operates in accordance with a control program stored in the ROM or the RAM. The control program is designed to enable the system controller 211 to execute operation steps mentioned hereafter.

During a recording mode of operation of the apparatus, the signal processor 203 receives an input signal representative of, for example, audio visual information. The signal processor 203 encodes the input signal into an MPEG signal forming user data. Preferably, the signal processor 203 includes a signal adder. The signal adder in the signal processor 203 generates error detection code (EDC) data in response to the user data, and adds the EDC data to the user data for every logical sector. The signal processor 203 outputs the user data and the EDC data to the scramble circuit 204. The system controller 211 generates physical address information in response to, for example, address-related information fed from the signal processor 203. The system controller 211 feeds the physical address information to the scramble circuit 204 and the ECC encoder 205. The scramble circuit 204 scrambles the user data and the EDC data in response to the physical address information. The scramble circuit 204 outputs the scramble-resultant data to the ECC encoder 205.

Figure 24:
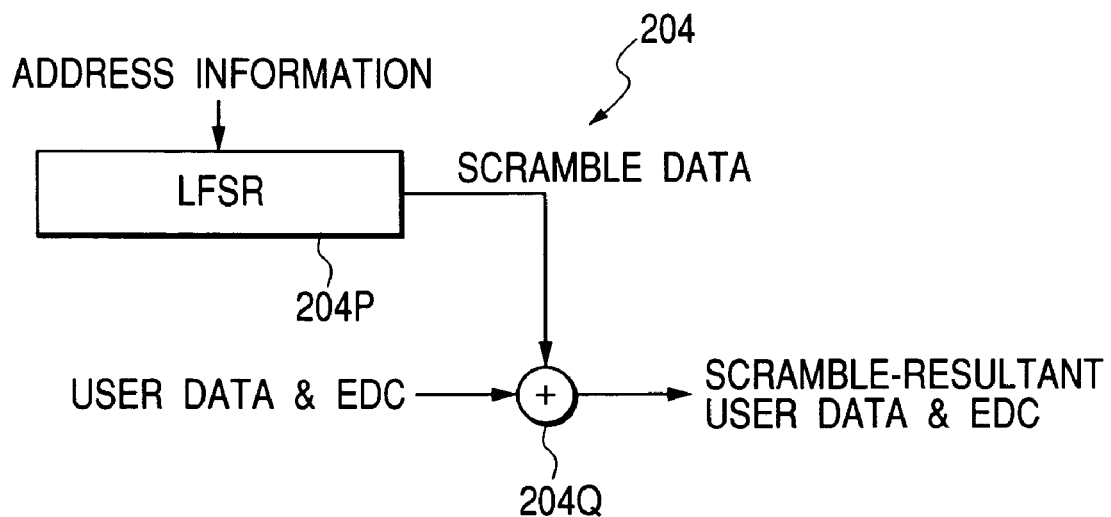
FIG. 24 is a block diagram of a scramble circuit in FIG. 23.

As shown in FIG. 24, the scramble circuit 204 has a linear feedback shift register (an LFSR) 204P and an adder 204Q. The LFSR 204P generates scramble data in response to a 1-sector-corresponding piece of the physical address information fed from the system controller 211. Specifically, the 1-sector-corresponding piece of the physical address information or a part of the 1-sector-corresponding piece of the physical address information is set as an initial value of the LFSR 204P. Preferably, a part of the physical address information piece which is higher in position than another part indicative of a sector order number is set as an initial value of the LFSR 204P. For example, the 3 higher bytes and the 3 higher bits in the subsequent byte of the physical address information piece are set as an initial value of the LFSR 204P. The LFSR 204P outputs the scramble data to the adder 204Q. The adder 204Q receives the user data and the EDC data from the signal processor 203. The adder 204Q executes modulo-2 addition between the scramble data and the user data/EDC data, and thereby scrambles the user data and the EDC data. The adder 204Q outputs the scramble-resultant user data and EDC data to the ECC encoder 205.

The ECC encoder 205 generates error correction code data (parity data) in response to the scramble-resultant data and the physical address information. The error correction code data include, for example, first error correction code data (LDC data), second error correction code data (BIS data), and third error correction code data (AF data). The ECC encoder 205 adds the error correction code data to the scramble-resultant data and the physical address information to generate ECC-block data (data in an ECC block). The ECC encoder 205 successively outputs ECC blocks to the modulation circuit 206. In other words, the ECC encoder 205 outputs the ECC-block data to the modulation circuit 206. Under the control by the system controller 211, the modulation circuit 206 subjects the ECC-block data to modulation for record to get a modulation-resultant signal. The modulation circuit 206 feeds the modulation-resultant signal to a head device (not shown). The head device records the modulation-resultant signal on a recording medium 207 such as an optical disc.

During a playback mode of operation of the apparatus, the head device reproduces a modulation-resultant signal from the recording medium 207. The head device feeds the reproduced signal to the demodulation circuit 208. The demodulation circuit 208 subjects the reproduced signal to demodulation to get demodulation-resultant data, that is, ECC-block data. The demodulation circuit 208 outputs the ECC-block data to the ECC decoder 209. The ECC decoder 209 corrects errors in the ECC-block data in response to parity data contained therein. The ECC decoder 209 outputs the error-corrected data to the descramble circuit 210. The descramble circuit 210 descrambles the error-corrected data to recover user data and EDC data. Preferably, the descramble circuit 210 includes an EDC circuit which decides whether the recovered user data are correct or wrong in response to the EDC data. When it is decided that the recovered user data are correct, the descramble circuit 210 outputs the user data (the MPEG signal) to the signal processor 203. The signal processor 203 decodes the MPEG signal into an original signal (a recovered signal). The signal processor 203 outputs the recovered signal. The recovered signal represents, for example, original audio visual information.

The demodulation circuit 208 extracts ID data inclusive of physical address information from the demodulation-resultant data. Normally, the demodulation circuit 208 feeds the physical address information in the extracted ID data to the descramble circuit 210 and the system controller 211 as finally-decided physical address information IDdem. The signal processor 203 designates every logical address to be reproduced. The signal processor 203 notifies the system controller 211 of the designated logical address. The system controller 211 decides a desired physical address corresponding to the desired logical address. The system controller 211 controls the head device in response to the desired physical address and the finally-decided physical address information IDdem so that the head device will access a track portion of the recording medium 207 which corresponds to the desired physical address.

Generally, the ECC encoder 205 generates error correction code data or error detection code data in response to the physical address information, and adds the generated error correction code data or the generated error detection code data to the physical address information to get ID data. An example of the error correction code data or the error detection code data is AF data (third error correction code data). The demodulation circuit 208 subjects the physical address information in the extracted ID data to error correction in response to the related error correction code data to get correction-resultant physical address information. The demodulation circuit 208 feeds the correction-resultant physical address information to the descramble circuit 210 and the system controller 211 as finally-decided physical address information IDdem. The demodulation circuit 208 decides whether or not errors in the extracted physical address information have failed to be corrected. The demodulation circuit 208 may detect errors in the extracted physical address information in response to the related error detection code data. In the event that errors in the physical address information within the extracted ID data have failed to be corrected or are detected, the demodulation circuit 208 implements interpolation based on an address continuity to estimate correct physical address information for the physical address information within the extracted ID data. Generally, an address continuity occurs during the scanning of the recording medium 207 along a recording track. For example, the correct physical address information for the current ECC block is estimated by adding a 1-ECC-block increment to the physical address information in the immediately-preceding ECC block. The demodulation circuit 208 feeds the estimated correct physical address information (the interpolation-resultant physical address information) to the descramble circuit 210 and the system controller 211 as finally-decided physical address information IDdem.

Figure 25:
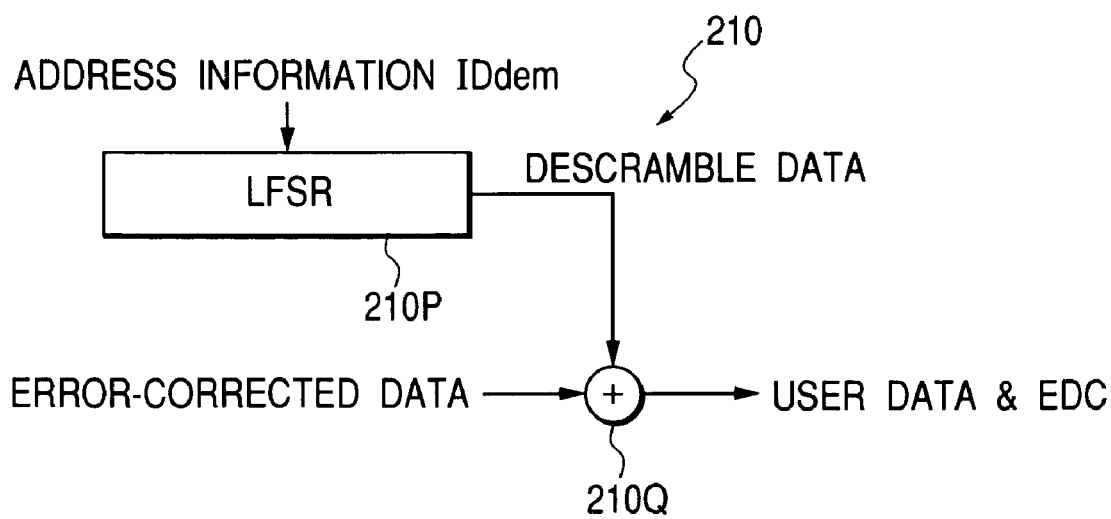
FIG. 25 is a block diagram of a descramble circuit in FIG. 23.

As shown in FIG. 25, the descramble circuit 210 has a linear feedback shift register (an LFSR) 210P and an adder 210Q. The LFSR 210P generates descramble data in response to the physical address information IDdem fed from the demodulation circuit 208. Specifically, a 1-sector-corresponding piece of the physical address information IDdem or a part of the 1-sector-corresponding piece of the physical address information IDdem is set as an initial value of the LFSR 210P. Preferably, a part of the physical address information piece which is higher in position than another part indicative of a sector order number is set as an initial value of the LFSR 210P. For example, the 3 higher bytes and the 3 higher bits in the subsequent byte of the physical address information piece are set as an initial value of the LFSR 210P. The LFSR 210P outputs the descramble data to the adder 210Q. The adder 210Q receives the error-corrected data from the ECC decoder 209. The adder 210Q executes modulo-2 addition between the descramble data and the error-corrected data, and thereby descrambles the error-corrected data into user data and EDC data.

The descramble circuit 210 may extract physical address information from the error-corrected data fed from the ECC decoder 209. In this case, the descramble circuit 210 decides whether the extracted physical address information is correct or erroneous in response to the related error correction code data or the related error detection code data. When the extracted physical address information is correct, the descramble circuit 210 uses the extracted physical address information or a portion thereof as an initial value of the LFSR 210P. On the other hand, when the extracted physical address information is erroneous, the descramble circuit 210 uses at least a portion of the physical address information IDdem fed from the demodulation circuit 208 as an initial value of the LFSR 210P.

The physical address information IDdem fed from the demodulation circuit 208 is formed by the interpolation-resultant physical address information in the event that errors in the extracted physical address information have failed to be corrected. Therefore, the descramble by the descramble circuit 210 is accurate even in the case where errors in the extracted physical address information have failed to be corrected.

Seventh Embodiment

Figure 26:
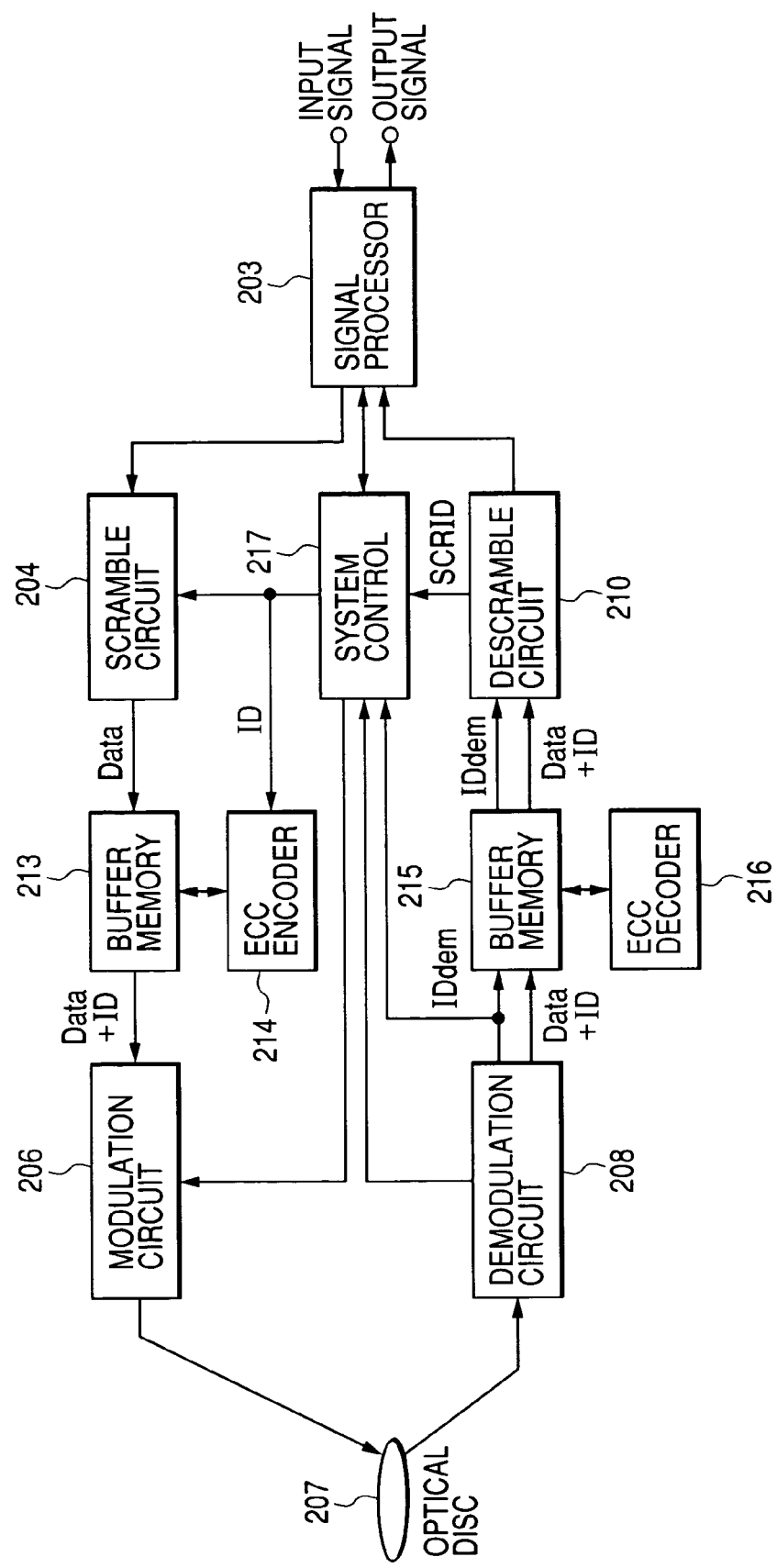
FIG. 26 is a block diagram of an information recording and reproducing apparatus according to a seventh embodiment of this invention.

FIG. 26 shows an information recording and reproducing apparatus according to a seventh embodiment of this invention. The apparatus of FIG. 26 is similar to the apparatus of FIG. 23 except for design changes mentioned hereafter.

The apparatus of FIG. 26 includes an ECC encoder 214, an ECC decoder 216, and a system controller 217 instead of the ECC encoder 205, the ECC decoder 209, and the system controller 211 respectively. The apparatus of FIG. 26 includes buffer memories 213 and 215. The buffer memory 213 is connected among a scramble circuit 204, a modulation circuit 206, and the ECC encoder 214. The buffer memory 215 is connected among a demodulation circuit 208, a descramble circuit 210, and the ECC decoder 216.

Data can be transferred from the scramble circuit 204 to the buffer memory 213. Data can be transferred from the buffer memory 213 to the modulation circuit 206. Data can be transferred between the buffer memory 213 and the ECC encoder 214. The data transfer from the scramble circuit 204 to the buffer memory 213, the data transfer from the buffer memory 213 to the modulation circuit 206, and the data transfer between the buffer memory 213 and the ECC encoder 214 are controlled by the system controller 217.

Data can be transferred from the demodulation circuit 208 to the buffer memory 215. Data can be transferred from the buffer memory 215 to the descramble circuit 210. Data can be transferred between the buffer memory 215 and the ECC decoder 216. The data transfer from the demodulation circuit 208 to the buffer memory 215, the data transfer from the buffer memory 215 to the descramble circuit 210, and the data transfer between the buffer memory 215 and the ECC decoder 216 are controlled by the system controller 217.

The buffer memory 213 absorbs the difference between the data transfer rate at an MPEG encoder in a signal processor 203 and the data transfer rate of a signal recorded on a recording medium 207. The buffer memory 215 absorbs the difference between the data transfer rate at an MPEG decoder in the signal processor 203 and the data transfer rate of a signal reproduced from the recording medium 207. The buffer memory 215 functions to provide a time sufficient for a head device to retry to access a same portion of the recording medium 207 in the event that an error is detected in response to EDC data. The buffer memories 213 and 215 enable successive segments of user data to be dispersedly recorded on the recording medium 207 and to be sequentially reproduced in a correct order.

During a recording mode of operation of the apparatus, the scramble circuit 204 stores scramble-resultant data into the buffer memory 213. The ECC encoder 214 receives physical address information from the system controller 217. The ECC encoder 214 reads out the scramble-resultant data from the buffer memory 213. The ECC encoder 214 generates error correction code data (parity data) in response to the scramble-resultant data and the physical address information. The error correction code data include, for example, first error correction code data (LDC data), second error correction code data (BIS data), and third error correction code data (AF data). The ECC encoder 214 adds the error correction code data to the scramble-resultant data and the physical address information to generate ECC-block data. The ECC encoder 214 writes the ECC-block data back into the buffer memory 213. The buffer memory 213 has such a capacity as to store the amount of data which corresponds to a plurality of ECC blocks. The ECC-block data are transferred from the buffer memory 213 to the modulation circuit 206. Under the control by the system controller 217, the modulation circuit 206 subjects the ECC-block data to modulation for record to get a modulation-resultant signal.

During a playback mode of operation of the apparatus, the demodulation circuit 208 stores ECC-block data (demodulation-resultant data) and finally-decided address information IDdem into the buffer memory 215. The buffer memory 215 has such a capacity as to store the amount of data which corresponds to a plurality of ECC blocks. Also, the demodulation circuit 208 feeds the finally-decided physical address information IDdem to the system controller 217. The ECC decoder 216 reads out the ECC-block data from the buffer memory 215. The ECC decoder 216 corrects errors in the ECC-block data in response to parity data contained therein. The ECC decoder 216 writes the error-corrected data back into the buffer memory 215. The error-corrected data and the finally-decided physical address information IDdem are transferred from the buffer memory 215 to the descramble circuit 210. The descramble circuit 210 descrambles the error-corrected data to recover user data and EDC data. Specifically, the descramble circuit 210 decides whether actual physical address information in the error-corrected data is correct or erroneous in response to related error correction code data or related error detection code data. When the actual physical address information is correct, the descramble circuit 210 uses the actual physical address information or a portion thereof as a descramble initial value. On the other hand, when the actual physical address information is erroneous, the descramble circuit 210 uses the finally-decided physical address information IDdem or a portion thereof as a descramble initial value.

The physical address information IDdem fed from the demodulation circuit 208 is formed by the interpolation-resultant physical address information in the event that errors in the extracted physical address information have failed to be corrected. Therefore, the descramble by the descramble circuit 210 is accurate even in the case where errors in the extracted physical address information have failed to be corrected.

Preferably, the demodulation circuit 208 writes a set of ECC-block data (demodulation-resultant data) and finally-decided address information IDdem into a common page of the buffer memory 215. In this case, sets of demodulation-resultant data and finally-decided address information IDdem for a plurality of ECC blocks are located at different pages of the buffer memory 215 respectively. Accordingly, the correspondence relation between demodulation-resultant data and finally-decided address information IDdem and also the timing relation therebetween are properly maintained without being disordered.

Eighth Embodiment

Figure 27:
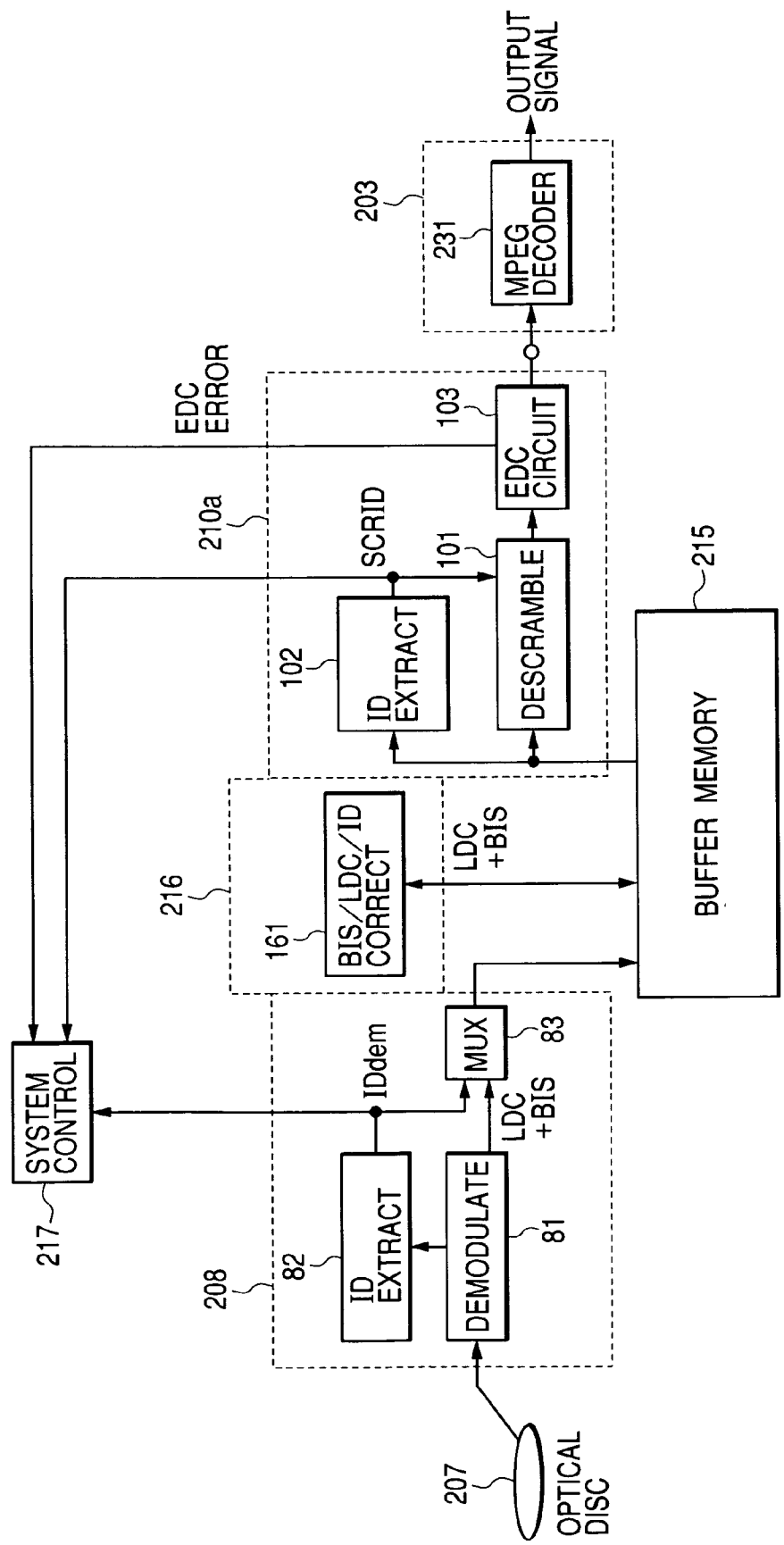
FIG. 27 is a block diagram of a portion of an information recording and reproducing apparatus according to an eighth embodiment of this invention.

FIG. 27 shows a portion of an information recording and reproducing apparatus according to an eighth embodiment of this invention. The apparatus in the eighth embodiment of this invention is similar to the apparatus of FIG. 26 except for design changes mentioned hereafter. As shown in FIG. 27, the apparatus in the eighth embodiment of this invention includes a demodulation circuit 208, a buffer memory 215, an ECC decoder 216, a system controller 217, a descramble circuit 210a, and a signal processor 203. The descramble circuit 210a replaces the descramble circuit 210 in FIG. 26.

The demodulation circuit 208 includes a modulator 81, an ID extractor 82, and a multiplexer 83. The ECC decoder 216 includes a BIS/LDC/ID corrector 161. The descramble circuit 210a includes a descrambler 101, an ID extractor 102, and an EDC circuit 103. The signal processor 203 includes an MPEG decoder 231.

The apparatus in the eighth embodiment of this invention periodically generates an ECC block of data which is of a format similar to that shown in FIGS. 3, 4, 5, and 6. The ECC-block data contain user data, EDC data, physical address information, and error correction code data. The error correction code data include first error correction code data (LDC data), second error correction code data (BIS data), and third error correction code data (AF data). The apparatus in the eighth embodiment of this invention subjects the ECC-block data to modulation and thereby gets a modulation-resultant signal before recording the modulation-resultant signal on a recording medium 207 on a block-by-block basis where "block" means "ECC block".

During a playback mode of operation of the apparatus in FIG. 27, a head device (not shown) is controlled by the system controller 217 to reproduce a modulation-resultant signal from the recording medium 207. The head device feeds the reproduced signal to the demodulator 81 in the demodulation circuit 208. The demodulator 81 subjects the reproduced signal to demodulation to get demodulation-resultant data while being controlled by the system controller 217. The demodulator 81 outputs the demodulation-resultant data to the ID extractor 82 and the multiplexer 83. The device 82 extracts ID data inclusive of physical address information from the demodulation-resultant data while being controlled by the system controller 217. In the absence of errors from the physical address information in the extracted ID data, the ID extractor 82 feeds the physical address information to the system controller 217 and the multiplexer 83 as finally-decided physical address information IDdem.

Each ECC block contains 16 physical address information pieces ID0, ID1, ID2, . . . , and ID15, and 16 related 4-byte parity data pieces which form 16 Reed-Solomon code arrangements "RS(9, 5, 5)", that is, 16 third error correction code words "RS(9, 5, 5)" composing ID data.

The ID extractor 82 is controlled by the system controller 217 to correct errors in the extracted ID data in response to parity data contained therein. Normally, the ID extractor 82 feeds the physical address information in the correction-resultant ID data to the system controller 217 and the multiplexer 83 as finally-decided physical address information IDdem. Under the control by the system controller 217, the ID extractor 82 decides whether or not errors in the physical address information in the extracted ID data have failed to be corrected. When errors in the physical address information have failed to be corrected, the ID extractor 82 is controlled by the system controller 217 to implement interpolation based on an address continuity to estimate correct physical address information for the extracted ID data. Generally, an address continuity occurs during the scanning of the recording medium 207 along a recording track. For example, the correct physical address information for the current ECC block is estimated by adding a 1-ECC-block increment to the physical address information in the immediately-preceding ECC block. Under the control by the system controller 217, the ID extractor 82 feeds the estimated correct physical address information to the system controller 217 and the multiplexer 83 as finally-decided physical address information IDdem.

The MPEG decoder 231 in the signal processor 203 designates every logical address to be reproduced. The MPEG decoder 231 notifies the system controller 217 of the designated logical address. The system controller 217 decides a desired physical address corresponding to the desired logical address. The system controller 217 controls the head device in response to the desired physical address and the finally-decided physical address information IDdem so that the head device will access a track portion of the recording medium 207 which corresponds to the desired physical address. In this way, the head device reproduces a portion of the modulation-resultant signal from the recording medium 207 which has a desired ECC block corresponding to the desired physical address.

Figure 28:
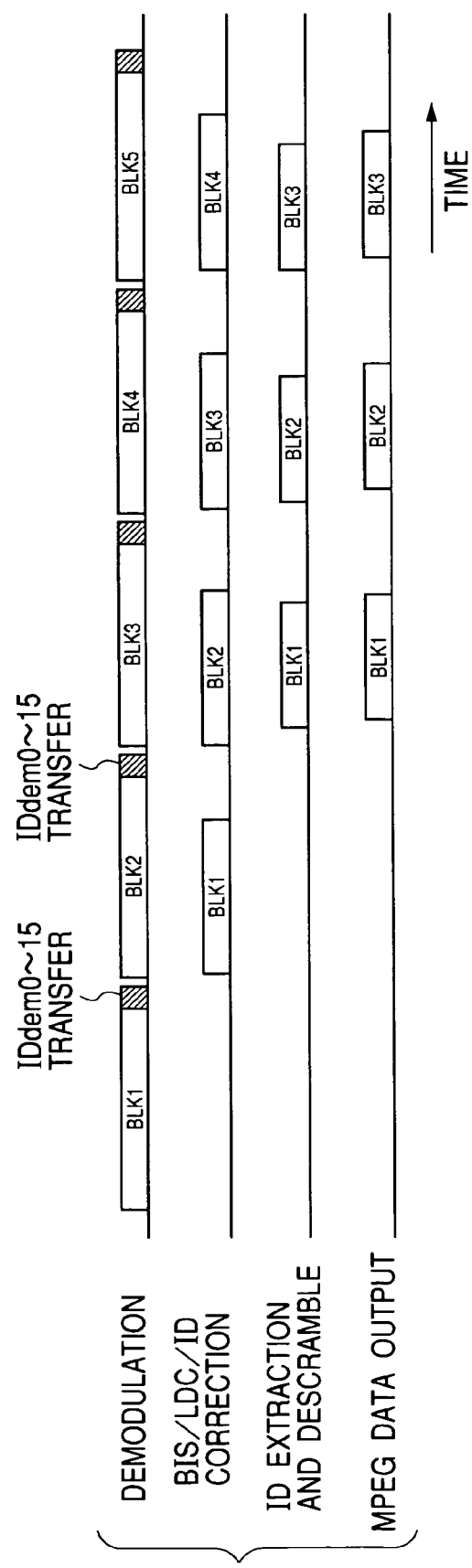
FIG. 28 is a time-domain diagram of signals in the apparatus of FIG. 27.

The multiplexer 83 is controlled by the system controller 217 to multiplex the demodulation-resultant data and the finally-decided physical address information IDdem for every ECC block. Under the control by the system controller 217, the multiplexer 83 writes the multiplexing-resultant data into the buffer memory 215 on a block-by-block basis as shown in FIG. 28 where BLK1, BLK2, BLK3, BLK4, and BLK5 denote successive ECC blocks. Specifically, the multiplexer 83 writes the demodulation-resultant data first, and writes the finally-decided physical address information IDdem second for every ECC block.

Figure 29:
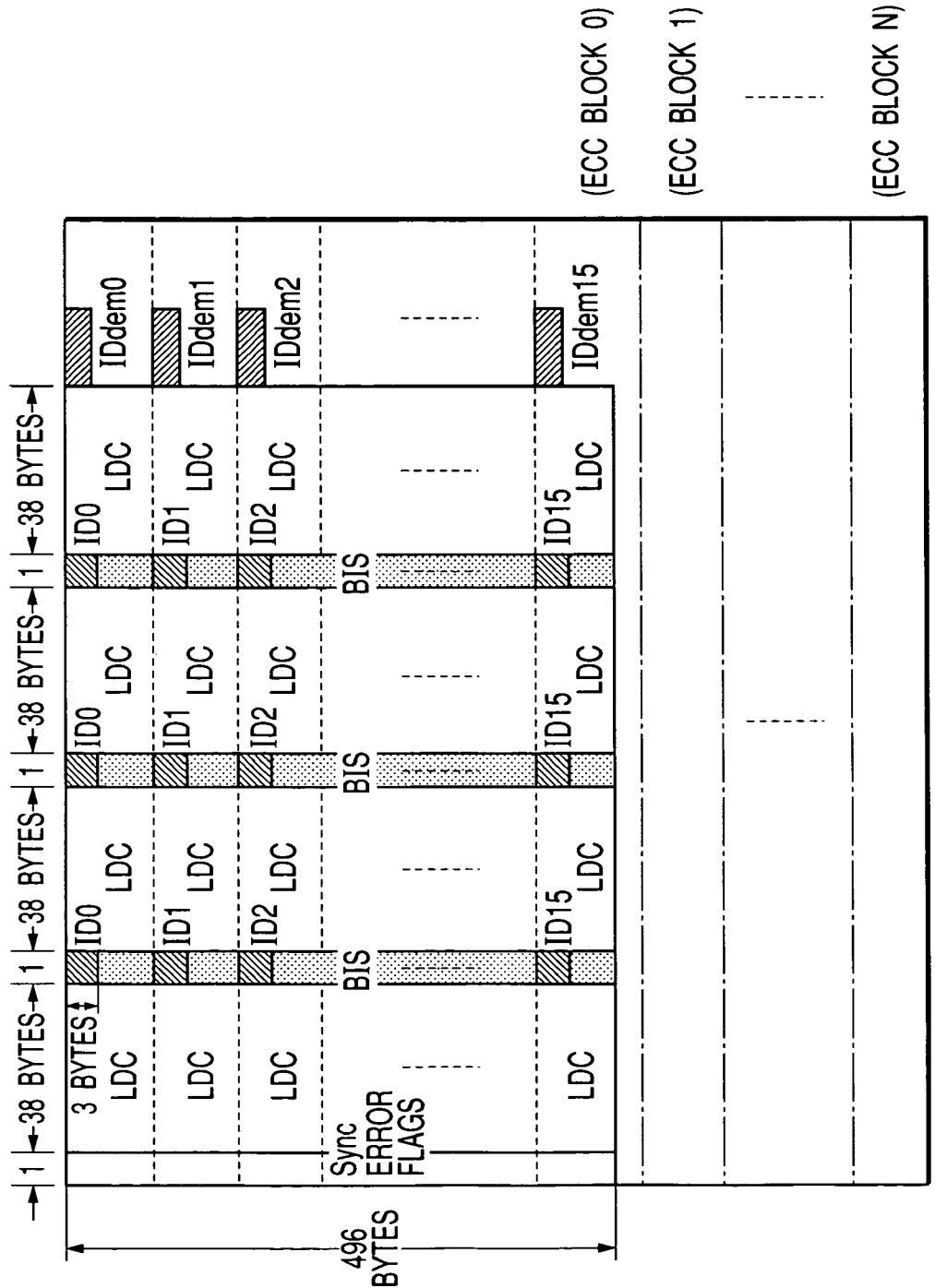
FIG. 29 is a diagram of a memory map in a buffer memory in FIG. 27.

As shown in FIG. 29, demodulation-resultant data and finally-decided physical address information IDdem for a given number N of successive ECC blocks are in the buffer memory 215. Demodulation-resultant data for each ECC block are of a format similar to that in FIG. 3. Finally-decided physical address information IDdem for each ECC block has 16 pieces IDdem0, IDdem1, IDdem2, . . . , and IDdem15 corresponding to 16 physical address information pieces ID0, ID1, ID2, . . . , and ID15 respectively.

Every ECC block is composed of frames having heads occupied by sync patterns or sync signals. The demodulation circuit 208 evaluates the sync pattern at the head of each frame while being controlled by the system controller 217. Specifically, the demodulation circuit 208 decides whether the sync pattern is equal to or different from the original pattern. When the sync pattern is different from the original pattern, the demodulation circuit 208 generates a sync error flag of "1" and writes it into the buffer memory 215 together with a portion of the demodulation-resultant data which corresponds to the present frame (see FIG. 29). When the sync pattern is equal to the original pattern, the demodulation circuit 208 generates a sync error flag of "0" and writes it into the buffer memory 215 together with a portion of the demodulation-resultant data which corresponds to the present frame (see FIG. 29). The sync error flags will be used in generating erasure pointers during LDC correction.

As shown in FIG. 29, regarding each ECC block, 16 physical address information pieces ID0, ID1, ID2, ..., and ID15 in demodulation-resultant data and also 16 finally-decided physical address information pieces IDdem0, IDdem1, IDdem2, ..., and IDdem15 are stored in the buffer memory 215.

The BIS/LDC/ID corrector 161 in the ECC decoder 216 is controlled by the system controller 217 to read out the demodulation-resultant data from the buffer memory 215 on a block-by-block basis. For every ECC block, the BIS/LDC/ID corrector 161 subjects the read-out data to BIS correction, LDC correction, and ID correction while being controlled by the system controller 217. Successive ECC blocks undergo a set of the BIS correction, the LDC correction, and the ID correction during respective terms spaced as shown in FIG. 28. The BIS correction means the correction of errors in BIS-column portions of the read-out data in response to related parity data. The LDC correction means the correction of errors in the read-out data in response to related parity data forming long-distance error correction coding information based on a long-distance code (an LDC). The ID correction means the correction of errors in ID data within the read-out data in response to related parity data.

The BIS/LDC/ID corrector 161 executes the BIS correction first. During the BIS correction, errors in BIS-column portions of the read-out data are corrected in response to related parity data (second parity data or second error correction code data). At the same time, the positions of the errors in the BIS-column portions of the read-out data are detected according to the related parity data. The BIS/LDC/ID corrector 161 generates BIS error flags in response to the detected error positions respectively. The BIS/LDC/ID corrector 161 memorizes the BIS error flags. The BIS error flags are used for generating erasure pointers during the LDC correction.

The LDC correction follows the BIS correction. During the LDC correction, errors in LDC portions of the read-out data are corrected according to related parity data (first parity data or first error correction code data). A data portion in the ECC block which extends between a sync error and a BIS error represented by related flags (a sync error flag and a BIS error flag) is regarded as a burst error, and an erasure pointer is generated in response to the burst error. The burst error is accompanied with the erasure pointer. The burst error with the erasure pointer is subjected to erasure correction according to the related Reed-Solomon code "RS(248, 216, 33)" shown in FIG. 4.

Preferably, the ID correction follows the LDC correction. During the ID correction, errors in the ID data within the read-out data are corrected according to the related Reed-Solomon code arrangements "RS(9, 5, 5)". Specifically, errors in the physical address information within the ID data are corrected in response to the related parity data (the third parity data or the third error correction code data). It should be noted that the ID correction may be omitted.

Under the control by the system controller 217, the BIS/LDC/ID corrector 161 writes the correction-resultant data back into the buffer memory 215 on a block-by-block basis (see FIG. 28). The descrambler 101 in the descramble circuit 210a is controlled by the system controller 217 to read out the correction-resultant data from the buffer memory 215 for every logical sector. Under the control by the system controller 217, the device 101 descrambles the read-out data into MPEG data in response to a descramble initial value SCRID. The descrambler 101 outputs the descramble-resultant data (the MPEG data) to the EDC circuit 103 within the descramble circuit 210a on a block-by-block basis as shown in FIG. 28. For every logical sector, the EDC circuit 103 is controlled by the system controller 217 to decide whether the descramble-resultant data are correct or wrong on the basis of the EDC data therein. When the descramble-resultant data are wrong, the EDC circuit 103 sends a signal indicative of the EDC error to the system controller 217. In the case where the descramble-resultant data are correct, the EDC circuit 103 is controlled by the system controller 217 to pass the descramble-resultant data (the MPEG data) to the MPEG decoder 231 within the signal processor 203 on a block-by-block basis as shown in FIG. 28. The MPEG decoder 231 implements the decoding of the MPEG data.

The ID extractor 102 within the descramble circuit 210a is controlled by the system controller 217 to read out the 16 physical address information pieces ID0, ID1, ID2, ..., and ID15 and the related third error correction code data (the related third parity data) in the correction-resultant data from the buffer memory 215 for every ECC block before the descrambler 101 executes the descramble of the present ECC block. Under the control by the system controller 217, the ID extractor 102 detects errors in the physical address information pieces ID0, ID1, ID2, ..., and ID15 according to the related Reed-Solomon code arrangements "RS(9, 5, 5)" shown in FIG. 6. Thereby, the ID extractor 102 decides whether each of the physical address information pieces ID0, ID1, ID2, ..., and ID15 is correct or erroneous. The ID extractor 102 generates a descramble initial value SCRID for the present ECC block in response to, for example, the 3 higher bytes as well as the 3 higher bits in the subsequent byte of a physical address information piece decided to be correct. The remaining bits in the subsequent byte of the physical address information which indicate a sector order number are excluded from the generation of the descramble initial value SCRID. The ID extractor 102 notifies the descrambler 101 and the system controller 217 of the descramble initial value SCRID while being controlled by the system controller 217.

In the event that all the 16 physical address information pieces ID0, ID1, ID2, ..., and ID15 are decided to be erroneous, the ID extractor 102 is controlled by the system controller 217 to read out one of the 16 finally-decided physical address information pieces IDdem0, IDdem1, IDdem2, ..., and IDdem15 from the buffer memory 215. Under the control by the system controller 217, the ID extractor 102 generates a descramble initial value SCRID for the present ECC block in response to, for example, the 3 higher bytes as well as the 3 higher bits in the subsequent byte of the read-out physical address information piece (IDdem0, IDdem1, IDdem2, ..., or IDdem15). The remaining bits in the subsequent byte of the read-out physical address information which indicate a sector order number are excluded from the generation of the descramble initial value SCRID. The ID extractor 102 notifies the descrambler 101 and the system controller 217 of the descramble initial value SCRID while being controlled by the system controller 217.

In the event that all the 16 physical address information pieces ID0, ID1, ID2, . . . , and ID15 are decided to be erroneous, the ID extractor 102 may be controlled by the system controller 217 to operate as follows. The ID extractor 102 reads out the 16 finally-decided physical address information pieces IDdem0, IDdem1, IDdem2, . . . , and IDdem15 from the buffer memory 215. The ID extractor 102 generates a basic initial value in response to the 3 higher bytes as well as the 3 higher bits in the subsequent byte of each of the read-out physical address information pieces IDdem0, IDdem1, IDdem2, . . . , and IDdem15. The ID extractor 102 separates the 16 basic initial values into groups each having equal-value members. The extractor 102 finds one among the groups which has the greatest number of members. The ID extractor 102 uses a basic initial value in the found group as a descramble initial value SCRID. The ID extractor 102 notifies the descrambler 101 and the system controller 217 of the descramble initial value SCRID.

Figure 30:
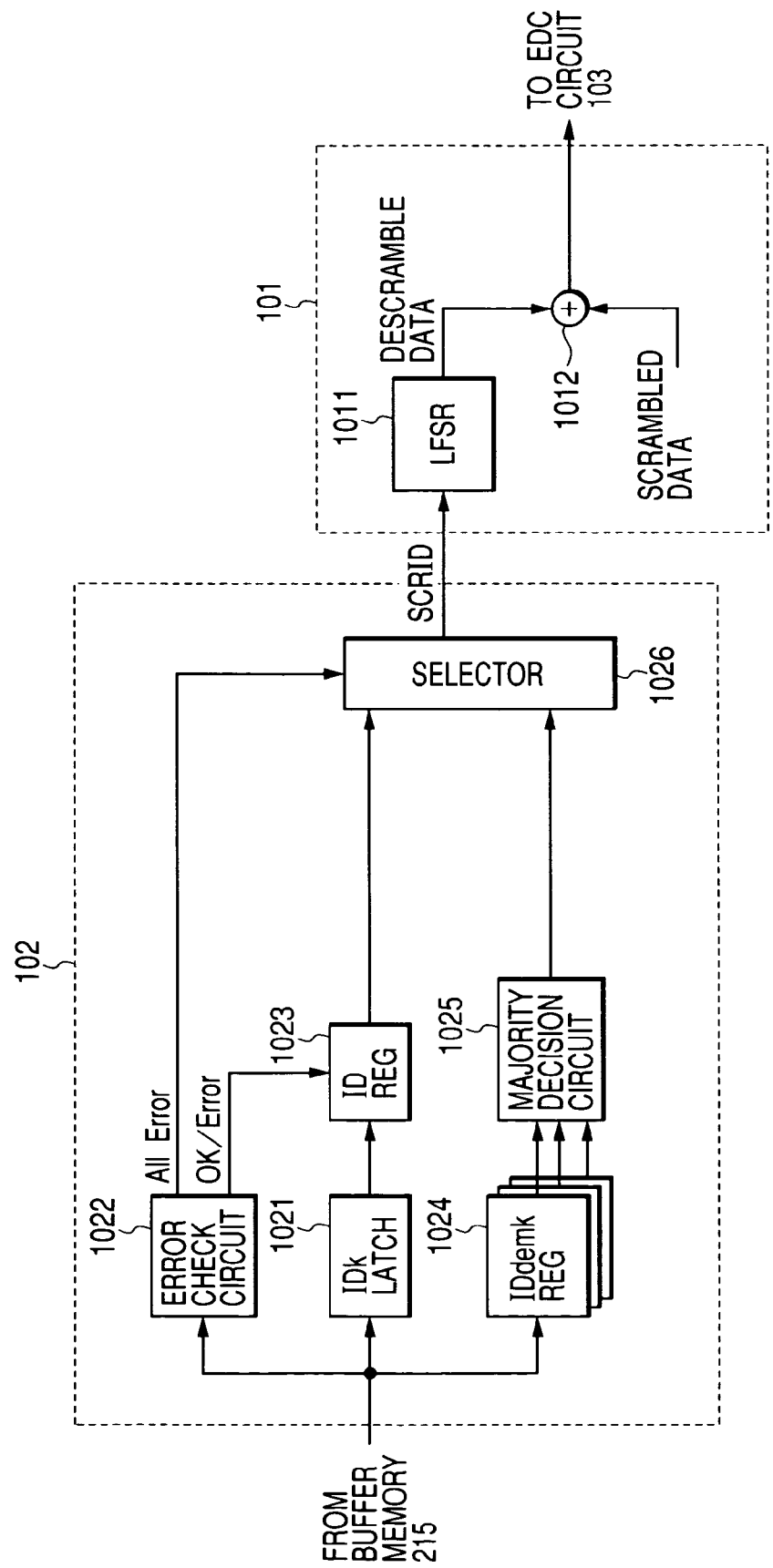
FIG. 30 is a block diagram of a descrambler and an ID extractor in FIG. 27.

As shown in FIG. 30, the descrambler 101 includes a linear feedback shift register (an LFSR) 1011 and an adder 1012. The ID extractor 102 includes a latch 1021, an error check circuit 1022, a registers 1023 and 1024, a majority decision circuit 1025, and a selector 1026.

The 16 physical address information pieces ID0, ID1, ID2, . . . , and ID15 read out from the buffer memory 215 are successively latched by the device 1021 before being outputted to the register 1023. Also, the 16 physical address information pieces ID0, ID1, ID2, . . . , and ID15 are successively fed to the error check circuit 1022. At the same time, the third error correction code data (the third parity data) related to the 16 physical address information pieces ID0, ID1, ID2, . . . , and ID15 and read out from the buffer memory 215 are fed to the error check circuit 1022. The 16 physical address information pieces ID0, ID1, ID2, . . . , and ID15 and the related third error correction code data compose the Reed-Solomon code words "RS(9, 5, 5)", that is, the error correction code arrangements "RS(9, 5, 5)". The error check circuit 1022 decides whether each of the physical address information pieces ID0, ID1, ID2, . . . , and ID15 is correct or erroneous in response to a related part of the third error correction code data. For each of the physical address information pieces ID0, ID1, ID2, . . . , and ID15, the error check circuit 1022 outputs a signal OK/Error indicative of the result of the decision to the register 1023. When the decision result signal OK/Error indicates that the related physical address information piece is correct, the register 1023 stores the present physical address information piece outputted from the latch 1021. When the decision result signal OK/Error indicates that the related physical address information piece is erroneous, the register 1023 refuses to store the present physical address information piece outputted from the latch 1021. In the case where all the 16 physical address information pieces ID0, ID1, ID2, . . . , and ID15 are erroneous, the error check circuit 1022 generates an all-error signal and outputs it to the selector 1026.

In the case where at least one of the 16 physical address information pieces ID0, ID1, ID2, . . . , and ID15 is correct, that is, in the absence of the all-error signal outputted from the error check circuit 1022, the selector 1026 reads out the correct physical address information piece from the register 1023 and passes the 3 higher bytes and the 3 higher bits in the subsequent byte of the correct physical address information piece to the LFSR 1011 while blocking the remaining bits in the subsequent byte which indicate a sector order number. The LFSR 1011 uses the 3 higher bytes and the 3 higher bits in the subsequent byte of the correct physical address information piece as a descramble initial value SCRID for the present ECC block.

The 16 finally-decided physical address information pieces IDdem0, IDdem1, IDdem2, . . . , and IDdem15 read out from the buffer memory 215 are stored into the register 1024 before being further transferred to the majority decision circuit 1025. The majority decision circuit 1025 generates a basic initial value in response to the 3 higher bytes as well as the 3 higher bits in the subsequent byte of each of the finally-decided physical address information pieces IDdem0, IDdem1, IDdem2, . . . , and IDdem15. The majority decision circuit 1025 separates the 16 basic initial values into groups each having equal-value members. The majority decision circuit 1025 finds one among the groups which has the greatest number of members. The majority decision circuit 1025 selects one among the 16 finally-decided physical address information pieces IDdem0, IDdem1, IDdem2, . . . , and IDdem15 which corresponds to the found group. The majority decision circuit 1025 outputs the selected finally-decided physical address information to the selector 1026.

In the case where all the 16 physical address information pieces ID0, ID1, ID2, . . . , and ID15 are erroneous, that is, in the presence of the all-error signal outputted from the error check circuit 1022, the selector 1026 accepts the selected finally-decided physical address information piece outputted from the majority decision circuit 1025 and passes the 3 higher bytes and the 3 higher bits in the subsequent byte of the selected finally-decided physical address information piece to the LFSR 1011 while blocking the remaining bits in the subsequent byte which indicate a sector order number. The LFSR 1011 uses the 3 higher bytes and the 3 higher bits in the subsequent byte of the selected finally-decided physical address information piece as a descramble initial value SCRID for the present ECC block.

The LFSR 1011 generates descramble data in response to the descramble initial value SCRID. The LFSR 1011 outputs the descramble data to the adder 1012. The adder 1012 receives the correction-resultant data (the scramble-resultant user data and EDC data) from the buffer memory 215. The adder 1012 executes modulo-2 addition between the descramble data and the correction-resultant data, and thereby descrambles the correction-resultant data to recover the original user data and EDC data. The adder 1012 outputs the descramble-resultant data, that is, the recovered user data and EDC data, to the EDC circuit 103.

The system controller 217 includes a combination of an input/output port, a CPU, a ROM, and a RAM. The system controller 217 operates in accordance with a control program stored in the ROM or the RAM.

Figure 31:
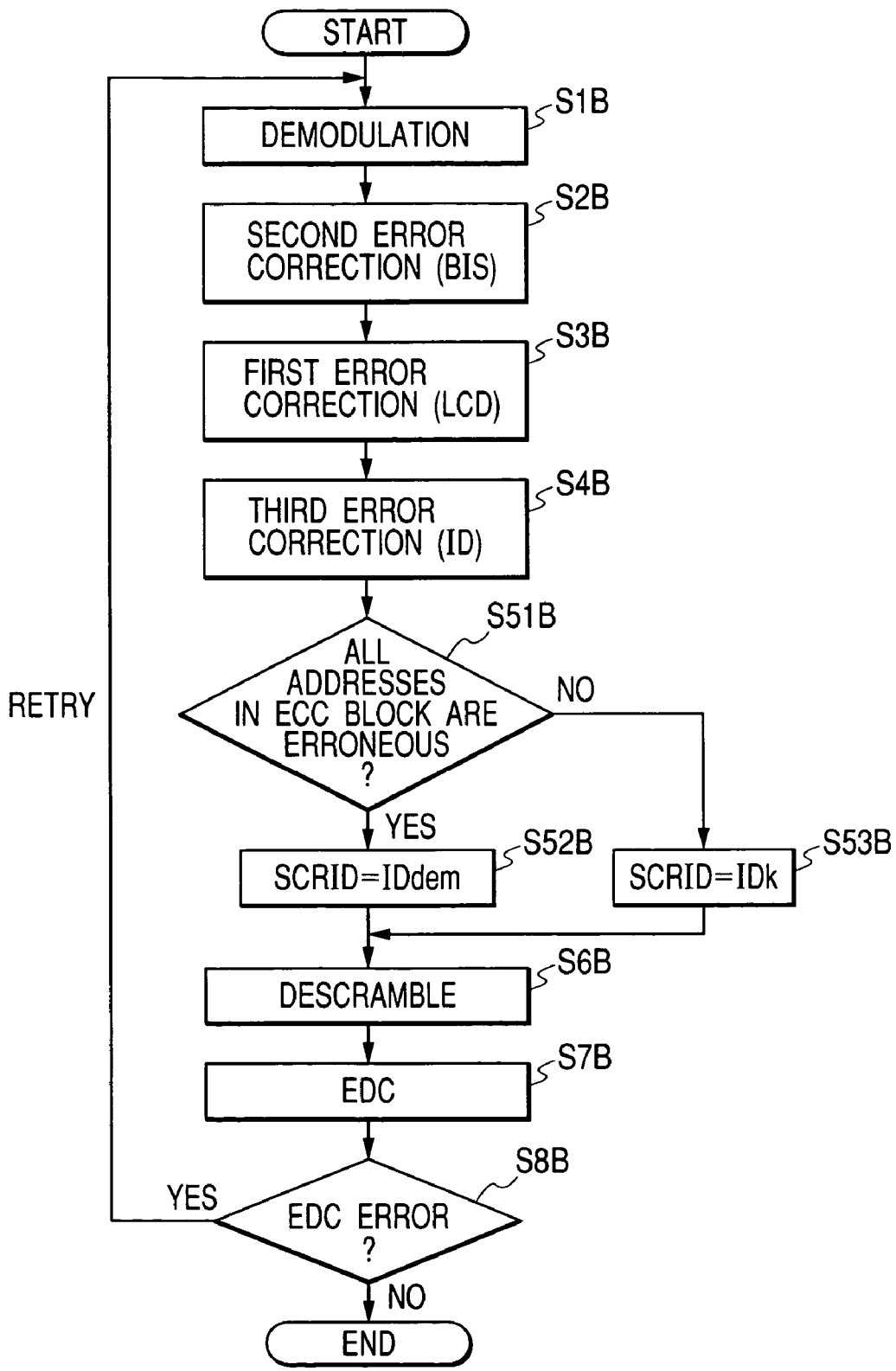
FIG. 31 is a flowchart of a playback-related segment of a control program for a system controller in FIG. 27.

FIG. 31 is a flowchart of a segment of the control program which relates to the playback mode of operation of the apparatus. The program segment in FIG. 31 is executed for every desired ECC block.

With reference to FIG. 31, a first step S1B of the program segment controls the head device to read out a modulation-resultant signal, which corresponds to a desired ECC block, from the recording medium 207. The read-out signal is sent from the head device to the demodulation circuit 208. The step S1B controls the demodulation circuit 208 to subject the read-out signal to demodulation to get demodulation-resultant data. The step 1B controls the demodulation circuit 208 to generate finally-decided physical information pieces IDdem0, IDdem1, IDdem2, . . . , and IDdem15 on the basis of the demodulation-resultant data. The step S1B controls the demodulation circuit 208 to write the demodulation-resultant data and the finally-decided physical information pieces IDdem0, IDdem1, IDdem2, . . . , and IDdem15 into the buffer memory 215.

A step S2B following the step S1B controls the BIS/LDC/ID corrector 161 to read out the demodulation-resultant data from the buffer memory 215. The step S2B controls the BIS/LDC/ID corrector 161 to execute BIS correction with respect to the demodulation-resultant data.

A step S3B subsequent to the step S2B controls the BIS/LDC/ID corrector 161 to execute LDC correction with respect to the demodulation-resultant data.

A step S4B following the step S3B controls the BIS/LDC/ID corrector 161 to execute ID correction with respect to the demodulation-resultant data. As a result, correction-resultant data are obtained. The step S4B controls the BIS/LDC/ID corrector 161 to write the correction-resultant data back into the buffer memory 215.

A step S51B subsequent to the step S4B controls the ID extractor 102 to access the 16 physical address information pieces ID0, ID1, ID2, . . . , and ID15 and the related third error correction code data (the related third parity data) in the correction-resultant data within the desired ECC block. The step S51B controls the ID extractor 102 to detect errors in the 16 physical address information pieces ID0, ID1, ID2, . . . , and ID15 in response to the related third error correction code data. Thereby, a decision is made as to whether each of the 16 physical address information pieces ID0, ID1, ID2, . . . , and ID15 is correct or erroneous. In other words, a decision is made as to whether or not all the 16 physical address information pieces ID0, ID1, ID2, . . . , and ID15 are erroneous. When all the 16 physical address information pieces ID0, ID1, ID2, . . . , and ID15 are erroneous, the program advances from the step S51B to a step S52B. Otherwise, the program advances from the step S51B to a step S53B.

The step S53B controls the ID extractor 102 to find a correct physical address information piece IDk among the 16 physical address information pieces ID0, ID1, ID2, . . . , and ID15 by referring the results of the decision by the step S51B. The step S53B controls the ID extractor 102 to set a descramble initial value SCRID to the 3 higher bytes and the 3 higher bits in the subsequent byte of the correct physical address information piece IDk. After the step S53B, the program advances to a step S6B.

The step S52B controls the ID extractor 102 to read out one among the 16 finally-decided physical address information pieces IDdem0, IDdem1, IDdem2, . . . , and IDdem15 from the buffer memory 215 which relates to the desired ECC block. The step S52B controls the ID extractor 102 to set the descramble initial value SCRID to the 3 higher bytes and the 3 higher bits in the subsequent byte of the read-out finally-decided physical address information piece (IDdem0, IDdem1, IDdem2, . . . , or IDdem15). After the step S52B, the program advances to the step S6B.

The step S6B controls the descrambler 101 to read out the correction-resultant data from the buffer memory 215. The step S6B controls the descrambler 101 to descramble the correction-resultant data in response to the descramble initial value SCRID to get descramble-resultant data. The descramble-resultant data are fed to the EDC circuit 103.

A step S7B following the step S6B controls the EDC circuit 103 to decide whether the descramble-resultant data are correct or wrong on the basis of EDC data therein for every logical sector. The step S7B generates a signal indicative of an EDC error when the descramble-resultant data are wrong.

A step S8B subsequent to the step S7B decides whether or not an EDC error signal is generated by the step S7B. When an EDC error signal is generated, the program returns from the step S8B to the step S1B. In this case, the head device retries to read out the modulation-resultant signal, which corresponds to the desired ECC block, from the recording medium 207. On the other hand, when an EDC error signal is not generated, the program exits from the step S8B and then the current execution cycle of the program segment ends. In this case, the program may proceed to a segment for MPEG decoding.

It should be noted that the ID correction may be implemented by the ID extractor 102 rather than the BIS/LDC/ID corrector 161.

Ninth Embodiment

Figure 32:
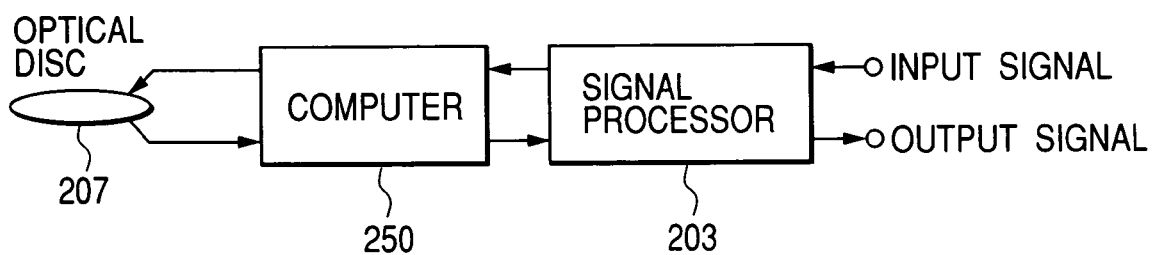
FIG. 32 is a block diagram of an information recording and reproducing apparatus according to a ninth embodiment of this invention.

FIG. 32 shows an information recording and reproducing apparatus according to a ninth embodiment of this invention. The apparatus of FIG. 32 is similar to the apparatus in the eighth embodiment of this invention except for design changes mentioned hereafter.

The apparatus of FIG. 32 includes a computer 250 connected with a signal processor 203. The computer 250 can access a recording medium 207 via a head device (not shown). During a recording mode of operation of the apparatus, the computer 250 receives user data (an MPEG signal) from the signal processor 203. During a playback mode of operation of the apparatus, the computer 250 outputs user data (an MPEG signal) to the signal processor 203.

The computer 250 includes a combination of an input/output port, a CPU, a ROM, and a RAM. The computer 250 operates in accordance with a control program stored in the ROM or the RAM.

Figure 33:
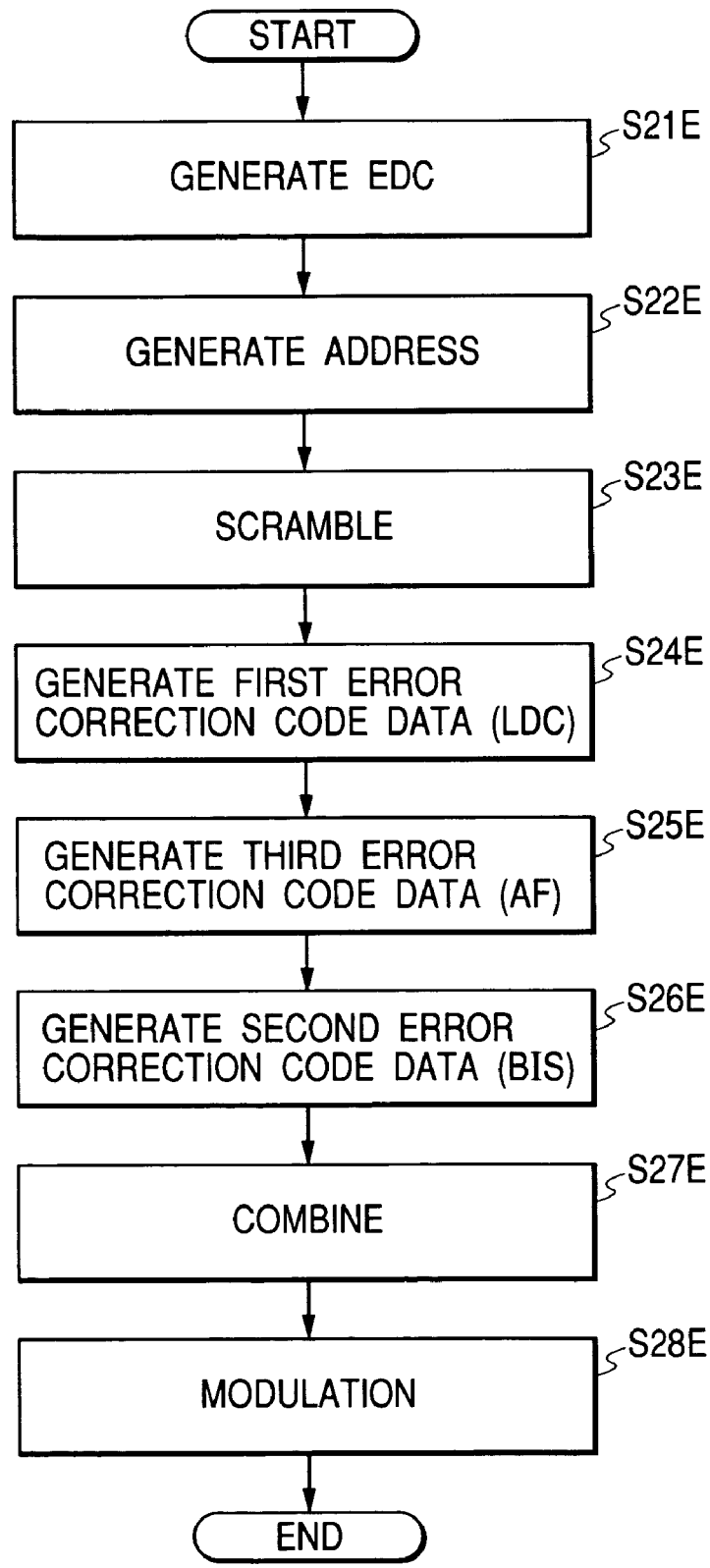
FIG. 33 is a flowchart of a recording-related segment of a control program for a computer in FIG. 32.

FIG. 33 is a flowchart of a segment of the control program for the computer 250 which relates to the recording mode of operation of the apparatus. The program segment in FIG. 33 is executed for every ECC block.

As shown in FIG. 33, a first step S21E of the program segment generates EDC data in response to user data.

A step S22E following the step S21E generates physical address information in response to, for example, address-related information fed from the signal processor 203.

A step S23E subsequent to the step S22E generates a scramble initial value in response to the physical address information. The step S23E scrambles the user data and the EDC data in response to the scramble initial value to generate scramble-resultant data.

A step S24E following the step S23E generates first error correction code data (LDC data) in response to the scramble-resultant data.

A step S25E subsequent to the step S24E generates third error correction code data (AF data) in response to the physical address information.

A step S26E following the step S25E generates second error correction code data (BIS data) in response to the physical address information and the third error correction code data.

A step S27E subsequent to the step S26E combines or multiplexes the scramble-resultant data, the physical address information, the first error correction code data (the LDC data), the second error correction code data (the BIS data), and the third error correction code data (the AF data) into an ECC-block signal.

A step S28E following the step S27E subjects the ECC-block signal to modulation for record on the recording medium 207, and thereby gets a modulation-resultant signal.

The step S28E outputs the modulation-resultant signal to the head device. After the step S28E, the current execution cycle of the program segment ends.

Figure 34:
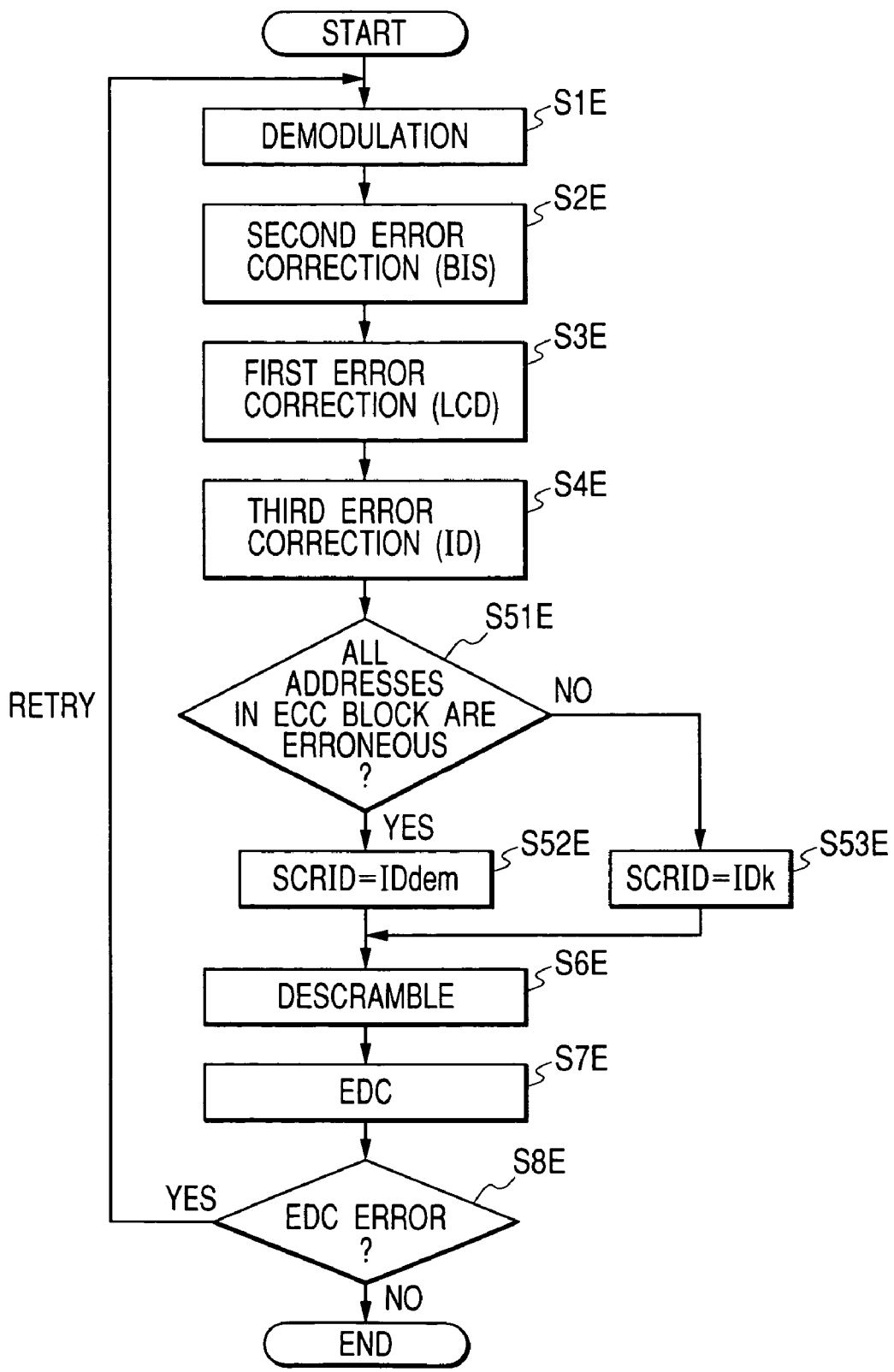
FIG. 34 is a flowchart of a playback-related segment of the control program for the computer in FIG. 32.

FIG. 34 is a flowchart of a segment of the control program for the computer 250 which relates to the playback mode of operation of the apparatus. The program segment in FIG. 34 is executed for every desired ECC block.

With reference to FIG. 34, a first step S1E of the program segment controls the head device to read out a modulation-resultant signal, which corresponds to a desired ECC block, from the recording medium 207. The step S1E receives the read-out signal from the head device. The step S1E subjects the read-out signal to demodulation to get demodulation-resultant data.

The step S1E extracts ID data inclusive of physical address information from the demodulation-resultant data. In the absence of errors from the physical address information in the extracted ID data, the step S1E uses the physical address information as finally-decided physical address information IDdem.

The step S1E corrects errors in the extracted ID data in response to parity data contained therein. Normally, the step S1E uses the physical address information in the correction-resultant ID data as finally-decided physical address information IDdem. The step S1E decides whether or not errors in the physical address information in the extracted ID data have failed to be corrected. When errors in the physical address information have failed to be corrected, the step S1E implements interpolation based on an address continuity to estimate correct physical address information for the extracted ID data. The step S1E uses the estimated correct physical address information as finally-decided physical address information piece IDdem.

The finally-decided physical address information IDdem for the desired ECC block is composed of 16 pieces IDdem0, IDdem1, IDdem2, . . . , and IDdem15 assigned to 16 physical sectors respectively.

A step S2E following the step S1E executes BIS correction with respect to the demodulation-resultant data.

A step S3E subsequent to the step S2E executes LDC correction with respect to the demodulation-resultant data.

A step S4E following the step S3E executes ID correction with respect to the demodulation-resultant data. As a result, correction-resultant data are obtained.

A step S51E subsequent to the step S4E accesses the 16 physical address information pieces ID0, ID1, ID2, . . . , and ID15 and the related third error correction code data (the related third parity data) in the correction-resultant data within the desired ECC block. The step S51E detects errors in the 16 physical address information pieces ID0, ID1, ID2, . . . , and ID15 in response to the related third error correction code data. Thereby, a decision is made as to whether each of the 16 physical address information pieces ID0, ID1, ID2, . . . , and ID15 is correct or erroneous. In other words, a decision is made as to whether or not all the 16 physical address information pieces ID0, ID1, ID2, . . . , and ID15 are erroneous. When all the 16 physical address information pieces ID0, ID1, ID2, . . . , and ID15 are erroneous, the program advances from the step S51E to a step S52E. Otherwise, the program advances from the step S51E to a step S53E.

The step S53E finds a correct physical address information piece IDk among the 16 physical address information pieces ID0, ID1, ID2, . . . , and ID15 by referring the results of the decision by the step S51E. The step S53E sets a descramble initial value SCRID to the 3 higher bytes and the 3 higher bits in the subsequent byte of the correct physical address information piece IDk. After the step S53E, the program advances to a step S6E.

The step S52E selects one among the 16 finally-decided physical address information pieces IDdem0, IDdem1, IDdem2, . . . , and IDdem15 which relates to the desired ECC block. The step S52E sets the descramble initial value SCRID to the 3 higher bytes and the 3 higher bits in the subsequent byte of the selected finally-decided physical address information piece (IDdem0, IDdem1, IDdem2, . . . , or IDdem15). After the step S52E, the program advances to the step S6E. Alternatively, the step S52E may function as follows. The step S52E generates a basic initial value in response to the 3 higher bytes as well as the 3 higher bits in the subsequent byte of each of the finally-decided physical address information pieces IDdem0, IDdem1, IDdem2, . . . , and IDdem15. The step S52E separates the 16 basic initial values into groups each having equal-value members. The step S52E finds one among the groups which has the greatest number of members. The step S52E uses a basic initial value in the found group as a descramble initial value SCRID.

The step S6E descrambles the correction-resultant data in response to the descramble initial value SCRID to get descramble-resultant data.

A step S7E following the step S6E decides whether the descramble-resultant data are correct or wrong on the basis of EDC data therein for every logical sector. The step S7E generates a signal indicative of an EDC error when the descramble-resultant data are wrong.

A step S8E subsequent to the step S7E decides whether or not an EDC error signal is generated by the step S7E. When an EDC error signal is generated, the program returns from the step S8E to the step S1E. In this case, the head device retries to read out the modulation-resultant signal, which corresponds to the desired ECC block, from the recording medium 207. On the other hand, when an EDC error signal is not generated, the program exits from the step S8E and then the current execution cycle of the program segment ends. In this case, the program may proceed to a segment for MPEG decoding.

Tenth Embodiment

Figure 35:
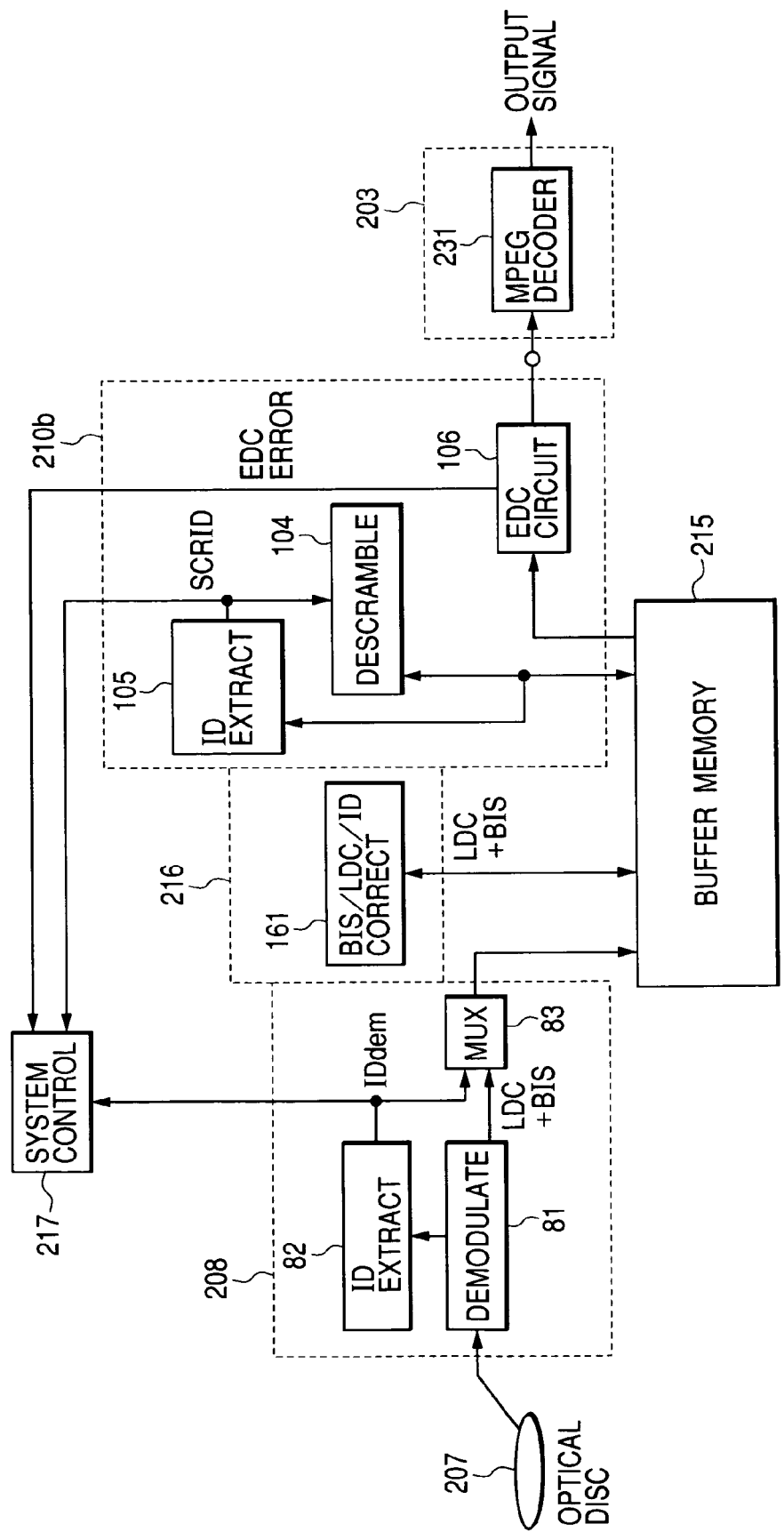
FIG. 35 is a block diagram of a portion of an information recording and reproducing apparatus according to a tenth embodiment of this invention.

FIG. 35 shows a portion of an information recording and reproducing apparatus according to a tenth embodiment of this invention. The apparatus in the tenth embodiment of this invention is similar to the apparatus in the eighth embodiment thereof (see FIG. 27) except for design changes mentioned hereafter. The apparatus in the tenth embodiment of this invention includes a descramble circuit 210b instead of the descramble circuit 210a in FIG. 27.

As shown in FIG. 35, the descramble circuit 210b includes a descrambler 104, an ID extractor 105, and an EDC circuit 106 which correspond to the descrambler 101, the ID extractor 102, and the EDC circuit 103 in FIG. 27 respectively.

Figure 36:
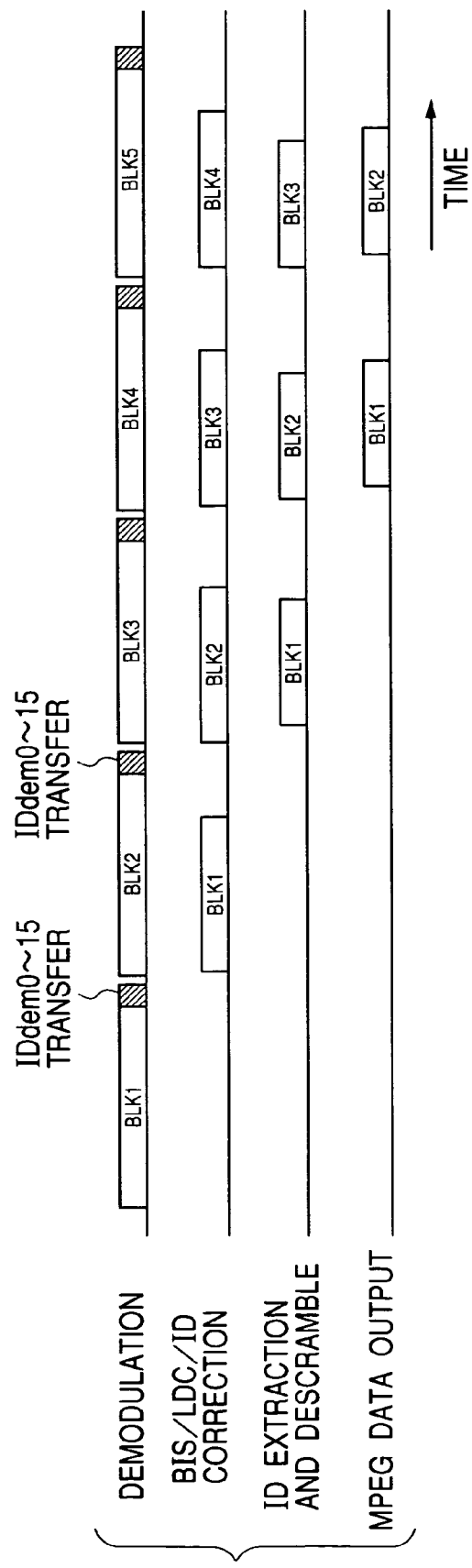
FIG. 36 is a time-domain diagram of signals in the apparatus of FIG. 35.

In the tenth embodiment of this invention, a modulation circuit 208 writes modulation-resultant data and finally-decided physical address information IDdem into a buffer memory 215 on a block-by-block basis as shown in FIG. 36. A BIS/LDC/ID corrector 161 reads out the modulation-resultant data from the buffer memory 215, and successively subjects the read-out data to BIS correction, LDC correction, and ID correction to get correction-resultant data on a block-by-block basis as shown in FIG. 36. The BIS/LDC/ID corrector 161 writes the correction-resultant data back into the buffer memory 215.

The ID extractor 105 operates similarly to the ID extractor 102 in FIG. 27. The ID extractor 105 is controlled by a system controller 217 to read out the 16 physical address information pieces ID0, ID1, ID2, . . . , and ID15 and the related third error correction code data in the correction-resultant data from the buffer memory 215 for every ECC block. In the case where at least one of the 16 physical address information pieces ID0, ID1, ID2, . . . , and ID15 is correct, the ID extractor 105 is controlled by the system controller 217 to generate a descramble initial value SCRID for the present ECC block in response to the correct physical address information piece. In the event that all the 16 physical address information pieces ID0, ID1, ID2, . . . , and ID15 are erroneous, the ID extractor 105 is controlled by the system controller 217 to read out one of the 16 finally-decided physical address information pieces IDdem0, IDdem1, IDdem2, . . . , and IDdem15 from the buffer memory 215. In this case, the ID extractor 105 is controlled by the system controller 217 to generate a descramble initial value SCRID for the present ECC block in response to the read-out physical address information piece (IDdem0, IDdem1, IDdem2, . . . , or IDdem15).

The descrambler 104 operates similarly to the descrambler 101 in FIG. 27. The descrambler 104 reads out the correction-resultant data from the buffer memory 215 for every logical sector while being controlled by the system controller 217. The device 104 descrambles the read-out data into MPEG data in response to the descramble initial value SCRID while being controlled by the system controller 217. The descrambler 104 writes the descramble-resultant data (the MPEG data) back into the buffer memory 215 on a block-by-block basis (see FIG. 36) under the control by the system controller 217.

The EDC circuit 106 operates similarly to the EDC circuit 103 in FIG. 27. The EDC circuit 106 is controlled by the system controller 217 to read out the descramble-resultant data from the buffer memory 215. For every logical sector, the EDC circuit 106 decides whether the descramble-resultant data are correct or wrong on the basis of the EDC data therein while being controlled by the system controller 217. When the descramble-resultant data are wrong, the EDC circuit 106 is controlled by the system controller 217 to send a signal indicative of the EDC error to the system controller 217. In the case where the descramble-resultant data are correct, the EDC circuit 106 is controlled by the system controller 217 to pass the descramble-resultant data (the MPEG data) to an MPEG decoder 231 on a block-by-block basis (see FIG. 36). The MPEG decoder 231 is contained in a signal processor 203.

It should be noted that the ID correction may be implemented by the ID extractor 105 rather than the BIS/LDC/ID corrector 161.

Eleventh Embodiment

Figure 37:
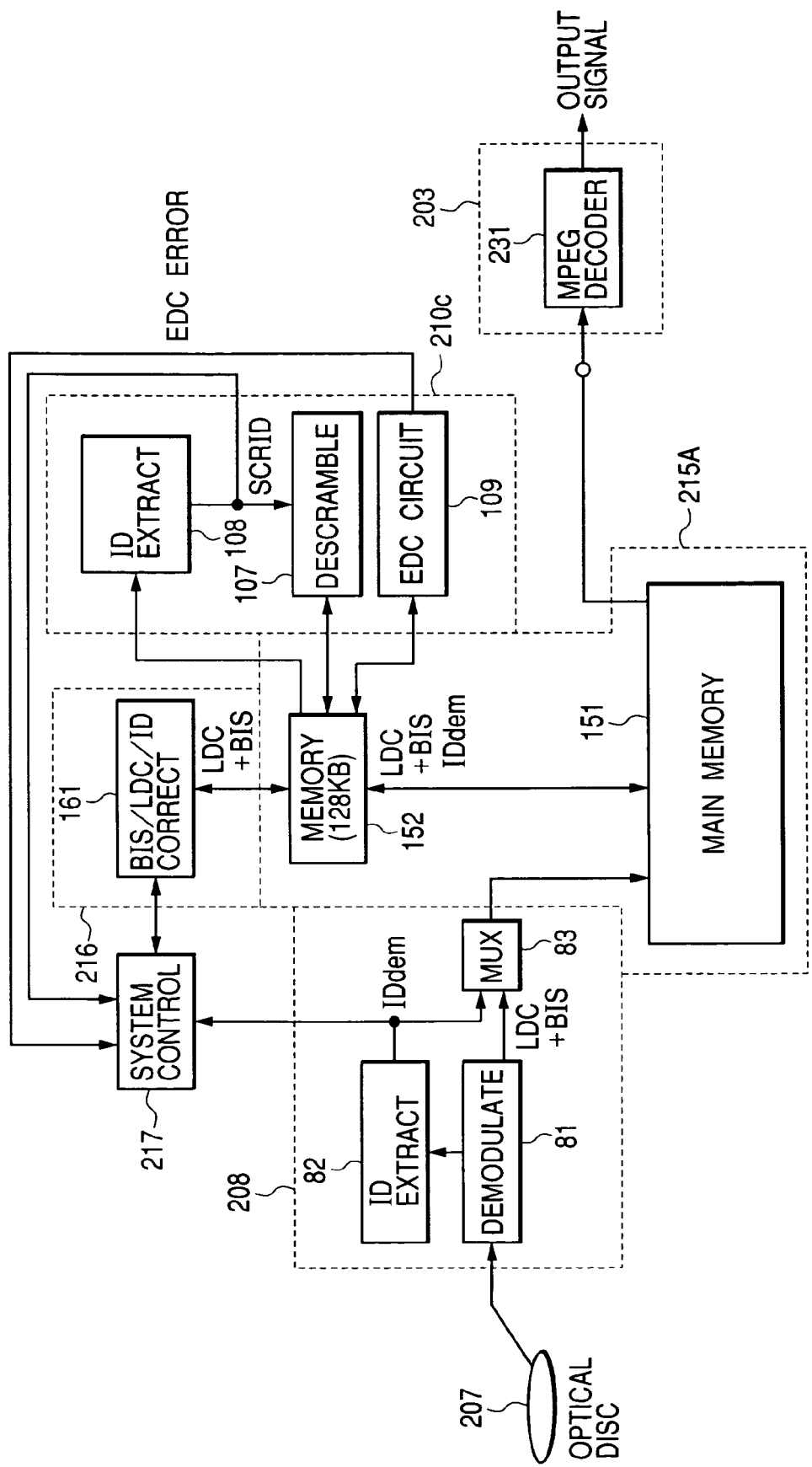
FIG. 37 is a block diagram of a portion of an information recording and reproducing apparatus according to an eleventh embodiment of this invention.

FIG. 37 shows a portion of an information recording and reproducing apparatus according to an eleventh embodiment of this invention. The apparatus in the eleventh embodiment of this invention is similar to the apparatus in the tenth embodiment thereof (see FIG. 35) except for design changes mentioned hereafter. The apparatus in the eleventh embodiment of this invention includes a descramble circuit 210c and a buffer memory 215A instead of the descramble circuit 210b and the buffer memory 215 in FIG. 35 respectively.

As shown in FIG. 37, the descramble circuit 210c includes a descrambler 107, an ID extractor 108, and an EDC circuit 109 which correspond to the descrambler 104, the ID extractor 105, and the EDC circuit 106 in FIG. 35 respectively. The buffer memory 215A includes a main memory 151 and a work-purpose memory 152 connected with each other.

The main memory 151 has a capacity corresponding to the amount of data composing a plurality of ECC blocks, for example, 64 ECC blocks. The capacity of the main memory 151 is equal to, for example, 8 megabytes. On the other hand, the work-purpose memory 152 has a capacity corresponding to the amount of data composing one ECC block. The capacity of the work-purpose memory 152 is equal to, for example, 128 kilobytes.

The main memory 151 is used by a demodulation circuit 208 as the buffer memory 215 in FIG. 35 is used. The work-purpose memory 152 is directly used by a BIS/LDC/ID corrector 161, the descrambler 107, the ID extractor 108, and the EDC circuit 109.

Figure 38:
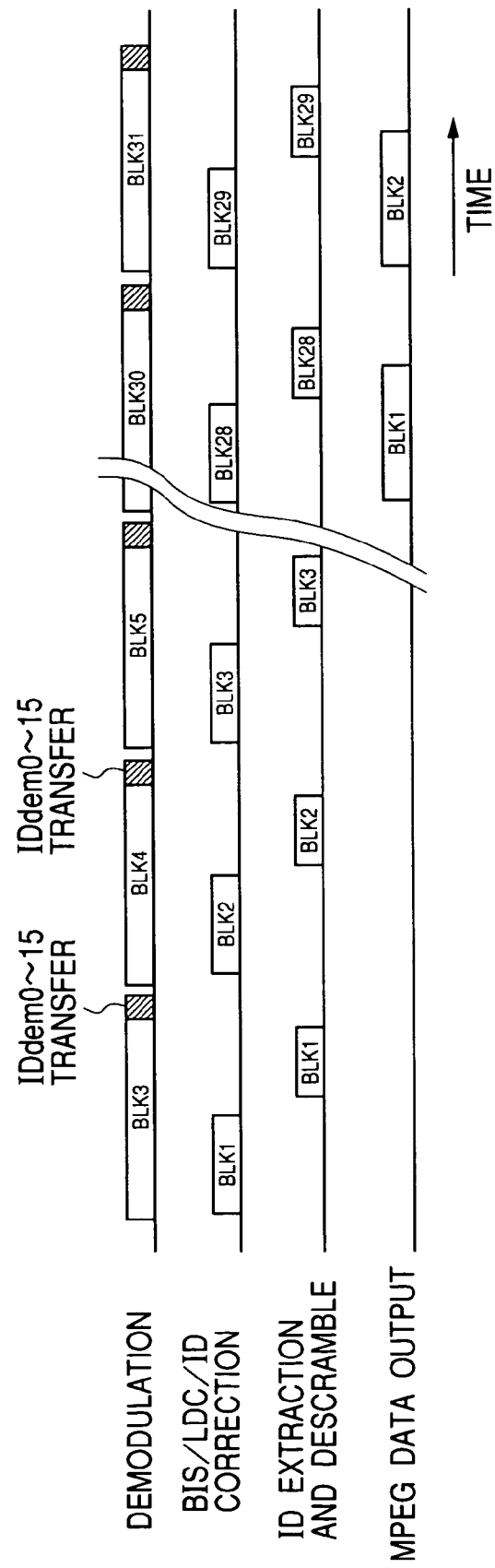
FIG. 38 is a time-domain diagram of signals in the apparatus of FIG. 37.
Figure 39:
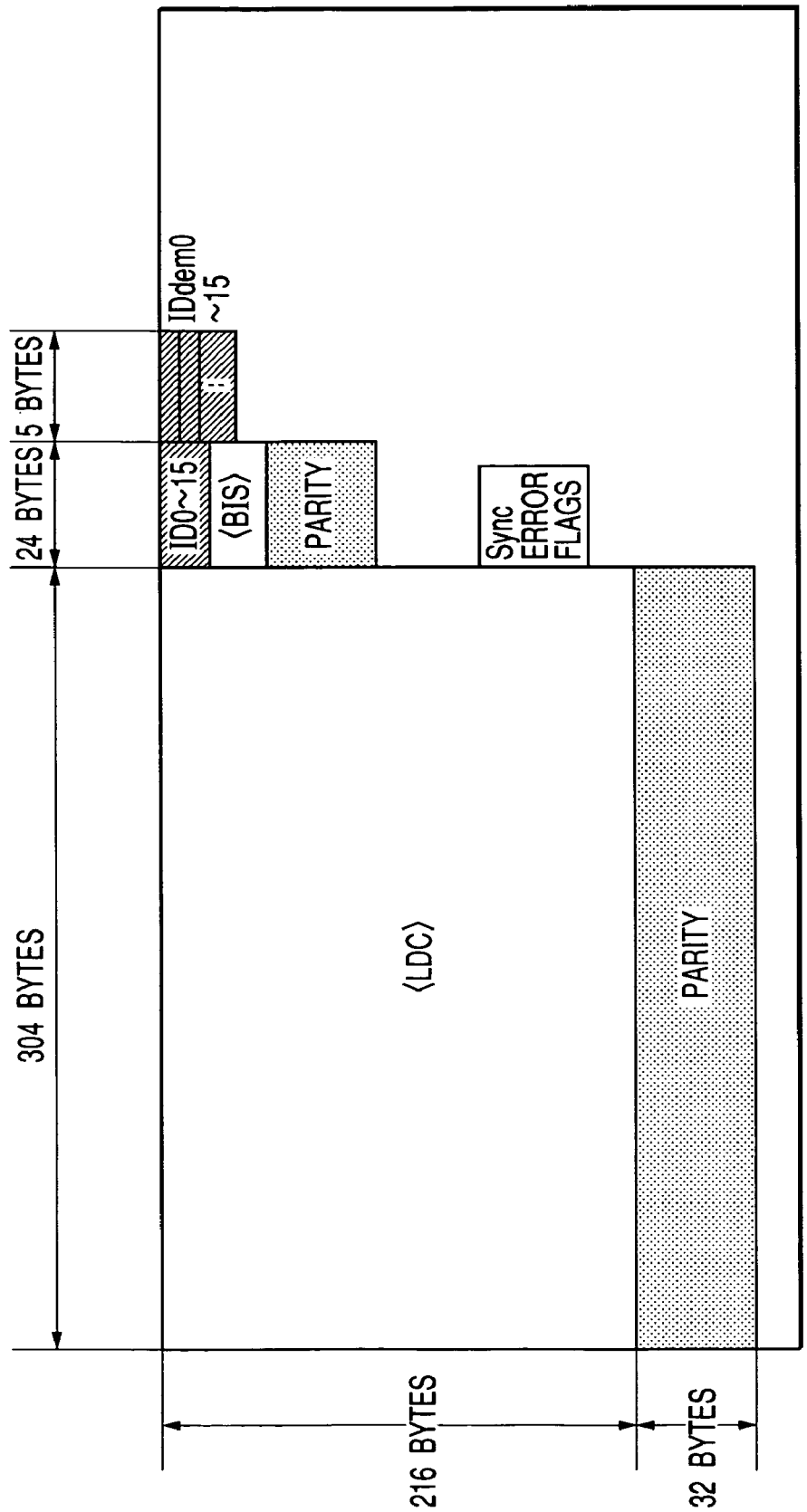
FIG. 39 is a diagram of a memory map in a work-purpose memory in FIG. 38.

Modulation-resultant data and finally-decided physical address information IDdem are outputted from the modulation circuit 208 on a block-by-block basis as shown in FIG. 38, and are then written into the main memory 151. The finally-decided physical address information IDdem relating to one ECC block is composed of 16 pieces IDdem0, IDdem1, IDdem2, . . . , and IDdem15 assigned to physical sectors respectively. Normally, the amount of modulation-resultant data and finally-decided physical address information IDdem in the main memory 151 corresponds to a plurality of ECC blocks. Modulation-resultant data and finally-decided physical address information IDdem corresponding to one ECC block are transferred from the main memory 151 to the work-purpose memory 152 while the memories 151 and 152 are controlled by a system controller 217. The modulation-resultant data and the finally-decided physical address information IDdem in the work-purpose memory 152 are in an arrangement or a layout shown in FIG. 39.

Under the control by the system controller 217, the BIS/LDC/ID corrector 161 reads out the modulation-resultant data from the work-purpose memory 151 and corrects them to get correction-resultant data. The BIS/LDC/ID corrector 161 outputs the correction-resultant data on a block-by-block basis as shown in FIG. 38, and writes them back into the work-purpose memory 152 while being controlled by the system controller 217.

The ID extractor 108 operates similarly to the ID extractor 105 in FIG. 35. The ID extractor 108 is controlled by the system controller 217 to read out the 16 physical address information pieces ID0, ID1, ID2, . . . , and ID15 and the related third error correction code data in the correction-resultant data from the work-purpose memory 152 for every ECC block. In the case where at least one of the 16 physical address information pieces ID0, ID1, ID2, . . . , and ID15 is correct, the ID extractor 108 is controlled by the system controller 217 to generate a descramble initial value SCRID for the present ECC block in response to the correct physical address information piece. In the event that all the 16 physical address information pieces ID0, ID1, ID2, . . . , and ID15 are erroneous, the ID extractor 108 is controlled by the system controller 217 to read out one of the 16 finally-decided physical address information pieces IDdem0, IDdem1, IDdem2, . . . , and IDdem15 from the work-purpose memory 152. In this case, the ID extractor 108 is controlled by the system controller 217 to generate a descramble initial value SCRID for the present ECC block in response to the read-out physical address information piece (IDdem0, IDdem1, IDdem2, . . . , or IDdem15).

The descrambler 107 operates similarly to the descrambler 104 in FIG. 35. The descrambler 107 reads out the correction-resultant data from the work-purpose memory 152 for every logical sector while being controlled by the system controller 217. The device 107 descrambles the read-out data into MPEG data in response to the descramble initial value SCRID while being controlled by the system controller 217. The descrambler 107 writes the descramble-resultant data (the MPEG data) back into the work-purpose memory 152 on a block-by-block basis (see FIG. 38) under the control by the system controller 217.

The EDC circuit 109 operates similarly to the EDC circuit 106 in FIG. 35. The EDC circuit 109 is controlled by the system controller 217 to read out the descramble-resultant data from the work-purpose memory 152. For every logical sector, the EDC circuit 109 decides whether the descramble-resultant data are correct or wrong on the basis of the EDC data therein while being controlled by the system controller 217. When the descramble-resultant data are wrong, the EDC circuit 109 is controlled by the system controller 217 to send a signal indicative of the EDC error to the system controller 217.

The descramble-resultant data (the MPEG data) are transferred from the work-purpose memory 152 to the main memory 151 while the memories 151 and 152 are controlled by the system controller 217. Normally, the amount of descramble-resultant data in the main memory 151 corresponds to a plurality of ECC blocks. The descramble-resultant data (the MPEG data) are transmitted from the main memory 151 to an MPEG decoder 231 on a block-by-block basis (see FIG. 38) while the main memory 151 is controlled by the system controller 217. The MPEG decoder 231 is contained in a signal processor 203. As shown in FIG. 38, the data transmitted from the main memory 151 to the MPEG decoder 19 delay from the data transmitted from the descrambler 107 to the work-purpose memory 152 by a predetermined time interval.

When an EDC error signal is sent from the EDC circuit 109, the system controller 217 controls a head device (not shown) to access again a track portion on a recording medium 207 in which the desired ECC block is recorded. Thus, the head device retries to read out a modulation-resultant signal, which corresponds to the desired ECC block, from the recording medium 207.

It should be noted that the ID correction may be implemented by the ID extractor 108 rather than the BIS/LDC/ID corrector 161.

Twelfth Embodiment

A twelfth embodiment of this invention is similar to one of the sixth to eleventh embodiments thereof except for design changes mentioned hereafter. The twelfth embodiment of this invention is designed to handle data of a format using an error correction product code, for example, a Reed-Solomon product code in FIGS. 1 and 2.

Provided that at least one of 16 physical address information pieces ID0, ID1, ID2, . . . , and ID15 in every reproduced ECC block is correct, descramble is accurately executed. Thus, correct user data and EDC data are prevented from undergoing wrong descramble.

Thirteenth Embodiment

Figure 40:
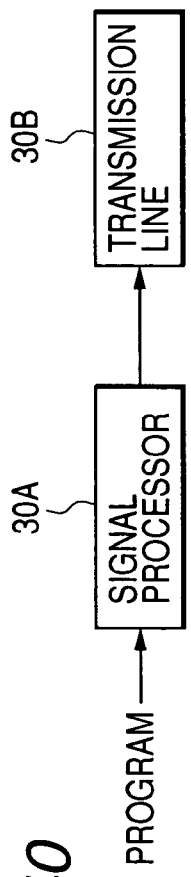
FIG. 40 is a block diagram of a signal transmitter according to a thirteenth embodiment of this invention.

FIG. 40 shows a signal transmitter according to a thirteenth embodiment of this invention. The signal transmitter of FIG. 40 includes a signal processor 30A connected with a transmission line 30B. The signal processor 30A has a combination of an input/output port, a processing section, a ROM, and a RAM. The signal processor 30A operates in accordance with a control program stored in the ROM or the RAM. The signal processor 30A receives the computer program same as the control program for the computer 2B in FIG. 13 or the control program for the computer 250 in FIG. 32.

Figure 41:
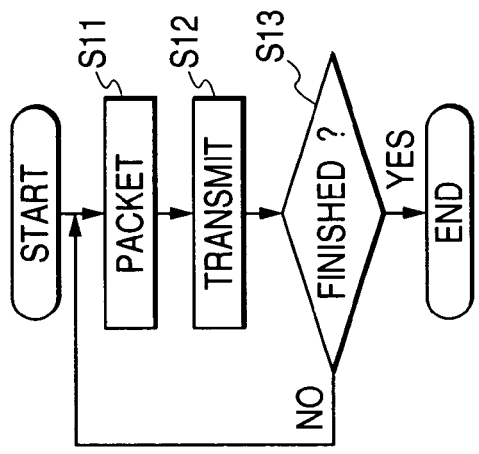
FIG. 41 is a flowchart of a control program for a signal processor in FIG. 40.

FIG. 41 is a flowchart of the control program for the signal processor 30A. With reference to FIG. 41, a first step S11 of the control program cuts a portion from the received computer program, and processes the computer-program portion into a packet. A step S12 following the step S11 transmits the packet generated by the step S11 to the transmission line 30B. A step S13 subsequent to the step S12 decides whether or not the whole of the received computer program has been cut into packets. When the whole of the received computer program has been cut into packets, the control program exits from the step S13 and then the current execution cycle of the control program ends. Otherwise, the control program returns to the step S11.

Fourteenth Embodiment

Figure 42:
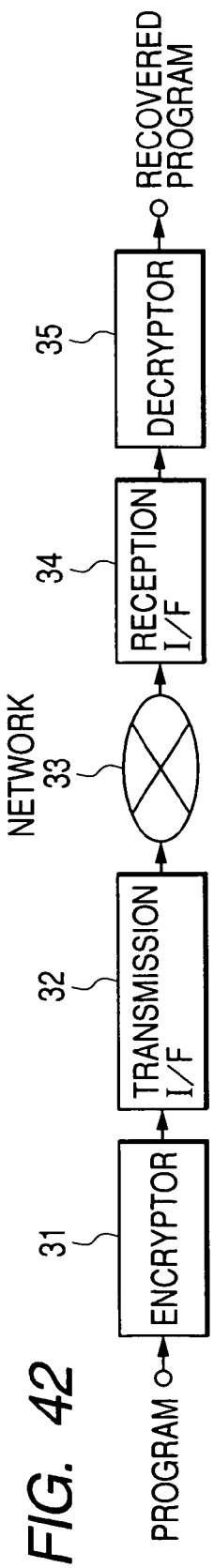
FIG. 42 is a block diagram of a signal transmission and reception system according to a fourteenth embodiment of this invention.

FIG. 42 shows a signal transmission and reception system according to a fourteenth embodiment of this invention. The system of FIG. 42 is divided into a transmitter side and a receiver side.

The transmitter side includes an encryptor 31 and a transmission interface (I/F) 32. The encryptor 31 receives the computer program same as the control program for the computer 2B in FIG. 13 or the control program for the computer 250 in FIG. 32. The encryptor 31 is connected to the transmission interface 32. The transmission interface 32 is connected with a communication network 33 forming a transmission line.

The receiver side includes a reception interface (I/F) 34 and a decryptor 35. The reception interface 34 is connected between the communication interface 33 and the decryptor 35.

In the transmitter side, the device 31 encrypts the received computer program. The encryptor 31 feeds the encryption-resultant computer program to the transmission interface 32. The transmission interface 32 converts the encryption-resultant computer program into a stream of packets. The transmission interface 32 transmits the packet stream to the communication network 33. The packet stream propagates along the communication network 33.

The reception interface 34 in the receiver side receives a packet stream. The reception interface 34 extracts data from the received packet stream, and recovers an encryption-resultant computer program from the extracted data. The reception interface 34 feeds the recovered encryption-resultant computer program to the decryptor 35. The device 35 decrypts the encryption-resultant computer program to reproduce an original computer program.

Advantages Provided by the Invention

For every ECC block, all physical address information pieces are extracted from correction-resultant data, and are subjected to error checks. In the case where the results of the error checks indicate that at least one of the physical address information pieces is correct, a portion of the correct physical address information piece is set as a descramble initial value. On the other hand, in the case where the results of the error checks indicate that all the physical address information pieces are erroneous, a correct physical address information piece is estimated from a physical address information piece associated with an immediately-previous ECC block. Then, a portion of the estimated correct physical address information piece is set as a descramble initial value. For every ECC block, the correction-resultant data are descrambled in response to the descramble initial value.

For every ECC block, the descramble of the correction-resultant data is accurate even in the case where all the physical address information pieces are erroneous.

Errors in user data can be efficiently corrected. Therefore, it is possible to reduce the number of times a head device retries to read out a same recorded-signal portion from a recording medium.

In the case where the head device reproduces a recorded signal from the recording medium while performing track jumps causing discontinuous address changes, a system controller functions to suitably set a correct physical address information piece for a first ECC block after every track jump. Thus, even when track jumps are performed, proper descramble initial values are obtained.

The greater part of data processing is assigned to devices different from the system controller. Thus, the system controller bears only a small load in data processing.

For every ECC block, all physical address information pieces are extracted from correction-resultant data, and are subjected to error checks. In the case where the results of the error checks indicate that at least one of the physical address information pieces is correct, a portion of the correct physical address information piece is set as a descramble initial value. On the other hand, in the case where the results of the error checks indicate that all the physical address information pieces are erroneous, another physical address information piece which results from error correction or interpolation is used as a correct physical address information piece. In this case, a portion of the correct physical address information piece is set as a descramble initial value. For every ECC block, the correction-resultant data are descrambled in response to the descramble initial value.

For every ECC block, a correct physical address information piece for the descramble is generated as a result of error correction or interpolation and hence the descramble of the correction-resultant data is accurate even in the case where all the physical address information pieces are erroneous.

Errors in user data can be efficiently corrected. Therefore, it is possible to reduce the number of times a head device retries to read out a same recorded-signal portion from a recording medium.

The greater part of data processing is assigned to devices different from the system controller. Thus, the system controller bears only a small load in data processing.

The demodulation circuit generates the correct physical address information through the error correction or the interpolation. Every ECC block is composed of a predetermined number of sectors. Every sector currently processed by the demodulation circuit considerably precedes a sector requested by the MPEG decoder. Accordingly, it is possible to suitably set a descramble initial value for a first ECC block after the start of the playback of the recording medium or after every track jump during the playback of the recording medium.

What is claimed is:

1. An information recording and reproducing apparatus comprising:

first means for scrambling user data in response to address information to get scramble-resultant data;

second means for adding first error correction code data and second error correction code data to the scramble-resultant data and the address information to get addition-resultant data placed in error correction blocks;

third means for recording the addition-resultant data on a recording medium for every error correction block;

fourth means for reproducing recorded data from a recording medium to get reproduced data for every error correction block;

fifth means for correcting errors in the reproduced data in response to first error correction code data and second error correction code data contained in the reproduced data to get correction-resultant data for every error correction block;

sixth means for extracting all pieces of address information from the correction-resultant data for every error correction block;

seventh means for subjecting all the address information pieces extracted by the sixth means to error checks to decide whether at least one of all the address information pieces is correct and whether all the address information pieces are erroneous;

eighth means for, when the seventh means decides that at least one of all the address information pieces is correct, setting a descramble initial value in response to the correct address information piece;

ninth means for, when the seventh means decides that all the address information pieces are erroneous, estimating a correct address information piece from an address information piece associated with a previous error correction block and setting the descramble initial value in response to the estimated correct address information piece; and tenth means for descrambling the correction-resultant data in response to the descramble initial value set by one of the eighth means and the ninth means for every error correction block.

2. An information recording and reproducing apparatus comprising:

first means for scrambling main data in response to address information to get scramble-resultant data defined as first basic data;

second means for adding first error correction code data to the first basic data to get a first data signal of a first error correction code system;

third means for adding second error correction code data to second basic data inclusive of the address information to get a second data signal of a second error correction code system independent of the first error correction code system;

fourth means for combining the first data signal and the second data signal into a composite signal divided into error correction blocks;

fifth means for recording the composite signal on a recording medium for every error correction block;

sixth means for reproducing a recorded signal from a recording medium to get a reproduced signal for every error correction block;

seventh means for correcting errors in a first data signal of the first error correction code system in the reproduced signal to get first correction-resultant data;

eighth means for correcting errors in a second data signal of the second error correction code system in the reproduced signal independently of the error correction by the seventh means to get second correction-resultant data;

ninth means for extracting all pieces of address information from the second correction-resultant data for every error correction block;

tenth means for subjecting all the address information pieces extracted by the ninth means to error checks to decide whether at least one of all the address information pieces is correct and whether all the address information pieces are erroneous;

eleventh means for, when the tenth means decides that at least one of all the address information pieces is correct, setting a descramble initial value in response to the correct address information piece;

twelfth means for, when the tenth means decides that all the address information pieces are erroneous, estimating a correct address information piece from an address information piece associated with a previous error correction block and setting the descramble initial value in response to the estimated correct address information piece; and thirteenth means for descrambling the first correction-resultant data in response to the descramble initial value set by one of the eleventh means and the twelfth means for every error correction block.

3. An information recording and reproducing apparatus as recited in claim 2, further comprising:

fourteenth means for setting the descramble initial value to a predetermined value with respect to a first error correction block at a start of playback; and fifteenth means for setting the descramble initial value to a given value with respect to a first error correction block after a discontinuous address change occurs.

4. An information recording and reproducing apparatus as recited in claim 2, wherein the twelfth means comprises means for adding an address increment to the address information piece associated with the previous error correction block to get the estimated correct address information piece, and means for changing the address increment depending on whether the present error correction block comes from a rewritable area or a read-only area of the recording medium, the rewritable area and the read-only area differing in number of sectors per error correction block.

5. A computer program for enabling a computer to operate as a plurality of means which include:

first means for scrambling user data in response to address information to get scramble-resultant data;

second means for adding first error correction code data and second error correction code data to the scramble-resultant data and the address information to get addition-resultant data placed in error correction blocks as a signal to be recorded on a recording medium;

third means for correcting errors in a signal reproduced from a recording medium in response to first error correction code data and second error correction code data contained in the signal reproduced from the recording medium to get correction-resultant data for every error correction block;

fourth means for extracting all pieces of address information from the correction-resultant data for every error correction block;

fifth means for subjecting all the address information pieces extracted by the fourth means to error checks to decide whether at least one of all the address information pieces is correct and whether all the address information pieces are erroneous;

sixth means for, when the fifth means decides that at least one of all the address information pieces is correct, setting a descramble initial value in response to the correct address information piece;

seventh means for, when the fifth means decides that all the address information pieces are erroneous, estimating a correct address information piece from an address information piece associated with a previous error correction block and setting the descramble initial value in response to the estimated correct address information piece; and eighth means for descrambling the correction-resultant data in response to the descramble initial value set by one of the sixth means and the seventh means for every error correction block.

6. A computer program for enabling a computer to operate as a plurality of means which include:

first means for scrambling main data in response to address information to get scramble-resultant data defined as first basic data;

second means for adding first error correction code data to the first basic data to get a first data signal of a first error correction code system;

third means for adding second error correction code data to second basic data inclusive of the address information to get a second data signal of a second error correction code system independent of the first error correction code system;

fourth means for combining the first data signal and the second data signal into a composite signal divided into error correction blocks as a signal to be recorded on a recording medium;

fifth means for correcting errors in a first data signal of the first error correction code system in a signal reproduced from a recording medium to get first correction-resultant data;

sixth means for correcting errors in a second data signal of the second error correction code system in the signal reproduced from the recording medium independently of the error correction by the fifth means to get second correction-resultant data;

seventh means for extracting all pieces of address information from the second correction-resultant data for every error correction block;

eighth means for subjecting all the address information pieces extracted by the seventh means to error checks to decide whether at least one of all the address information pieces is correct and whether all the address information pieces are erroneous;

ninth means for, when the eighth means decides that at least one of all the address information pieces is correct, setting a descramble initial value in response to the correct address information piece;

tenth means for, when the eighth means decides that all the address information pieces are erroneous, estimating a correct address information piece from an address information piece associated with a previous error correction block and setting the descramble initial value in response to the estimated correct address information piece; and eleventh means for descrambling the first correction-resultant data in response to the descramble initial value set by one of the ninth means and the tenth means for every error correction block.

7. A computer program as recited in claim 6, wherein the plurality of means further include:

twelfth means for setting the descramble initial value to a predetermined value with respect to a first error correction block at a start of playback; and thirteenth means for setting the descramble initial value to a given value with respect to a first error correction block after a discontinuous address change occurs.

8. A computer program as recited in claim 6, wherein the tenth means comprises means for adding an address increment to the address information piece associated with the previous error correction block to get the estimated correct address information piece, and means for changing the address increment depending on whether the present error correction block comes from a rewritable area or a read-only area of the recording medium, the rewritable area and the read-only area differing in number of sectors per error correction block.

9. A transmission and reception system for the computer program of claim 6, comprising:
   first means for converting the computer program into a packet stream;
   second means for transmitting the packet stream to a transmission line;
   third means for receiving a packet stream from the transmission line; and
   fourth means for converting the received packet stream into an original computer program.

10. An information decoding apparatus for use with a recording medium on which a modulation-resultant signal is recorded by an information recording apparatus operating to (1) scramble user data in response to address information to get scramble-resultant data; (2) add error correction code data of plural different types to the scramble-resultant data and the address information to get addition-resultant data placed in error correction blocks; and (3) subject the addition-resultant data to modulation to get the modulation-resultant signal; the information decoding apparatus comprising:
   first means for reproducing a modulation-resultant signal from the recording medium to get a reproduced signal;
   second means for subjecting the reproduced signal to demodulation to get demodulation-resultant data;
   third means for extracting address information from the demodulation-resultant data;
   fourth means for subjecting the address information extracted by the third means to error correction to get correction-resultant address information;
   fifth means for implementing interpolation on the basis of an address continuity to get interpolation-resultant address information corresponding to the address information extracted by the third means;
   sixth means for correcting errors in the demodulation-resultant data in response to error correction code data of the plural different types contained in the demodulation-resultant data to get correction-resultant data for every error correction block;
   seventh means for extracting all pieces of address information from the correction-resultant data for every error correction block;
   eighth means for subjecting all the address information pieces extracted by the seventh means to error checks to decide whether at least one of all the address information pieces is correct and whether all the address information pieces are erroneous;
   ninth means for, when the eighth means decides that at least one of all the address information pieces is correct, setting a descramble initial value in response to the correct address information piece;
   tenth means for, when the eighth means decides that all the address information pieces are erroneous, setting the descramble initial value in response to one of (1) the correction-resultant address information and (2) the interpolation-resultant address information; and
   eleventh means for descrambling the correction-resultant data in response to the descramble initial value set by one of the ninth means and the tenth means for every error correction block.

11. An information decoding apparatus for use with a recording medium on which a modulation-resultant signal is recorded by an information recording apparatus operating to (1) scramble main data in response to address information to get scramble-resultant data defined as first basic data; (2) add first error correction code data to the first basic data to get a first data signal of a first error correction code system; (3) add second error correction code data to second basic data inclusive of the address information to get a second data signal of a second error correction code system independent of the first error correction code system; (4) combining the first data signal and the second data signal into a composite signal divided into error correction blocks; and (5) subject the composite signal to modulation to get the modulation-resultant signal; the information decoding apparatus comprising:
   first means for reproducing a modulation-resultant signal from the recording medium to get a reproduced signal;
   second means for subjecting the reproduced signal to demodulation to get a demodulation-resultant signal including a demodulation-resultant first data signal and a demodulation-resultant second data signal;
   third means for extracting address information from second basic data in the demodulation-resultant second data signal;
   fourth means for subjecting the address information extracted by the third means to error correction to get correction-resultant address information;
   fifth means for implementing interpolation on the basis of an address continuity to get interpolation-resultant address information corresponding to the address information extracted by the third means;
   sixth means for subjecting the demodulation-resultant first data signal and the demodulation-resultant second data signal to independent error corrections respectively to get correction-resultant data for every error correction block;
   seventh means for extracting all pieces of address information from second basic data in the correction-resultant data for every error correction block;
   eighth means for subjecting all the address information pieces extracted by the seventh means to error checks to decide whether at least one of all the address information pieces is correct and whether all the address information pieces are erroneous;
   ninth means for, when the eighth means decides that at least one of all the address information pieces is correct, setting a descramble initial value in response to the correct address information piece;
   tenth means for, when the eighth means decides that all the address information pieces are erroneous, setting the descramble initial value in response to one of (1) the correction-resultant address information and (2) the interpolation-resultant address information; and
   eleventh means for descrambling the correction-resultant data in response to the descramble initial value set by one of the ninth means and the tenth means for every error correction block.

12. An information decoding apparatus as recited in claim 11, further comprising:
a buffer memory;
twelfth means for successively writing the demodulation-resultant signal and one of (1) the correction-resultant address information and (2) the interpolation-resultant address information into the buffer memory for every error correction block; and
thirteenth means provided in the tenth means for reading out one of (1) the correction-resultant address information and (2) the interpolation-resultant address information from the buffer memory.

13. A computer program for use in an information decoding apparatus, the information decoding apparatus being for use with a recording medium on which a modulation-resultant signal is recorded by an information recording apparatus operating to (1) scramble user data in response to address information to get scramble-resultant data; (2) add error correction code data of plural different types to the scramble-resultant data and the address information to get addition-resultant data placed in error correction blocks; and (3) subject the addition-resultant data to modulation to get the modulation-resultant signal; the computer program enabling a computer to operate as a plurality of means which include:
first means for subjecting a signal reproduced from the recording medium to demodulation to get demodulation-resultant data;
second means for extracting address information from the demodulation-resultant data;
third means for subjecting the address information extracted by the second means to error correction to get correction-resultant address information;
fourth means for implementing interpolation on the basis of an address continuity to get interpolation-resultant address information corresponding to the address information extracted by the second means;
fifth means for correcting errors in the demodulation-resultant data in response to error correction code data of the plural different types contained in the demodulation-resultant data to get correction-resultant data for every error correction block;
sixth means for extracting all pieces of address information from the correction-resultant data for every error correction block;
seventh means for subjecting all the address information pieces extracted by the sixth means to error checks to decide whether at least one of all the address information pieces is correct and whether all the address information pieces are erroneous;
eighth means for, when the seventh means decides that at least one of all the address information pieces is correct, setting a descramble initial value in response to the correct address information piece;
ninth means for, when the seventh means decides that all the address information pieces are erroneous, setting the descramble initial value in response to one of (1) the correction-resultant address information and (2) the interpolation-resultant address information; and
tenth means for descrambling the correction-resultant data in response to the descramble initial value set by one of the eighth means and the ninth means for every error correction block.

14. A computer program for use in an information decoding apparatus, the information decoding apparatus being for use with a recording medium on which a modulation-resultant signal is recorded by an information recording apparatus operating to (1) scramble main data in response to address information to get scramble-resultant data defined as first basic data; (2) add first error correction code data to the first basic data to get a first data signal of a first error correction code system; (3) add second error correction code data to second basic data inclusive of the address information to get a second data signal of a second error correction code system independent of the first error correction code system; (4) combining the first data signal and the second data signal into a composite signal divided into error correction blocks; and (5) subject the composite signal to modulation to get the modulation-resultant signal; the computer program enabling a computer to operate as a plurality of means which include:
first means for subjecting a signal reproduced from the recording medium to demodulation to get a demodulation-resultant signal including a demodulation-resultant first data signal and a demodulation-resultant second data signal;
second means for extracting address information from second basic data in the demodulation-resultant second data signal;
third means for subjecting the address information extracted by the second means to error correction to get correction-resultant address information;
fourth means for implementing interpolation on the basis of an address continuity to get interpolation-resultant address information corresponding to the address information extracted by the second means;
fifth means for subjecting the demodulation-resultant first data signal and the demodulation-resultant second data signal to independent error corrections respectively to get correction-resultant data for every error correction block;
sixth means for extracting all pieces of address information from second basic data in the correction-resultant data for every error correction block;
seventh means for subjecting all the address information pieces extracted by the sixth means to error checks to decide whether at least one of all the address information pieces is correct and whether all the address information pieces are erroneous;
eighth means for, when the seventh means decides that at least one of all the address information pieces is correct, setting a descramble initial value in response to the correct address information piece;
ninth means for, when the seventh means decides that all the address information pieces are erroneous, setting the descramble initial value in response to one of (1) the correction-resultant address information and (2) the interpolation-resultant address information; and
tenth means for descrambling the correction-resultant data in response to the descramble initial value set by one of the eighth means and the ninth means for every error correction block.

15. A computer program as recited in claim 14, wherein the plurality of means further include:
eleventh means for successively writing the demodulation-resultant signal and one of (1) the correction-resultant address information and (2) the interpolation-resultant address information into a buffer memory for every error correction block; and
twelfth means provided in the ninth means for reading out one of (1) the correction-resultant address information and (2) the interpolation-resultant address information from the buffer memory.

16. A transmission and reception system for the computer program of claim 14, comprising:

first means for converting the computer program into a packet stream;

second means for transmitting the packet stream to a transmission line;

third means for receiving a packet stream from the transmission line; and fourth means for converting the received packet stream into an original computer program.

17. A data processing apparatus comprising:

first means for correcting errors in a first data signal of a first error correction code system in a composite signal to get first correction-resultant data;

second means for correcting errors in a second data signal of a second error correction code system in the composite signal to get second correction-resultant data, the second error correction code system being independent of the first error correction code system;

third means for deciding whether at least one of all address information pieces in the second correction-resultant data for every error correction block is correct and whether all the address information pieces are erroneous;

fourth means for, when the third means decides that at least one of all the address information pieces is correct, setting a descramble initial value in response to the correct address information piece;

fifth means for, when the third means decides that all the address information pieces are erroneous, estimating a correct address information piece from an address information piece associated with a previous error correction block and setting the descramble initial value in response to the estimated correct address information piece; and sixth means for descrambling the first correction-resultant data in response to the descramble initial value set by one of the fourth means and the fifth means for every error correction block.

18. A data processing apparatus comprising:

first means for correcting errors in data in each of segments of a composite signal to get correction-resultant data;

second means for deciding whether at least one of all address information pieces in each of segments of the composite signal is correct and whether all the address information pieces in each of segments of the composite signal are erroneous;

third means for, when the second means decides that at least one of all the address information pieces is correct, setting a descramble initial value in response to the correct address information piece;

fourth means for, when the second means decides that all the address information pieces are erroneous, implementing interpolation on the basis of an address continuity to get an interpolation-resultant address information piece corresponding to the address information pieces in each of segments of the composite signal and setting the descramble initial value in response to the interpolation-resultant address information piece; and fifth means for descrambling the correction-resultant data in response to the descramble initial value set by one of the third means and the fourth means.

* * * * *